United States Patent
Fukuda et al.

(10) Patent No.: US 7,843,700 B2
(45) Date of Patent: Nov. 30, 2010

(54) SEMICONDUCTOR DEVICE

(75) Inventors: Yutaka Fukuda, Kariya (JP); Mitsuhiro Saitou, Ohu (JP); Toshihiro Nagaya, Nukata-gun (JP); Kan Kinouchi, Okazaki (JP); Sadahiro Akama, Nukata-gun (JP); Koji Numazaki, Nukata-gun (JP); Norihisa Imaizumi, Hoi-gun (JP)

(73) Assignee: DENSO CORPORATION, Kariya (JP)

( * ) Notice: Subject to any disclaimer, the term of this patent is extended or adjusted under 35 U.S.C. 154(b) by 740 days.

(21) Appl. No.: 11/105,548

(22) Filed: Apr. 14, 2005

(65) Prior Publication Data

US 2005/0231925 A1    Oct. 20, 2005

(30) Foreign Application Priority Data

| Apr. 14, 2004 | (JP) | ............................. 2004-118889 |
| Jun. 9, 2004 | (JP) | ............................. 2004-171220 |
| Jun. 9, 2004 | (JP) | ............................. 2004-171221 |
| Jun. 14, 2004 | (JP) | ............................. 2004-175419 |
| Jun. 14, 2004 | (JP) | ............................. 2004-175420 |
| Jul. 7, 2004 | (JP) | ............................. 2004-200448 |
| Oct. 4, 2004 | (JP) | ............................. 2004-291398 |

(51) Int. Cl.
H05K 7/02 (2006.01)
H05K 7/06 (2006.01)
H05K 7/08 (2006.01)
H05K 7/10 (2006.01)

(52) U.S. Cl. ...................... 361/760; 361/763; 361/781; 361/814

(58) Field of Classification Search ......... 174/255–256, 174/259–262; 361/700–710, 782–785
See application file for complete search history.

(56) References Cited

U.S. PATENT DOCUMENTS

| 4,760,434 A | 7/1988 | Tsuzuki et al. |
| 4,857,812 A | 8/1989 | Mochizuki et al. |
| 5,077,595 A * | 12/1991 | Fukunaga .................... 257/659 |
| 5,091,341 A | 2/1992 | Asada et al. |
| 5,173,762 A | 12/1992 | Ota |

(Continued)

FOREIGN PATENT DOCUMENTS

JP     A-S57-211762     12/1982

(Continued)

OTHER PUBLICATIONS

Office Action dated Feb. 15, 2008 in corresponding Japanese Patent Application 2004-175420 (and English translation).

(Continued)

*Primary Examiner*—Tuan T Dinh
(74) *Attorney, Agent, or Firm*—Posz Law Group, PLC

(57) ABSTRACT

An electric device includes: a first electric element; a second electric element capable of flowing large current therethrough so that heat is generated in the second electric element; a heat sink; and a first wiring board and a second wiring board, which are disposed on one side of the heat sink. The large current in the second electric element is larger than that in the first electric element. The first wiring board and the second wiring board are separated each other. The first electric element is disposed on the first wiring board, and the second electric element is disposed on the second wiring board.

16 Claims, 30 Drawing Sheets

U.S. PATENT DOCUMENTS

| | | | |
|---|---|---|---|
| 5,381,042 A | | 1/1995 | Lerner et al. |
| 5,444,297 A | * | 8/1995 | Oshima et al. ............... 257/691 |
| 5,445,995 A | | 8/1995 | Casati et al. |
| 5,466,969 A | * | 11/1995 | Tsunoda ..................... 257/706 |
| 5,767,527 A | | 6/1998 | Yoneda et al. |
| 5,770,973 A | | 6/1998 | Fujisawa et al. |
| 5,780,988 A | | 7/1998 | Kalb et al. |
| 5,904,506 A | | 5/1999 | Yoneda et al. |
| 5,920,119 A | * | 7/1999 | Tamba et al. ................ 257/718 |
| 6,002,173 A | | 12/1999 | Casati et al. |
| 6,291,880 B1 | * | 9/2001 | Ogawa et al. ............... 257/723 |
| 6,320,747 B1 | * | 11/2001 | Jahn et al. ................... 361/704 |
| 6,590,774 B2 | * | 7/2003 | Oishi et al. ................. 361/707 |
| 6,953,987 B2 | | 10/2005 | Numazaki et al. |
| 2003/0022464 A1 | | 1/2003 | Hirano et al. |
| 2003/0138992 A1 | | 7/2003 | Rokugawa et al. |
| 2004/0055783 A1 | | 3/2004 | Masuda |

FOREIGN PATENT DOCUMENTS

| | | |
|---|---|---|
| JP | U-S59-191743 | 12/1984 |
| JP | U-S62-21547 | 2/1987 |
| JP | A-03-188661 | 8/1991 |
| JP | A-03-274755 | 12/1991 |
| JP | A-H04-93159 | 3/1992 |
| JP | A-04-127564 | 4/1992 |
| JP | A-04-144162 | 5/1992 |
| JP | A-H05-55280 | 3/1993 |
| JP | A-05-251620 | 9/1993 |
| JP | A-05-283582 | 10/1993 |
| JP | U-H06-38249 | 5/1994 |
| JP | A-06-244358 | 9/1994 |
| JP | A-06-268132 | 9/1994 |
| JP | A-H07-67293 | 3/1995 |
| JP | A-H07-113376 | 5/1995 |
| JP | A-07-202088 | 8/1995 |
| JP | A-07-273267 | 10/1995 |
| JP | A-H08-213547 | 8/1996 |
| JP | A-H08-241949 | 9/1996 |
| JP | A-09-186269 | 7/1997 |
| JP | A-H09-293802 | 11/1997 |
| JP | A-10-074879 | 3/1998 |
| JP | A-H10-110573 | 4/1998 |
| JP | A-10-135380 | 5/1998 |
| JP | A-H10-303341 | 11/1998 |
| JP | A-11-150216 | 6/1999 |
| JP | A-11-274358 | 10/1999 |
| JP | A-11-340459 | 12/1999 |
| JP | A-2000-58745 | 2/2000 |
| JP | A-2000-73655 | 3/2000 |
| JP | A-2000-183278 | 6/2000 |
| JP | A-2001-035985 | 2/2001 |
| JP | A-2001-196532 | 7/2001 |
| JP | A-2003-23132 | 1/2003 |
| JP | A-2003-209132 | 7/2003 |
| JP | A-2003-318345 | 11/2003 |
| JP | A-2004-273788 | 9/2004 |
| JP | A-H11-220074 | 8/2005 |

OTHER PUBLICATIONS

Office Action dated Mar. 11, 2008 in corresponding Japanese Patent Application No. 2004-171221 (and English translation).
Office Action dated Nov. 28, 2008 in corresponding Japanese patent application No. 2004-291398 (and English translation).
Office Action dated Mar. 6, 2009 in corresponding Japanese patent application No. 2004-200448 (and English translation).
Office Action dated May 14, 2009 from the Japan Patent Office in the corresponding JP application No. 2004-175419 (and English Translation).
Office Action mailed Nov. 4, 2009 from the Japan Patent Office in the corresponding Japanese Patent Application No. 2004-175419 (and English Translation).
Office Action dated Feb. 2, 2010 from Japan Patent Office in corresponding JP application No. 2004-175419 (and English translation).
Notice of Reasons for Refusal mailed on Mar. 30, 2010 issued from the Japanese Patent Office in the corresponding Japanese patent application No. 2004-171220 (with English translation).
Office Action dated Sep. 3, 2008 in corresponding Japanese patent application No. 2004-200448 (and English translation).

* cited by examiner

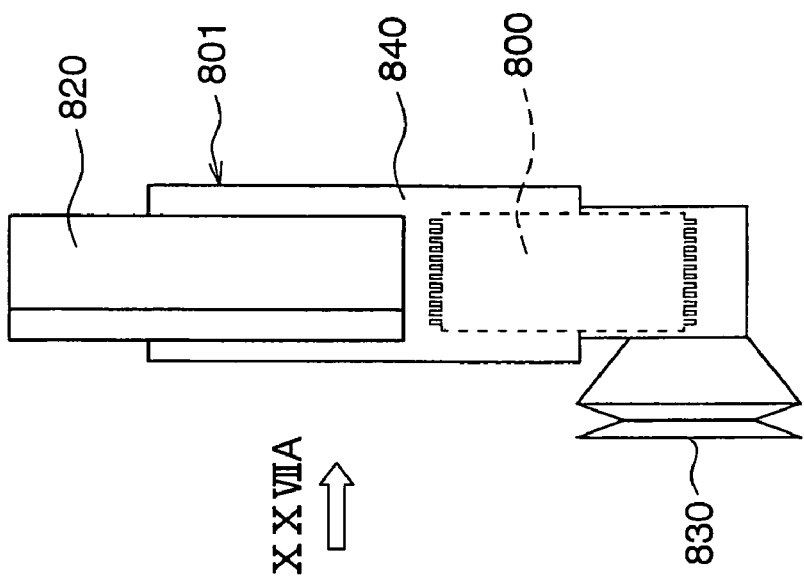
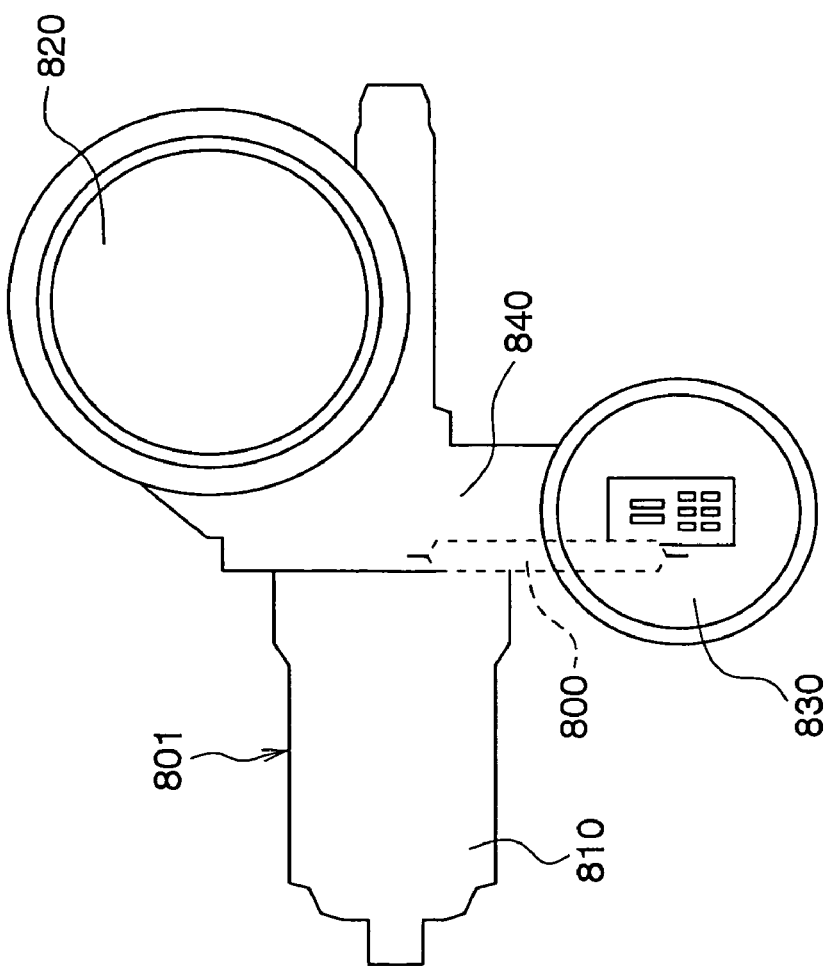
FIG. 27A
FIG. 27B

FIG. 33A     FIG. 33B
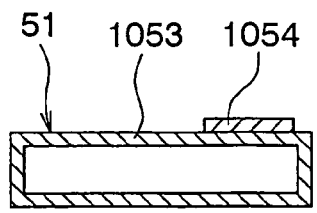
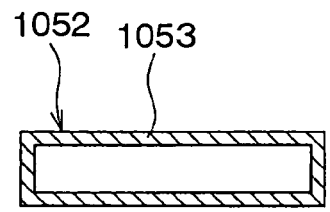
FIG. 34A
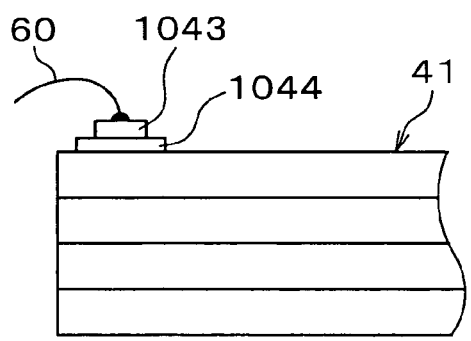
FIG. 34B
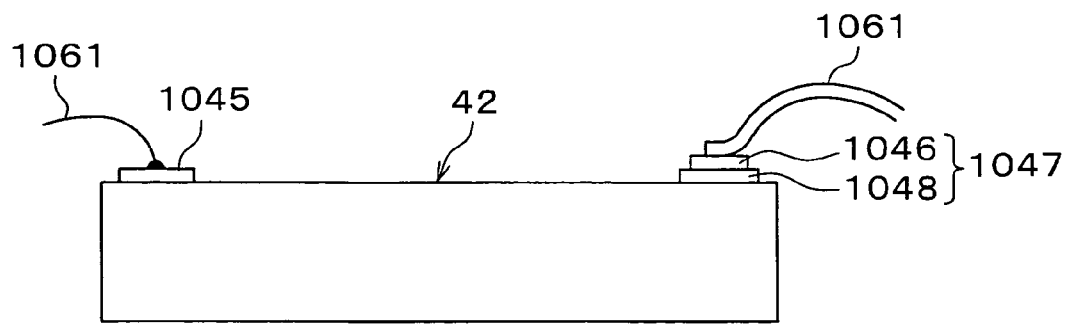

SEMICONDUCTOR DEVICE

CROSS REFERENCE TO RELATED APPLICATIONS

This application is based on Japanese Patent Applications No. 2004-118889 filed on Apr. 14, 2004, No. 2004-171220 filed on Jun. 9, 2004, No. 2004-171221 filed on Jun. 9, 2004, No.2004-175419 filed on Jun. 14, 2004, No. 2004-175420 filed on Jun. 14, 2004, No. 2004-200448 filed on Jul. 7, 2004, and No. 2004-291398 filed on Oct. 4, 2004, the disclosures of which are incorporated herein by reference.

FIELD OF THE INVENTION

The present invention relates to a semiconductor device and a method for manufacturing the semiconductor device.

BACKGROUND OF THE INVENTION

Among conventional semiconductor devices provided with the first electronic element and the second electronic element that has larger current passed therethrough as compared with the first electronic element to generate large heat is, for example, a semiconductor device having a control element such as microcomputer as the first electronic element and having a power element controlled by the control element such as power MOS element and IGBT as the second electronic element.

The semiconductor device provided with these control element and power element is used for driving an actuator, for example, a motor.

The application of a semiconductor device provided with the control element and the power element like this to a HIC (hybrid integrated circuit) for driving a driving motor of a power window having a JAM preventing function has been conventionally proposed, for example, in Japanese Patent Application Publication No. H07-67293.

Further, a method of driving the power window having a JAM preventing function like this is described in, for example, Japanese Patent Application Publications No. H07-113376 and No. H07-76973.

Here, in the conventional semiconductor device described above, large heat is transmitted to the control element via a wiring board easily transmitting heat from the power element that has larger current passed therethrough as compared with the control element to generate large heat, whereby the control element is apt to be affected by the heat.

The control element is limited in operating temperature and usually has a lower operating temperature because it has delicate construction as compared with the power element. Hence, it is important to prevent the effect of heat from the power element as described above.

In simple terms, it is recommendable to increase the distance between the control element and the power element on the wiring board on which the control element and the power element are mounted, but in this case, the device results in increasing in size, which is not desirable.

The above-described problem is thought to be common to a semiconductor device having the first electronic element and the second electronic element that has larger current passed therethrough as compared with the first element to generate large heat. That is, in the semiconductor device like this, it can be an important problem to prevent heat transfer from the second electronic element to the first electronic element.

Further, an electronic device made by mounting a heating element and a temperature-limited element on a heat sink and then by molding them in such a manner as to wrap them by a molding resin is also disclosed in Japanese Patent Application Publication No. H07-67293.

The electronic device of this kind is usually made by mounting a heating element of an electronic element, which generates heat under large operating current passed therethrough, and a temperature-limited element of an electronic element, which is limited in operating temperature, on a heat sink and then by molding them by a molding resin.

Here, the heating element is an electronic element that has a larger current passed therethrough as compared with the temperature-limited element to generate large heat. Among the temperature-limited elements is, for example, a control element such as microcomputer. Among the heating elements is a power element, which is controlled by the control element, such as power MOS element and IGBT or a resistor.

The electronic device provided with the control element and the power element like this is applied to, for example, a HIC (hybrid integrated circuit) for driving an actuator such as motor. To be specific, the application of the electronic device to the HIC for driving a driving motor of a power window has been proposed in Japanese Patent Application Publication No. H07-67293, although it is not intended to limit the application of the electronic device to this.

However, in the conventional electronic device described above, large heat is transmitted to a temperature-limited element from a heating element that is larger in the amount of current and in the amount heat generation than the temperature-limited element via a heat sink easily transmitting heat, whereby the temperature-limited element is susceptible to the heat.

The temperature-limited element is limited in operating temperature and usually has a low operating temperature because it has finer construction than the heating element such as power element. Hence, as described above, it is important to prevent the effect of heat from the heating element.

In this respect, to be simple, it can be thought to increase the distance between the temperature-limited element and the heating element on the heat sink on which the temperature-limited element and the heating element are mounted. However, this results in increasing the size of the device, which is not preferable.

Further, in the related art, as an electronic device provided with the control part and the driving part of this kind has been proposed, for example, an electronic device provided with a control part mainly including control elements such as microcomputer and control IC and a driving part mainly including driving elements of power elements such as power MOS elements and IGBT.

The electronic device like this is applied to a HIC (hybrid integrated circuit) for driving and controlling an actuator such as motor. To be specific, an application of electronic device to a HIC for driving a driving motor of a power window has been conventionally proposed in, for example, Japanese Patent Application Publication No. H07-67293.

In recent years, automobiles have been more sophisticated in functionality and higher in grade and various actuators have been used with this trend. For this reason, electronic devices necessary for controlling these actuators have been increased in number and the electronic devices themselves have been enlarged in size.

However, under these circumstances, when an electronic device is mounted in an actuator to make an integrated assembly, there is a tendency that the enlarged size of electronic device, as described above, increases space for mounting the electronic device in the actuator and makes it difficult to secure the space for mounting the electronic device. For this reason, an attempt to integrate the electronic device with the actuator results in upsizing of the actuator.

Further, an ectronic device provided with a plurality of connection terminals that are connected to bonding wires and are connected to external parts by welding has been conventionally known. To be more specific, a mold igniter is known as an electronic device like this.

The electronic device like this commonly has a construction in which, for example, a circuit board or an IC chip is electrically connected to connection terminals via bonding wires made of Al (aluminum) thick wires.

Here, since bonding wires need to respond to large current used for power MOS elements and the like, the Al thick wires are used as the bonding wires and Al thick wires having a wire diameter of, for example, approximately 250 μm to 500 μm are used.

Further, connection terminals made by nonelectrolytically plating a lead frame made of Cu (copper), or Fe (iron) with Ni are used as the connection terminals. With this, the connection terminals can be suitably connected to external parts by welding.

Usually, in this kind of electronic device, the connection between the connection terminals, through which a large current is passed, and an external part, for example, an actuator is made by welding so as to secure the ease and reliability of connection.

In this regard, in the related art, a lead frame of a connection terminal has been proposed in which a nonelectrolytic Ni/Pd/Au film is formed in a bonding area and a soldering part to realize a connection terminal of excellent soldability and free of Pb. This is disclosed in, for example, Japanese Patent Application Publication No. 2003-23132. This connection terminal can be realized only for an Au bonding wire and is connected to an external part by soldering.

However, to achieve greater functionality, in an electronic device of this kind, the electronic device needs to be provided with control elements such as microcomputer and memory element. When the electronic device is provided with the control elements like this, the electronic device results in increasing connection terminals in number, that is, having multiple pins.

When the electronic device is required to have multiple pins, and when Al thick wires are used as bonding wires, the spaces between the connection terminals need to be elongated or the bonding parts of the connection terminals need to be enlarged in size, which leads to the increased size of the device and by extension to increased cost. Further, in the case of element that is small in size and needs many wire connections, it is difficult to make the wire connections by use of the Al thick wires.

To cope with this problem, it is thought that in place of the Al thick wires, for example, Au (gold) thin wires having a diameter of approximately 20 μm to 30 μm are used to solve the problem.

However, Au thin wire can not respond to large current. Further, Au thin wire also presents a problem that, usually, Au thin wire can not be bonded to connection terminal nonelectrolytically plated with Ni.

Here, when the surface of connection terminal is not nonelectrolytically plated with Ni but is electroplated with Ni and is further plated thereon with Ag, Au thin wire can be bonded to the surface plated with Ag.

This is a proven combination in a monolithic IC in which the surface of connection terminal is electroplated with Ni and then further electroplated with Ag. In this construction, Au wire can be easily bonded to the surface plated with Ag.

However, as described above, when the surface of connection terminal is not nonelectrolytically plated with Ni, weldability can not be secured in the connection between the connection terminal and the external part. Further, the bonding of Al wire to the connection terminal electroplated with Ni is difficult in securing flatness as compared with the bonding of Al wire to the connection terminal nonelectrolytically plated with Ni and hence can not be performed with ease.

Therefore, in the electronic device of this kind, it is essential that the surface of connection terminal is nonelectrolytically plated with Ni and this nonelectrolytic plating can not be omitted.

Further, an electronic device according to a conventional art includes a heat sink, electronic elements mounted on the top surface of the heat sink, a lead frame provided around the electronic elements, and molding resin that molds almost the whole device in such a way as to expose the bottom surface of the heat sink, and a method for manufacturing the electronic device.

To be specific, the electronic device of this kind is manufactured in the following manner: electronic elements are mounted on the top surface of a heat sink; a lead frame is provided around the electronic elements; and the lead frame is connected to the electronic elements.

In addition, the heat sink is bonded to the suspending leads of the lead frame. In this manner, an integrated part into which the heat sink, the electronic elements, and the lead frame are integrated is placed on the bottom mold of a mold and then a top mold is mated with the bottom mold. With this, the integrated part is placed in the cavity of the mold.

Molding resin is filled into the cavity to mold the heat sink, the electronic elements, and the lead frame by the molding resin so as to expose the bottom surface of the heat sink. In this manner, the electronic device is completed.

By the way, according to a conventional manufacturing method like this, a portion of top surface of the heat sink, that is, a portion of mounting surface where the electronic elements are mounted in the heat sink is pressed by the pressing portion of the mold.

For this reason, a portion pressed by the pressing portion of the mounting surface of the heat sink becomes dead space to limit space for mounting the electronic element. This prevents high package density and increases the size and cost of the device.

In this regard, it is also thought to press such a bonding portion of the heat sink and the suspending lead that is not related to space for mounting the electronic element in the heat sink. However, in this case, there is a possibility that the bonding portion is displaced by the pressing force to displace the lead frame with respect to the heat sink. Hence, in the conventional method, a portion of top surface of the heat sink is pressed by the pressing portion.

On the other hand, in a method for molding a resin-molded semiconductor device having a heat sink on the bottom surface of a die pad, a method has been proposed in which resin is molded while the bottom surface of a die pad is being fixed to the bottom mold by sucking from a suction hole formed in the bottom mold of the mold to prevent the resin fins on the bottom surface of the die pad. This is disclosed in, for example, Japanese Patent Application Publication No. H05-55280.

However, according to the method described above, a mold does not press the surface of a heat sink on which electronic elements are mounted and hence dead space is not provided. However, the method requires a manufacturing machine provided with a suction unit and hence raises a problem of upsizing of the machine and increasing cost.

SUMMARY OF THE INVENTION

In view of the above-described problem, it is an object of the present invention to provide a semiconductor device having appropriate heat radiation characteristics.

Further, it is a second object of the present invention to provide a semiconductor device having small sized so that the device is mounted in an actuator with ease.

Further, it is a third object of the present invention to provide a semiconductor device having large current passing through connection terminals and having a large number of connection terminals.

An electric device includes: a first electric element; a second electric element capable of flowing large current therethrough so that heat is generated in the second electric element; a heat sink; and a first wiring board and a second wiring board, which are disposed on one side of the heat sink. The large current in the second electric element is larger than that in the first electric element. The first wiring board and the second wiring board are separated each other. The first electric element is disposed on the first wiring board, and the second electric element is disposed on the second wiring board.

In the above device, the first electric element and the second electric element are disposed on different wiring boards, which are disposed on the heat sink. Therefore, the heat generated in the second electric element is prevented from being transmitted to the first electric element substantially without placing the distance between the first and the second electric elements. Thus, the device has appropriate heat radiation characteristics.

Preferably, the heat sink includes a part disposed between the first wiring board and the second wiring board, and the part of the heat sink is made of material including iron. In this case, the part of the heat sink is made of iron, which has low heat conductivity and large heat capacity. Therefore, the heat storage performance of the heat sink is improved so that the heat generated in the second electric element is not transmitted to the first electric element.

Preferably, the heat sink includes a part disposed between the first wiring board and the second wiring board, and the part of the heat sink is provide by a notch. In this case, the part of the heat sink has large heat resistance. Therefore, the heat conductivity between the first and the second wiring boards becomes lower, so that the heat generated in the second electric element is not transmitted to the first electric element.

Preferably, the heat sink further includes a side having a protrusion, and the protrusion is embedded into the resin mold. In this case, the protrusion limits the separation between the heat sink and the resin mold.

Preferably, the resin mold includes a thickness between surfaces of the first and the second electric elements and a surface of the resin mold in a laminating direction. The laminating direction is provided by lamination of the first electric elements, the first and the second wiring boards, and the heat sink in this order. The heat sink has a thickness in the laminating direction, the thickness of the heat sink being equal to the thickness of the resin mold. In this case, the thermal expansion of the resin mold and the thermal expansion of the heat sink in the laminating direction are appropriately balanced.

Preferably, the resin mold has a glass transition temperature, which is higher than a maximum temperature of the power device. When the temperature of the resin mold exceeds the glass transition temperature, the thermal expansion coefficient of the resin mold rapidly increases. Thus, the difference of the thermal expansion coefficient between the resin mold and the heat sink becomes larger, so that thermal stress between them becomes larger. Thus, the resin mold is easily separated from the heat sink. However, when the glass transition temperature of the resin mold is higher than the maximum operation temperature of the power device, the thermal expansion coefficient of the resin mold does not increase rapidly. Therefore, the resin mold is prevented from removing from the heat sink.

Preferably, the power device includes a plurality of power parts, and one of the power parts and neighboring one of the power device, which is next to the one of the power parts, have a relationship in such a manner that the one of the power parts turns on when the neighboring one of the power parts turns off. IN this case, the heat generated in the second electric element is not localized, so that the device has appropriate heat radiation characteristics.

Preferably, the first wiring board and the second wiring board are made of ceramics. In this case, the thermal expansion coefficient of the first and the second wiring boards approaches to the thermal expansion coefficient of the first and the second electric element made of silicon and to the thermal expansion coefficient of the heat sink made of iron. Thus, the bonding condition between them is improved.

Preferably, the second electric element includes a plurality of electric parts, which includes a semiconductor relay. In this case, the relay is formed of semiconductor device, so that the relay can be accommodated in one chip together with the first electric element. Thus, the dimensions of the device are reduced. Although the semiconductor relay generates heat, the device can radiate the heat appropriately.

Preferably, the device further includes a signal terminal disposed on a side of the resin mold. The first electric element, the second electric element, the first wiring board, the second wiring board, and the heat sink are molded with the resin mold. The heat sink includes another side, which is opposite to the one side of the heat sink. The other side of the heat sink is exposed from the resin mold. The heat sink is connected to the signal terminal with a suspending lead of the signal terminal. The resin mold includes an upper part and a lower part. The upper part of the resin mold is disposed on the one side of the heat sink so that the upper part is disposed above the suspending lead, and the lower part of the resin mold is disposed on the other side of the heat sink so that the lower part is disposed below the suspending lead. The lower part of the resin mold is protruded from the upper part of the resin mold. In this case, no dead space is formed among the heat sink, the first wiring board and the second wiring board. Material composing the device is mounted in the mold, so that no additional equipment is necessitated for manufacturing the device. Thus, the cost for manufacturing the device is not increased substantially.

Preferably, the device further includes: a signal terminal disposed on a side of the resin mold; and an inspection terminal disposed on another side of the resin mold. The signal terminal extends in an extending direction parallel to the one side of the heat sink, and the inspection terminal extends in a direction perpendicular to the extending direction of the signal terminal. In general, a high voltage such as 12V is applied to the signal terminal, and a low voltage such as 5V is applied to the inspection terminal. The inspection terminal is required to protect from outside electric noise. In the above device, the inspection terminal is disposed far from the signal terminal, so that the noise does not substantially penetrate into the inspection terminal.

Preferably, the first electric element includes a first temperature sensing diode so that the first electric element is controlled on the basis of a temperature of the first electric element detected by the diode, and the second electric element includes a second temperature sensing diode so that the second electric element is controlled on the basis of a temperature of the second electric element detected by the diode. In this case, if the temperature of the device is anomalously increased, the temperature sensing diode detects the anomaly of the temperature. Thus, the first and the second electric elements are controlled appropriately on the basis of the signal from the temperature sensing diode. Thus, the device is protected from the anomalous temperature increase.

Preferably, the first electric element and the second electric element are provided by semiconductor devices, and the first and the second temperature sensing diodes are disposed on the first and the second electric elements through oxide films, respectively so that the first and the second temperature sensing diodes are electrically insulated from the first and the second electric elements. In this case, the parasitic operation of the diode is reduced. Thus, the operation error of the diode is prevented, so that the diode can detect the temperature of the device with high accuracy. Further, the noise from the diode is not transmitted to other parts of the device.

Preferably, the first electric element has a limitation of a usage temperature. The first and the second electric elements are disposed on the heat sink through the first and the second wiring boards in an arrangement direction so that the first and the second electric elements are disposed side by side. The heat sink includes a first width of a first part and a second width of a second part. The first part of the heat sink is disposed between the first and the second electric elements. The second part of the heat sink is disposed under the second electric element, and the first width is narrower than the second width. In this case, the distance between the second electric element and the second electric element can be shorter with preventing the heat in the second electric element from transmitting to the first electric element. Thus, the device has appropriate heat radiation characteristics.

Preferably, the heat sink further includes a third width of a third part. The third part of the heat sink is disposed under the first electric element, and the third width is narrower than the second width so that the heat sink has a T-shape. Or the third width is narrower than the second width so that the heat sink has a L-shape. In this case, space around the second electric element is formed appropriately, so that other parts such as a lead frame can be accommodated in the space.

Preferably, the first part of the heat sink is provided by a slit so that the first width is narrower than the second width. In this case, the slit shuts off the heat transmission between the first and the second electric elements.

An electric device includes: a control element; a driving element controlled by the control element; and a lead frame including an island part, a first lead terminal and a second lead terminal. The control element and the driving element are disposed on a mounting surface of the island part. The control element is connected to the first lead terminal through a bonding wire. The driving element is connected to the second lead terminal through another bonding wire. The control element, the driving element, the bonding wires, the island part, and the first and the second lead terminals are molded with a resin mold. The first lead terminal extends in a first direction parallel to the mounting surface of the island part. The second lead terminal extends in a second direction parallel to the mounting surface of the island part. The first lead terminal has a top end, which is protruded from the resin mold, and the second lead terminal has a top end, which is protruded from the resin mold.

In the above device, the control element, the driving element, the bonding wires, the island part, and the first and the second lead terminals are molded with a resin mold so that they are integrated. Thus, the dimensions of the device are reduced. In general, the device is connected to an external circuit in such a manner that the first lead terminal connecting to the control element is connected to a power source through a connector and the like. The second lead terminal connecting to the driving element is connected to an actuator such as a motor. The first and the second lead terminals do not protrude from the device in a thickness direction, i.e., a vertical direction of the device. Thus, the dimensions of the device are reduced. Further, the device can be connected to the external circuit appropriately through the terminals. Thus, the device has a small size so that the device is mounted in an actuator with ease.

Preferably, the first wiring board is a multi-layer wiring board, and the second wiring board is a single-layer wiring board. In this case, a controller is provided by the multi-layer wiring board so that a wiring in the controller is formed three-dimensionally. Further, since the second wiring board is formed of the single-layer wiring board, the manufacturing cost of the device is appropriately reduced.

Preferably, the second lead terminal includes a plurality of terminals, which have different terminal widths. In this case, the terminal has appropriate width when the terminal has a capability of flowing large current therethrough. However, some terminals have narrow widths because the terminals need not to flow large current therethrough. Thus, the dimensions of the device are reduced.

An electric device includes a plurality of terminals connecting to bonding wires. The bonding wires include a gold wire made of gold and an aluminum wire made of aluminum. The aluminum wire has a diameter, which is larger than that of the gold wire. The terminals include a first terminal and a second terminal. The first terminal connects to the gold wire, and the second terminal connects to the aluminum wire. The first terminal includes a nickel layer coated on a surface of the first terminal. The first terminal further includes a silver layer coated on the nickel layer and disposed on a contact portion between the first terminal and the gold wire, and the second terminal includes a nickel layer coated on a surface of the second terminal. In this case, the first and the second terminals are coated with the nickel layer so that the terminals are bonded and welded with external wires with ease. Further, a connection part of the first terminal is coated with the silver layer, so that the first terminal is connected to the gold wire with ease. Furthermore, the second terminal is coated with the nickel layer, so that the second terminal is bonded to the aluminum wire with ease.

Thus, the device includes the first terminal for the gold wire and the second terminal for the aluminum wire. The first terminal is capable of forming multiple pins, and the second terminal is capable of flowing large current therethrough. Thus, the device has large current passing through connection terminals and has a large number of connection terminals.

An electric device includes: a first circuit; a second circuit; and a plurality of terminals connecting to the first and the second circuits through bonding wires, respectively. The second circuit is capable of flowing electric current therethrough. The second circuit has a capacity of the current, which is larger than that of the first circuit. The terminals include a first terminal and a second terminal. The bonding wires include a gold wire made of gold and an aluminum wire made of aluminum. The aluminum wire has a diameter, which is larger than that of the gold wire. The first terminal connects to the first circuit through the gold wire, and the second terminal connects to the second terminal through the aluminum wire. The first terminal includes a nickel layer coated on a surface of the first terminal. The first terminal further includes a silver layer coated on the nickel layer and disposed on a contact portion between the first terminal and the gold wire, and the second terminal includes a nickel layer coated on a surface of the second terminal. The device includes the first terminal for the gold wire and the second terminal for the aluminum wire. The first terminal is capable of forming multiple pins, and the second terminal is capable of flowing large current therethrough. Thus, the device has large current passing through connection terminals and has a large number of connection terminals.

An electric device includes: a heat sink; an electric device disposed on the heat sink; a lead frame disposed around the electric device; and a resin mold molding the heat sink, the electric device, and the lead frame in such a manner that a bottom of the heat sink is exposed from the resin mold. The lead frame includes a suspending lead connecting to the heat sink. The resin mold includes an upper portion and a lower portion. The upper portion of the resin mold is disposed above the suspending lead. The lower portion of the resin mold is disposed below the suspending lead, and the lower portion is protruded from the upper portion. In this case, a dead space around the upper surface of the heat sink is reduced appropriately. Thus, the device has a small size so that the device is mounted in an actuator with ease.

Further, a method for manufacturing an electric device includes the steps of: mounting an electric element on an upper surface of a heat sink; mounting a lead frame around the electric element; connecting the heat sink to a suspending lead of the lead frame; and molding the heat sink, the electric element, and the lead frame with a resin mold by using a mold in such a manner that a bottom of the heat sink is exposed from the resin mold. The step of molding with the resin mold includes the steps of: pressing the suspending lead with a top mold of the mold; pressing the bottom of the heat sink on a bottom mold of the mold; and pouring melted resin into a cavity of the mold. The above method provides the electric device having no dead space on the upper surface of the heat sink, i.e., the mounting surface of the heat sink, on which the electric element is mounted. Further, no additional equipment such as a suction device is necessitated for the above method, so that the manufacturing cost of the device is not increased.

BRIEF DESCRIPTION OF THE DRAWINGS

The above and other objects, features and advantages of the present invention will become more apparent from the following detailed description made with reference to the accompanying drawings. In the drawings:

FIG. 27A is a front view showing driving equipment of a power window of an automotive vehicle having the electric device, and FIG. 27B is a side view showing the equipment, according to the eighth embodiment;

FIG. 33A is a partially enlarged cross sectional view showing the first connection terminal of the device, and FIG. 33B is a partially enlarged cross sectional view showing the second connection terminal of the device, according to the tenth embodiment;

FIG. 34A is a partial cross sectional view showing the first wiring board of the device, and FIG. 34B is a partial cross sectional view showing the second wiring board of the device, according to the tenth embodiment;

DETAILED DESCRIPTION OF THE PREFERRED EMBODIMENTS

First Embodiment

A first embodiment of the present invention relates to a semiconductor device provided with a first electronic element such as control element and a second electronic element such as power element that has larger current passed therethrough as compared with the first electronic element to generate large heat and is used for driving an actuator, for example, a motor.

The inventors have investigated that a problem to be described in the following arose in the case of a semiconductor device according to a related art.

Figures 5, 6A, 6B, 6C, 6D:
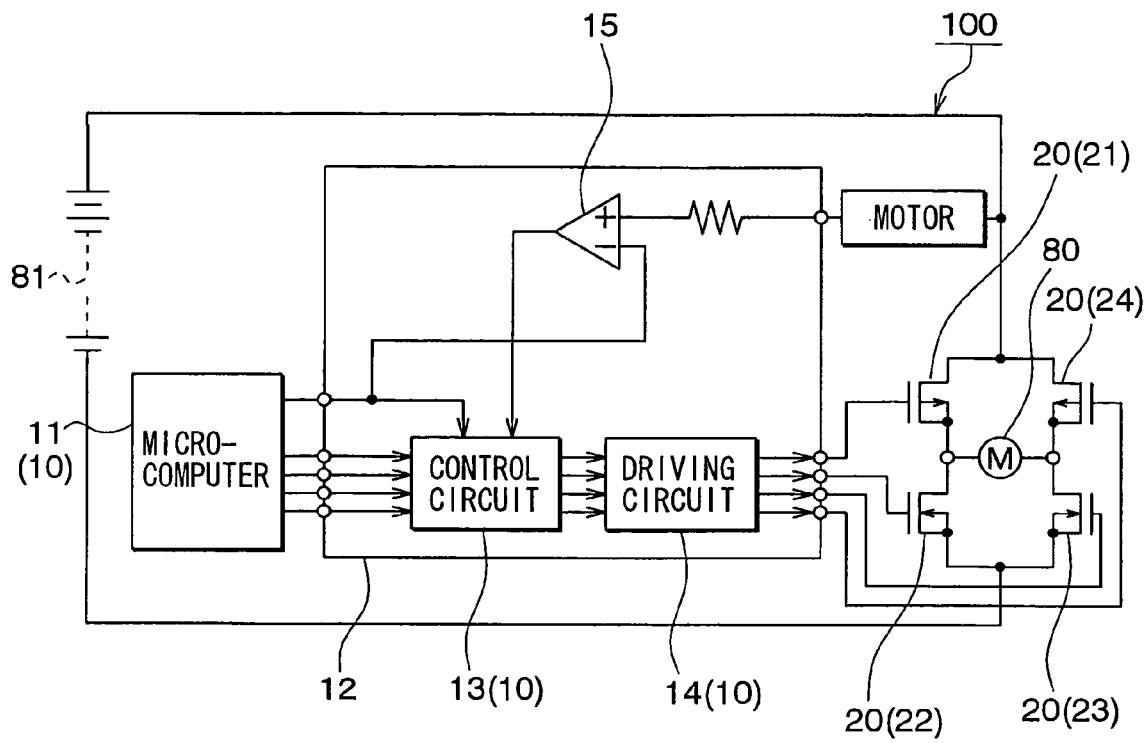
FIG. 5 is a circuit diagram showing a circuit of the device for driving a motor of a power window of an automotive vehicle, according to the first embodiment.
FIGS. 6A to 6D are diagrams explaining a on-off state of each power MOS transistor in different operating conditions, according to the first embodiment.

FIG. 5 is a circuit block diagram to show the typical circuit construction of a semiconductor device as a HIC for driving the driving motor of power window of an automobile. Specifically, FIG. 5 is the circuit block diagram to show a common circuit construction of the semiconductor device as a HIC for driving a driving motor of a power window of an automobile and having a JAM function.

In FIG. 5, a control element 10 as the first electronic element is constructed of a microcomputer 11, a control circuit 13, a driving circuit 14, a comparator 15, and the like. A power element as the second electronic element is constructed of a power MOS element 20. Further, the control element 10 and the power MOS element 20 are mounted on a common wiring board.

Here, the power MOS element 20 is constructed of four power MOS elements 21, 22, 23, and 24 that construct an H bridge circuit. Further, this semiconductor device is provided in the peripheral portion of a motor 80 for driving window glass and a power source 81 for the device.

In the semiconductor device like this, a signal is transmitted to the microcomputer 11 from a microcomputer (not shown) by communications (for example, LIN) and the microcomputer 11 controls the respective power MOS elements 21 to 24 via the control circuit 13 and the driving circuit 14 according to the instruction from the microcomputer 11. The output of the driving circuit 14 is inputted to the gates of the respective power MOS elements 21 to 24.

Here, ON/OFF states of the gate inputs of the respective power MOS elements in the state where the motor 80 operates are shown in FIGS. 6A to 6D. As described above, it is the motor 80 that moves up and down the window glass of a vehicle and the states of gate inputs when the motor is stopped, the window glass is moved up, and the window glass is moved down are shown in FIGS. 6A to 6D.

When the motor is stopped, all of the four power MOS elements 21 to 24 are brought into OFF state and when the window glass is moved up (or down), two power MOS elements 21, 23 are brought into ON state (OFF state, when the window glass is moved down) and two power MOS elements 22, 24 are brought into OFF state (ON state, when the window glass is moved down).

Here, a HIC having a JAM preventing function can perform three operations of opening a window glass, closing the window glass, and preventing jamming. Here, to be specific, the JAM preventing function is as follows.

For example, When the power MOS elements 21, 23 hold ON state when the window glass is moved up and moved uppermost, an excessively large current is passed through the motor 80 to make the motor 80 produce large torque to bring the window glass into a catching state.

At this time, for example, a Hall sensor or the like detects the rotation of the motor 80, and the comparator 15 compares the detected rotational state of the motor 80 with the command of the microcomputer 11 to determine that the window glass is brought into a catching state. Then, the control circuit 13 switches a signal so as to perform a PWM operation (pulse width modulation control operation) of cutting the passage of current to the motor 80 and passing the current in a repeating manner.

In other words, usually, when the window glass is moved up, as shown by "moving up" in FIGS. 6A to 6D, gate input signals are given to the respective power MOS elements 21 to 24. However, when it is determined that the window glass is brought into a catching state, the power MOS elements 21 to 24 are brought from ON state into a state where ON state and OFF state are repeated, that is, into the state of PWM control.

With this, the torque of the motor 80 is decreased to prevent a passenger from being caught and injured by the window glass. When the catching state continues for a predetermined time, the gate inputs of the respective power MOS elements 21 to 24 are brought into a state of stopping the motor 80 to stop the passage of current to the motor 80.

In this operation, when the window glass is moved up and moved down, the power MOS elements 21 to 24 are ON and the voltage between source and drain in the power MOS element (D-to-S voltage) becomes sufficiently small and power consumption is also small. However, at the time of PWM control, when the power MOS elements 21 to 24 are repeatedly ON and OFF, the D-to-S voltage becomes extremely large and power consumption becomes large.

When the window glass is moved up and moved down, and for example, when a current of 1 A is passed at a voltage of 0.3 V, power consumption is 0.3 W. However, at the time of PWM control, for example, when a current of 0.2 A is passed at an average voltage of 7 V, power consumption is 1.4 W, which is more than 4 times the former power consumption. These numerical values are only examples, but in reality there is a tendency that power consumption at the time of PWM control becomes larger.

In this manner, in the related semiconductor device, large heat is transmitted to the control element 10 from the power element 20 that is larger in the amount of current and the amount of generation of heat than the control element 10, whereby the control element 10 is susceptible to the heat.

In particular, a device to perform the PWM control as described above is greatly susceptible to transient heating of the power element 20.

Here, in the related art semiconductor device described above, large heat is transmitted to the control element 10 via a wiring board easily transmitting heat from the power element 20 that has larger current passed therethrough as compared with the control element 10 to generate large heat, whereby the control element 10 is apt to be affected by the heat.

The control element 10 is limited in operating temperature and usually has a lower operating temperature because it has delicate construction as compared with the power element 20. Hence, it is important to prevent the effect of heat from the power element 20 as described above.

By the way, in simple terms, it is recommendable to increase the distance between the control element 10 and the power element 20 on the wiring board on which the control element 10 and the power element 20 are mounted, but in this case, the device results in increasing in size, which is not desirable.

In view of the above problem, a semiconductor device according to a first embodiment of the repent invention is provided.

Figure 1A:
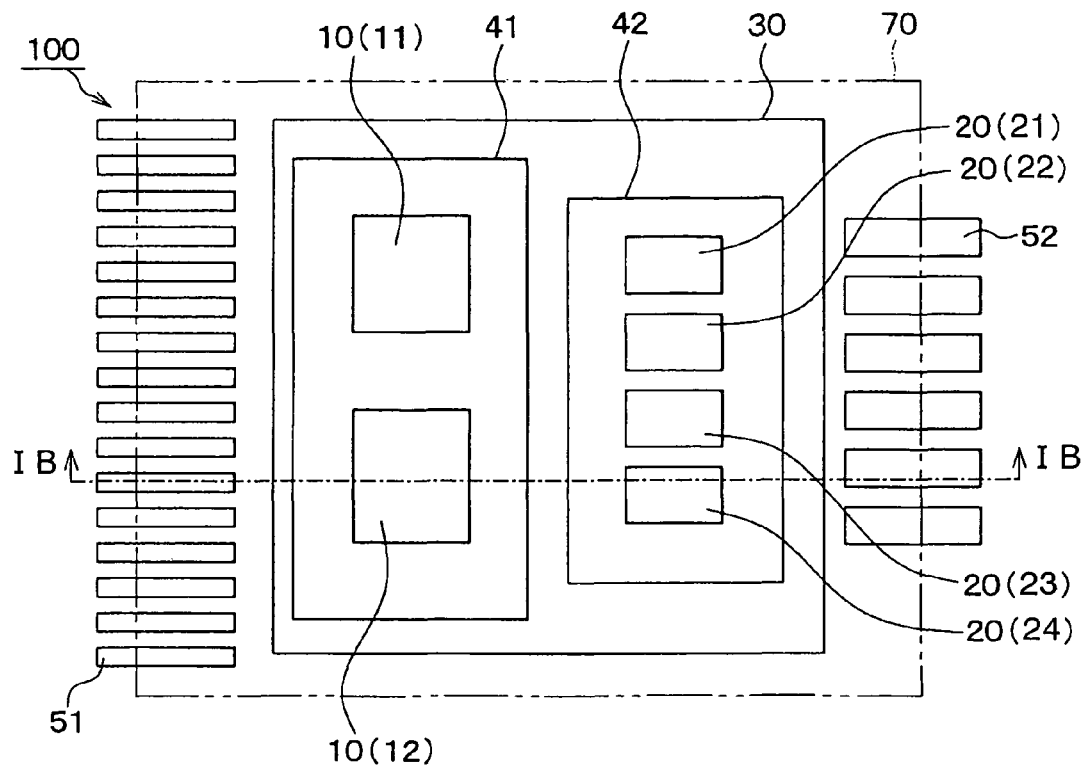
FIG. 1A is a plan view showing a semiconductor device according to a first embodiment of the present invention.
Figure 1B:
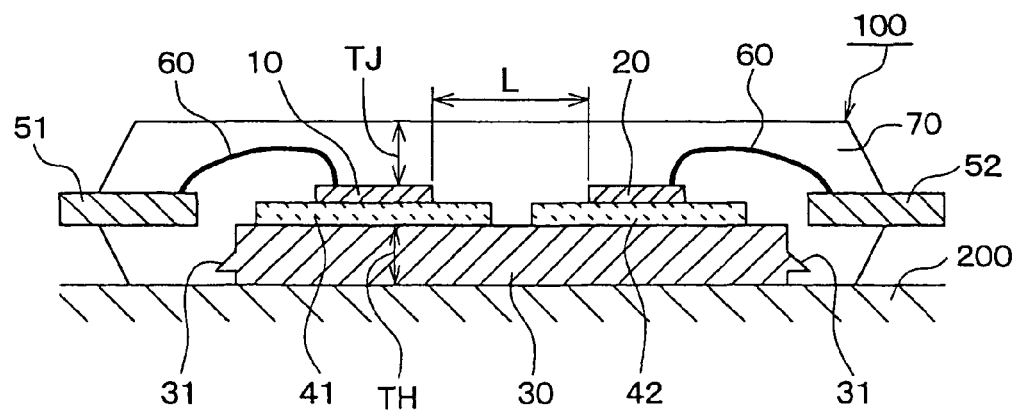
FIG. 1B is a cross sectional view showing the device taken along line IB-IB in FIG. 1A.

FIGS. 1A and 1B are illustrations to show the general construction of a semiconductor device 100 provided with the first electronic element 10 and the second electronic element 20 in accordance with the first embodiment. FIG. 1A is a plan view and FIG. 1B is a sectional view along a line IB-IB in FIG. 1A.

In this embodiment, the description will be given on the assumption that the semiconductor device 100 is applied to a HIC for driving the driving motor of power window of a vehicle, as is the case with the device shown in FIG. 5, although it is not intended to limit the invention to this.

[Device Construction]

In this embodiment, the first electronic element 10 is constructed of a microcomputer 11 as a control element and a control IC 12. These are formed of elements such as transistor formed on a semiconductor substrate (semiconductor chip), for example, a silicon semiconductor by the use of a semiconductor process.

Further, the second electronic element 20 has larger current passed therethrough as compared with the first electronic element to generate large heat and is formed of power element such as power MOS element and IGBT element.

In this embodiment, the second electronic element 20 is constructed of four power MOS elements 20 (21, 22, 23, and 24) as the power elements. These power MOS elements 20 are controlled by the control element 10 and are constructed as driving elements for driving the above-described motor.

Further, this semiconductor device 100 is provided with a heat sink 30. This heat sink 30 is shaped like a rectangular plate and in this embodiment, the plan size of the heat sink 30 in FIGS. 1A and 1B is, for example, approximately 50 mm square and the thickness TH (see FIG. 1B) of the heat sink 30 is approximately 1.5 mm.

In this embodiment, this heat sink 30 is made of iron-based metal and is formed of pure iron (Fe) in this example. As shown in FIG. 1B, a protruding portion 31 referred to as the so-called coining is formed on the side surfaces between the top surface and the bottom surface of the heat sink 30.

The first wiring board 41 and the second wiring board 42 which are separated from each other are mounted on the top surface of the heat sink 30. These first and second wiring boards 41, 42 are fixed to the top surface of the heat sink 30, for example, by an adhesive (not shown) made of resin having electric insulation and excellent thermal conductivity.

Here, a ceramic laminated board having two or more ceramic layers mounted with wirings or a printed wiring board can be adopted as the first wiring board 41. On the other hand, a thick wiring board formed of single-layer or approximately two-layer thick wiring can be adopted as the second wiring board 42.

To be specific, both of the wiring boards 41, 42 are preferably formed of alumina board made of alumina. In this embodiment, a laminated wiring board made of alumina can be adopted as the first wiring board 41 and a single-layer wiring board made of alumina can be adopted as the second wiring board 42.

The control elements 10 as the first electronic element are mounted on the first wiring board 41 and the power MOS elements 20 as the second electronic element are mounted on the second wiring board 42. Here, the control elements 10 and the power MOS elements 20 are fixed on the wiring boards 41, 42, respectively, for example, by solder (not shown).

Further, as shown in FIGS. 1A and 1B, a plurality of signal terminals 51 are provided around the control elements 10 in the outer periphery of the heat sink 30 and a plurality of current terminals 52 are provided around the power MOS elements 20. These lead parts 51, 52, that is, the signal terminals 51 and the current terminals 52 can be formed by the use of a lead frame made of, for example, Cu and 42 alloy.

The signal terminals 51 are electrically connected to the microcomputer 11 and the control IC 12, which are the control elements 10, and the current terminals 52 are electrically connected to the respective power MOS elements 20, which are the power elements.

These terminals 51, 52 and the elements 10, 20 are connected to each other by bonding wires 60, thereby being electrically connected to each other, as shown in FIG. 1B. Here, the bonding wires 60 are omitted in FIG. 1A.

The control elements 10, the power MOS elements 20, the first wiring board 41, the second wiring board 42, the bonding wires 60, connection portions where the terminals 51, 52 are connected to the bonding wire 60, and the heat sink 30 are molded by resin 70.

This resin 70 is made of mold resin material used for usual semiconductor package such as epoxy-based resin and is molded by a transfer molding method using a molding die or the like.

Here, as shown in FIG. 1B, the bottom surface opposite to the top surface of the heat sink 30, on which both of the electronic elements 10, 20 and both of the wiring boards 41, 42 are mounted, is exposed from the resin 70. The above-described protruding portion 31 of the heat sink 30 digs in the resin 70.

Further, this semiconductor device 100 is mounted on a case 201, as shown in FIG. 1B. This case 201 is constructed as a motor case made of metal in which the motor 80 (see FIG. 5) for driving the above-described power window is received.

For example, the semiconductor device 100 is in contact with the case 201 with grease or the like having electric insulation and excellent thermal conductivity interposed between the bottom surface of the heat sink 30 and the case 201. The semiconductor device 100 is adapted to radiate its heat to the case 201 via the heat sink 30.

The semiconductor device 100 like this can be manufactured in the following manner: for example, the first wiring board 41 having the control element 10 mounted thereon and the second wiring board 42 having the power element 20 mounted thereon are mounted on the heat sink 30; the lead parts 51, 52 are arranged around them; the first wiring board 41 and the second wiring board 42 are bonded to the lead parts 51, 52 by wires; and then all these parts are molded by resin.

[Circuit Construction and Operation]

Further, the circuit construction of the semiconductor device 100 of this embodiment is the same as shown in FIG. 5. Although a little repeated description will be given, the circuit construction of the semiconductor device 100 of this embodiment will be described in brief with reference to FIG. 5 and FIGS. 6A to 6D.

As shown in FIG. 5, in this semiconductor device 100, the control element 10 as the first electronic element is constructed of the microcomputer 11 and the control IC 12 including the control circuit 13, the driving circuit 14, and the comparator 15. A power element as the second electronic element is constructed of four power MOS elements 20 (21 to 24).

Here, four power MOS elements 21, 22, 23, 24 construct an H bridge circuit. Further, in this semiconductor device 100, there are provided the above-described motor 80 for driving the window glass and the power source 81 of the device.

In the semiconductor device 100, an instruction is transmitted to the microcomputer 11 from a microcomputer (not shown) by communications (for example, LIN) and the microcomputer 11 controls the respective power MOS elements 21 to 24 via the control circuit 13 and the driving circuit 14 according to the instruction. The output of the driving circuit 14 is inputted to the gates of the respective power MOS elements 21 to 24.

Here, it is the motor 80 that moves up and down the window glass of the vehicle and the states of gate inputs at the times when the motor is stopped, when the window glass is moved up, and when the window glass is moved down, are shown in FIGS. 6A to 6D.

That is, as shown in FIGS. 6A to 6D, when the motor is stopped, all of the four power MOS elements 21 to 24 are brought into OFF state and when the window glass is moved up, two power MOS elements 21, 23 located on one diagonal in the H bridge circuit are brought into ON state whereas two power MOS elements 22, 24 located on the other diagonal are brought into OFF state.

Further, when the window glass is moved down, two power MOS elements 21, 23 located on one diagonal in the H bridge circuit are brought into OFF state whereas two power MOS elements 22, 24 located on the other diagonal are brought into ON state. In other words, when the window is moved up and when the window is moved down, current passing through the motor 80 is reversed by the H bridge circuit and hence the motor 80 is also reversely rotated.

In this semiconductor device 100, a JAM preventing function is as follows. When the power MOS elements 21, 23 hold ON state and when the window glass is moved up and moved uppermost, an excessively large current is passed through the motor 80 to produce large torque in the motor 80 to bring the window glass into a catching state.

At this time, for example, a Hall sensor (not shown) or the like detects the rotation of the motor 80, and the comparator 15 compares the detected rotational state of the motor 80 with the instruction of the microcomputer 11 to determine that the window glass is brought into a catching state. Then, the control circuit 13 switches a signal so as to perform a PWM operation (pulse width modulation control operation) of cutting the passage of current to the motor 80 and passing the current in a repeating manner.

This PWM operation decreases the torque of the motor 80 and hence can prevent a user from being caught in and injured by the window glass. When a predetermined catching state continues for a predetermined time, the gate inputs of the respective power MOS elements 21 to 24 are brought into a state where the motor is stopped to stop the passage of current to the motor 80.

In the operation, as described above, when the window glass is moved up and down, a D-to-S voltage in the power MOS element 20 is sufficiently small and power consumption is also small. However, at the time of PWM control, the D-to-S voltage becomes extremely large and power consumption becomes large.

[Effects]

In this manner, in this semiconductor device 100, large heat is transmitted to the control element 10 from the power element 20 that is larger in the amount of current and the amount of generation of heat than the control element 10.

In particular, in the semiconductor device 100, the duration of the PWM control in which power consumption is large and hence the effect of transient heat generated by the power element 20 in the above-described PWM control is larger than the effect of steady heat generation.

As described above, in this embodiment, there is a tendency that the effect of transient heat generated by the power element 20 in the above-described PWM control is larger than the effect of steady heat generation. For this reason, in this embodiment, a structure of securing a temporary thermal storage (that is, transient thermal resistance) is more suitable than a structure of securing entire heat radiation (that is, steady thermal resistance).

Further, this semiconductor device 100 described above, large heat is transmitted to the control element 10 from the power element 20 that has larger current passed therethrough as compared with the control element 10 to generate large heat.

Since an LSI constructing the microcomputer 11 and the like as the control element 10 has a small logic driving current, a small leak current is apt to cause the LSI to malfunction in high temperature environments, which makes it difficult to guarantee complex operations.

For this reason, in the control element 10, an operation guarantee temperature at high temperature is set at a lower temperature as compared with the power element 20. Hence, it is important to prevent the effect of heat from the power element 20 to the control element 10, as described above.

In order to prevent the effect of heat from the power element 20 to the control element 10, as described above, and to realize suitable heat radiation characteristics, in this embodiment, as described above, there is provided the semiconductor device 100 provided with the control element 10 and the power element 20 controlled by the control element 10 and characterized in that the device has the heat sink 30 and the first wiring board 41 and the second wiring board 42, which are mounted on one surface of the heat sink 30 and are separated from each other, and in that the control element 10 is mounted on the first wiring board 41, and in that the power element 20 is mounted on the second wiring board 42.

According to this, the control element 10 and the power element 20 are mounted on the wiring boards 41, 42 which are arranged separately from each other and are mounted on the heat sink 30. Hence, even when the distance L between the control element 10 and the power element 20 (see FIG. 1B) is not so large, it is possible to male it difficult to transmit the heat of the power element 20 to the control element 10.

Hence, according to this embodiment, in the semiconductor device 100 having the control element 10 and the power element 20 that has larger current passed therethrough as compared with the control element to generate large heat, it is possible to minimize the upsizing of the device to the extent possible and to realize suitable heat radiation characteristics.

In particular, in this embodiment, the power element 20 is adopted as the second electronic element and the control element 10 for controlling the power element 20 is adopted as the first electronic element.

For this reason, as described above, according to this embodiment, it is possible to protect the control element 10 having a low operation guarantee temperature on a high temperature side as compared with the power element 20 from the transient large heat generated by the power element 20.

Further, in this embodiment, the heat sink 30 is constructed of iron-based metal to prevent heat transfer from the power element 20 to the control element 10 more suitably. The iron-based metal is adopted in consideration of placing importance on the heat capacity than the thermal conductivity in the heat sink 30 in order to respond to the transient heat generated by the above-described power element 20 and of responding to the scaling-up of a scale circuit.

The iron-based metal has low thermal conductivity and large heat capacity as compared with an ordinary heat sink material such as Cu and hence improves the thermal storage of the heat sink 30, whereby the heat of the power element 20 is hard to transfer to the control element 10.

Here, when paying attention to the specific characteristics of Cu and Fe, for example, Cu has a density of 0.00889 g/mm$^3$, a molar specific heat of 24.5 J/mol•K, a specific heat of 0.38 J/g•K, a product of density and specific heat (that is, heat capacity) of 0.0034 J/mm$^3$•K, a thermal conductivity of 0.391 W/mm•K, and a coefficient of thermal expansion α of 17×10$^{-6}$/° C.

Further, Fe has a density of 0.00785 g/mm$^3$, a molar specific heat of 25.2 J/mol•K, a specific heat of 0.46 J/g•K, a product of density and specific heat (that is, heat capacity) of 0.0036 J/mm$^3$•K, a thermal conductivity of 0.071 W/mm•K, and a coefficient of thermal expansion α of 12×10$^{-6}$/° C.

In this manner, Fe has lower thermal conductivity and larger heat capacity than Cu, so that when the heat sink 30 is made of Fe, the thermal storage can be increased.

In other words, in the semiconductor device 100 of this embodiment, by separating the wiring boards 41, 42 and making the heat sink 30 of Fe, the heat sink 30 can be so structured as to have lower thermal conduction and larger heat capacity, whereby the heat of the power element 20 is hard to transfer to the control element 10.

Figure 2:
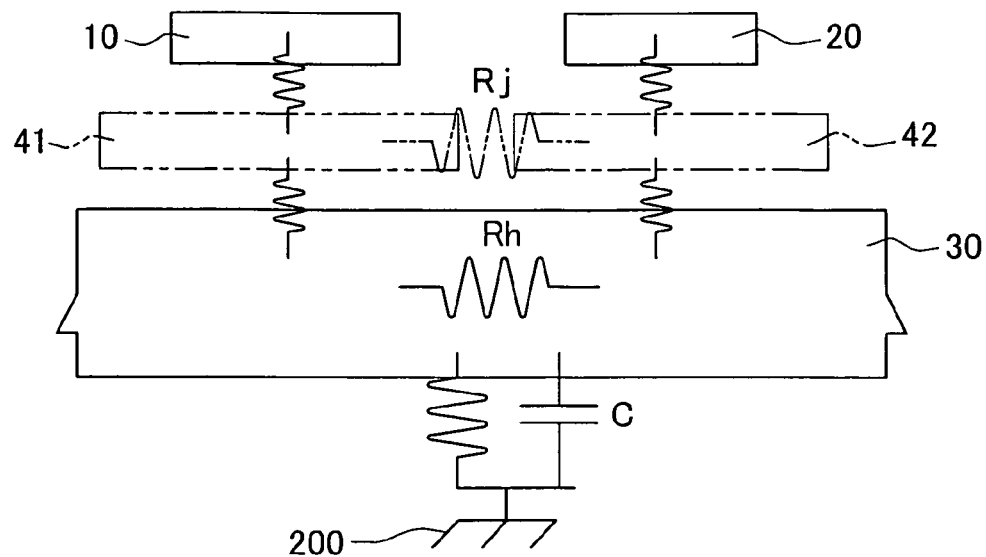
FIG. 2 is a schematic diagram explaining a heat resistance model of the device according to the first embodiment.

Here, FIG. 2 is an illustration to show a thermal resistance model in the semiconductor device 100 of this embodiment. As described above, Fe is inferior to Cu in thermal conductivity but is equal to or larger than Cu in a physical property of a product of density and specific heat (that is, heat capacity).

The heat from the power element 20 which is a heating body will transfer to the control element 10 via the second wiring board 42, the heat sink 30 and further via the first wiring board 41.

At this time, since the structure is adopted in which the alumina board 42 mounted with the power element 20 is separated from the alumina board 41 mounted with the control element 10, thermal conduction via the alumina boards 41, 42 is small.

Further, when the thermal resistances between the respective parts are relatively compared with each other in the thermal resistance model shown in FIG. 2, the thermal resistance Rj of the resin 70 is sufficiently large and the thermal resistance Rh of the heat sink 30 is comparatively large and also the heat capacity HC of the heat sink 30 with respect to the case 201 is comparatively large.

For this reason, the heat from the power element 20 is hard to transfer to the control element 10 and is mainly stored in the heat sink 30 and then is radiated mainly to the case 201. In this manner, in this embodiment, temporary heat generation from the power element 20 which is a heating source is stored by the alumina board 42 arranged directly below the power element 20 and the heat sink 30 to prevent heat transfer to the control element 10.

Hence, in view of the thermal resistance model like this, it is a suitable action to construct the heat sink 30 of Fe having physical properties of thermal storage, in which Fe is a little better than Cu, and thermal conduction, in which Fe is considerably poor than Cu, that is, approximately ⅕ as large as Cu.

Further, as described above, the plan size of the heat sink 30 is, for example, 50 mm square, whereas the thickness TH of the heat sink 30 (see FIG. 1B) is 1.5 mm at most. For this reason, the contribution of thermal resistance of the heat sink 30 when heat transfers to the case (motor case) under the heat sink 30 is sufficiently small.

However, the distance L between the control element 10 and the power element 20 (see FIG. 1B) needs to be, for example, 10 mm or more for the purpose of connecting bonding wires 60 and the like.

Referring to the contribution of thermal resistance, thermal conduction from the power element 20 to the control element 10 is approximately 10 times thermal conduction from the power element 20 to the case 201. Hence, even when the heat sink 30 is made of Fe to reduce the thermal conduction of the heat sink 30 to one-fifth times the thermal conduction when the heat sink 30 is made of Cu, much of effect produced by the heat sink 30 made of Fe is contributed to reduction in thermal conduction from the power element 20 to the control element 10.

Further, this embodiment, as shown in FIGS. 1A and 1B, is characterized in that the control element 10 which is the first electronic element, the power element 20 which is the second electronic element, the first wiring board 41, the second wiring board 42, and the heat sink 30 are molded by the resin 70 and also in that the bottom surface (other surface) of the heat sink 30 is exposed from the resin 70.

According to this construction, the bottom surface opposite to the top surface of the heat sink 30, on which both of the electronic elements 10, 20 and both of the wiring boards 41, 42 are mounted, is exposed from the resin 70, so that heat conducted to the heat sink 30 can be appropriately radiated to the outside case 201.

[Improvement of Resistance to Heat Cycle]

Here, in a large-scale transfer mold having the control element 10 and the power element 20 built therein like the semiconductor device 100 of this embodiment, thermal stress relating to resistance to heat cycle becomes a challenge to be overcome.

That is, the semiconductor device 100 of this embodiment becomes a large-scale circuit and a large package and hence needs to be improved in thermal stress for the purpose of improving resistance to heat cycle.

Hence, in this embodiment, various constructions to be described in the following are adopted as measures against the thermal stress relating to this resistance to heat cycle.

As described above, in this embodiment, it is preferable that the heat sink 30 is constructed of Fe. Here, the coefficient of thermal expansion α of Si constructing the control element 10 and the power element 20 is approximately $4 \times 10^{-6}$/° C. At this time, as described above, the coefficient of thermal expansion α of Cu is approximately $17 \times 10^{-6}$/° C. and the coefficient of thermal expansion α of Fe is approximately $12 \times 10^{-6}$/° C., so that Fe is closer to Si in the coefficient of thermal expansion than Cu.

In this embodiment, it is preferable that the coefficient of thermal expansion α of the resin 70 is approximately $11 \times 10^{-6}$/° C. which is close to the coefficient of thermal expansion α of Fe. Here, in consideration of the hardening contraction and hardening temperature of the resin 70, it is preferable that the coefficient of thermal expansion α of the resin 70 is nearly equal to or a little smaller than the coefficient of thermal expansion α of Fe.

When the coefficients of thermal expansion of the respective parts of the semiconductor device 100 are made close to each, the difference in thermal expansion between the parts, for example, between the resin 70 and the heat sink 30 can be reduced, which becomes measures for preventing the resin 70 from being separated by heat cycle.

In this regard, epoxy-based resin containing silica filler can be adopted as the resin 70 of this embodiment. In this resin 70, the coefficient of thermal expansion α of the resin 70 can be controlled by controlling the amount of silica filler. To be specific, resin having a thermal conductivity of 0.0006 W/mm•K and a coefficient of thermal expansion α of approximately $11 \times 10^{-6}$/° C. can be adopted as the resin 70.

Further, as described above, in this embodiment, it is preferable that the first wiring board 41 and the second wiring board 42 are alumina boards made of alumina.

This is because alumina has a coefficient of thermal expansion α between those of Si and Fe and hence is effective in balancing thermal expansion between the heat sink 30, wiring boards 41, 42, and the respective elements 10, 20 and in preventing the resin 70 from being separated. Further, it is also a merit that alumina has comparatively good thermal conduction.

For example, as both of the wiring boards 41, 42 can be adopted such an alumina board that has a density of 0.0035 g/mm$^3$, a molar specific heat of 79 J/mol•K, a specific heat of 0.77 J/g•K, a product of density and specific heat (that is, heat capacity) of 0.0027 J/mm$^3$•K, a thermal conductivity of 0.021 W/mm•K, and a coefficient of thermal expansion α of $7 \times 10^{-6}$/° C.

Further, in this embodiment, it is preferable that the glass transition temperature, that is, glass transition point (Tg point) of the resin 70 is higher than the maximum temperature Tjmax at which the power element 20 operates.

This temperature Tjmax is a Si junction temperature and corresponds to the maximum temperature at which the semiconductor device 100 actually operates. For example, in this embodiment, the Tg point can be made approximately 165° C. and the temperature Tjmax can be made approximately 150° C.

In general, in the resin, elasticity rapidly decreases and the coefficient of thermal expansion α rapidly increases in a high temperature region higher than Tg point. In-other words, an inflection point in the temperature characteristics of elasticity and coefficient of thermal expansion of the resin is the Tg point.

When the Tg point is smaller than the maximum temperature Tjmax at which the semiconductor device 100 can operate, the coefficient of thermal expansion α of the resin 70 becomes extremely large at high temperature. Then, the effect of thermal stress becomes large and hence the mismatch in the coefficient of thermal expansion between the heat sink 30 made of Fe and the resin 70 becomes large. As a result, this causes the separation of the resin 70 to reduce the reliability of the device.

For example, in the resin 70 used in this embodiment, when temperature is Tg point or less (for example, 165° C. or less), the coefficient of thermal expansion α of the resin 70 is $11 \times 10^{-6}$/° C., whereas when temperature is Tg point or higher, the coefficient of thermal expansion α is $48 \times 10^{-6}$/° C., which is approximately four times the former.

When the ambient temperature of the power element 20 is higher than the Tg point, the coefficient of thermal expansion α of the resin 70 around the power element 20 becomes large, which increases unbalance in the coefficient of thermal expansion α between the resin 70 and the heat sink 30 and hence increases thermal stress.

In order to avoid this, in this embodiment, it is desirable that the relationship of Tg>Tjmax be kept. In this regard, Tjmax is assured by overcurrent limitation and temperature detecting function.

Then, by holding the relationship of Tg>Tjmax, it is possible to prevent the coefficient of thermal expansion α of the resin 70 from changing drastically when the semiconductor device 100 operates. This is preferable in the sense that the separation of the resin 70 from the heat sink 30 can be prevented.

Further, in this embodiment, as shown in FIG. 1B, the protruding portion 31 is formed on the side surface between one surface and the other surface of the heat sink 30 and digs into the resin 70. This is also one of measures against the thermal stress relating to the resistance to heat cycle.

According to this, the protruding portion 31 in the heat sink 30 digs into the resin 70. This enhances the engagement of resin 70 with the heat sink 30 to prevent the intrusion of moisture and the separation of the resin 70, which can improve the resistance to heat cycle.

The resin 70 includes materials having different coefficient of thermal expansion α such as the respective elements 10, 20 made of Si and the respective wiring boards 41, 42 made of alumina boards. For this reason, there is a possibility that even when the coefficient of thermal expansion α of the resin 70 is brought into agreement with that of the heat sink 30, as described above, this agreement can not be said to be sufficient for measures to prevent the resin 70 from being separated by heat cycle.

Hence, it is preferable to prevent the separation of resin 70 by adopting the construction of providing the heat sink 30 with the protruding portion 31 in this manner.

Further, in this embodiment, as shown in FIG. 1B, it is preferable that the thickness TJ of the resin 70 above both of the electronic elements 10, 20 in the direction in which the electronic elements 10, 20, both of the wiring boards 41, 42, and the heat sink 30 are laminated, that is, in the thickness direction of the semiconductor device 100 is substantially equal to the thickness TH of the heat sink 30.

According to this construction, it is possible to improve the balance in thermal expansion between the resin 70 and the heat sink 30 in the direction of lamination and to enhance the resistance to heat cycle. To be specific, it is possible to make thermal stresses in the respective parts in the device equal to each other and hence to prevent fro warping caused by expansion and contraction resulting from heat cycle. As a result, it is possible to reduce strains between the different kinds of materials such as between the heat sink 30 and the resin 70.

These measures against the thermal stress relating to the resistance to heat cycle are important for needs for requiring severer temperature conditions in such a device as this semiconductor device 100 that has a microcomputer built therein, thereby becoming intelligent and is integrated with a motor (actuator).

Further, like this embodiment, in the construction in which the control element 10 having low (in other word, severe) temperature environment where operation is assured at low temperatures and the power element 20 having comparatively high temperature environment are packaged in the same device, a structure design relating to heat design also becomes important.

As an example of downsizing the semiconductor device 100, when the total thickness of the semiconductor device 100 is 5 mm, as a guide, TJ=TH≅approximately 1.5 mm. Further, in accordance with a device, the thickness can be made larger for a device requiring large heat capacity and the thickness can be made smaller for a device required downsizing.

Further, as described above, in the semiconductor device 100 of this embodiment, when the motor is stopped, all of four power MOS elements 21 to 24 which construct an H bridge circuit are brought into OFF state and when the window glass is moved up (or down), two power MOS elements 21, 23 are brought into ON state (in OFF state, when the window glass is moved down) and two power MOS elements 22, 24 are brought into OFF state (in ON state, when the window glass is moved down).

In view of operating conditions like this, in this semiconductor device 100, as shown in FIG. 1A, four power MOS elements 21 to 24 are arranged in such a way that the neighboring power elements are not brought into ON state at the same time.

In other words, as shown in FIG. 1A, the power MOS elements that are brought into ON state (OFF state) when the window is moved up (when the window is moved down) and the power MOS elements that are brought into OFF state (ON state) when the window is moved up (when the window is moved down) are alternately arranged.

Further referring to this arrangement of the power MOS elements, in this embodiment, four power MOS elements 21 to 24 are arranged in such a way that when at least one of four power MOS elements 21 to 24 is brought into ON state, at the same time, one of the neighboring power MOS elements is brought into ON state and the other is brought into OFF-state.

According to this arrangement, the neighboring power MOS elements in four power MOS elements 21 to 24 are not brought into ON state at the same time, so that the local accumulation of heat can be prevented to the extent possible. Further, this can preferably realize a construction in which the heat of the power MOS elements 21 to 24 is widely dispersed to the second wiring board 42 and is then dissipated to the heat sink 30.

(Modifications)

Here, various modifications of this embodiment will be described. In FIGS. 3A to 3D are shown schematic sectional views to show various examples of the heat sink 30 applicable to this embodiment other than the heat sink 30 shown in FIGS. 1A and 1B.

In the respective heat sinks 30 shown in FIGS. 3A to 3D, as is the case with the heat sink 30 shown in FIGS. 1A and 1B, thermal separation of the control element 10 from the power element 20 and the thermal conduction to the case 201 are taken into consideration.

Figure 3A:
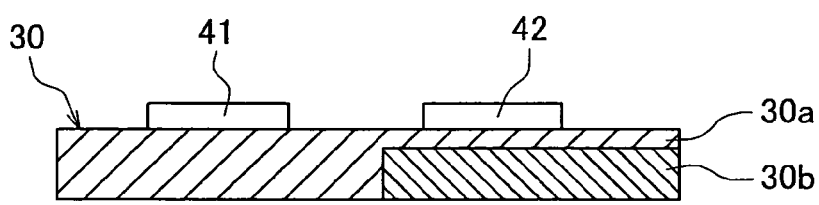
FIGS. 3A to 3D are cross sectional views showing various heat sinks according to a first modification of the first embodiment.
Figure 3B:
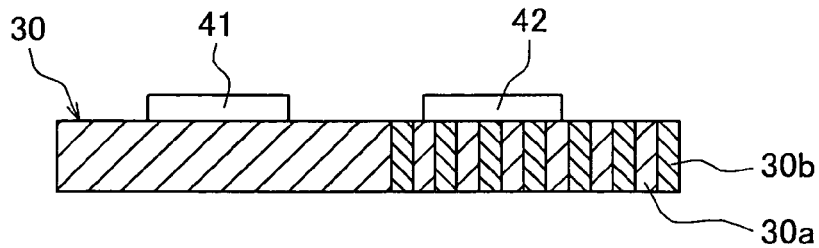
Figure 3C:
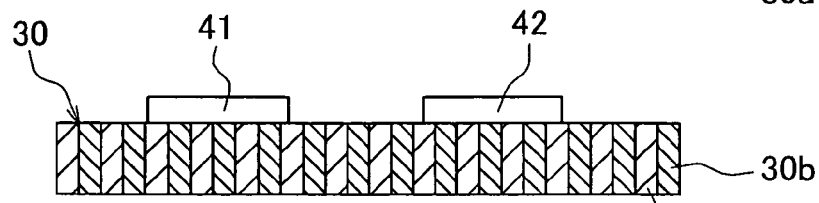

The heat sink 30 shown in FIGS. 1A and 1B is made of Fe as a whole and is shaped like a rectangular plate. However, as for the heat sink 30 of this embodiment, as shown in FIGS. 3A, 3B, and 3C, it is essential only that at least a portion located between the first wiring board 41 and the second wiring board 42 is made of iron-based metal.

In the heat sink 30 shown in FIG. 3A, of the heat sink 30, a portion located below the second wiring board 42, that is, below the power element 20 is formed of two layers of an Fe construction portion 30a made of Fe and a Cu construction portion 30b made of Cu.

The heat sink 30 like this can be formed by the use of a clad material of Fe and Cu. In this heat sink 30, the Cu construction portion 30b of a lower layer has excellent thermal conduction to the case 201 and is not in contact with the resin 70. In this manner, separation caused by unbalance in thermal expansion is taken into consideration.

In the heat sink 30 shown in FIG. 3B, a portion located below the power element 20 of the heat sink 30 has a construction in which the Cu construction portion 30b is embedded in the Fe construction portion 30a. This construction improves thermal conduction in the longitudinal direction in the lower portion of the power element 20 in the heat sink 30.

In the heat sink 30 shown in FIG. 3C, also a portion located below the control element 10 in the heat sink 30 shown in FIG. 3B has a construction in which the Cu construction portion 30b is embedded in the Fe construction portion 30a.

In these heat sinks 30 shown in FIGS. 3A to 3D, the portion located between the first wiring board 41 and the second wiring board 42 of the heat sink 30 is made of iron-based metal having lower thermal conduction and larger heat capacity than a usual heat sink material such as Cu.

For this reason, in these heat sinks 30, the thermal storage of the heat sink 30 in the portion is improved and hence, as is the case with the heat sink 30 shown in FIGS. 1A and 1B, the heat of the power element 20 is hard to transfer to the control element 10.

Figure 3D:
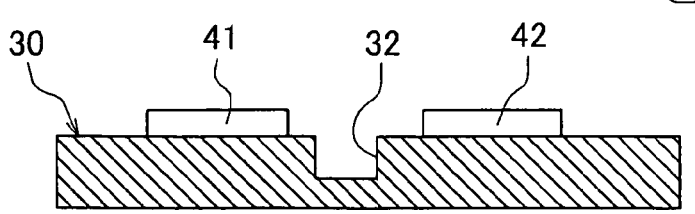

In the heat sink 30 shown in FIG. 3D, a portion located between the first wiring board 41 and the second wiring board 42 is formed in a cutout portion 32. With this, the portion located between both of the wiring boards 41, 42 of the heat sink 30 becomes a thinner portion than the other portion of the heat sink 30.

According to this heat sink 30, the thermal resistance of the portion located between the wiring board 41 and the second wiring board 42 of the heat sink 30, that is, the cutout portion 32 can be increased to reduce the thermal conduction between both of the wiring boards 41, 42, whereby the heat of the power element 20 is hard to transfer to the control element 10.

For this reason, the heat sink 30 shown in FIG. 3D can be made of Cu. However, needless to say, this heat sink 30 can be made of Fe.

Figure 4:
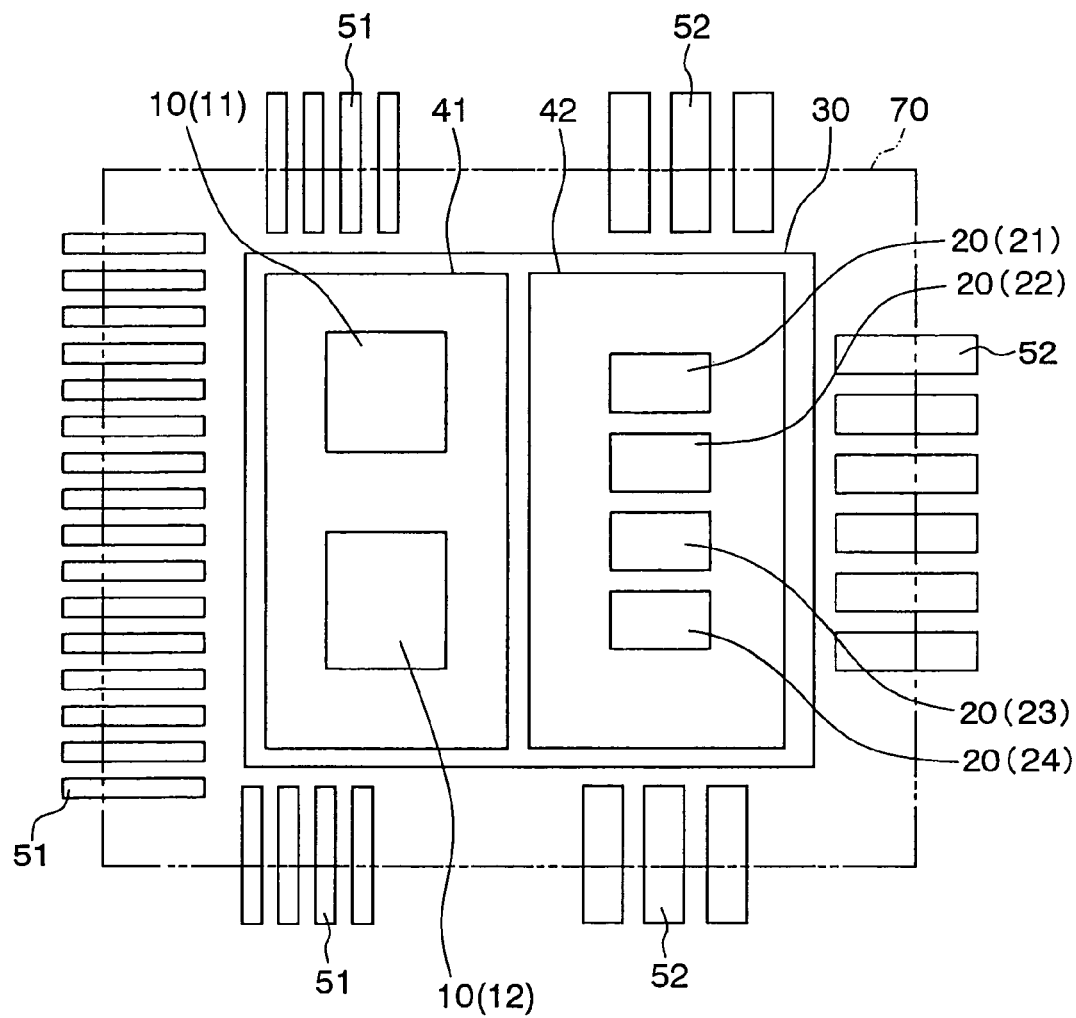
FIG. 4 is a plan view showing a semiconductor device according to a second modification of the first embodiment.

Further, FIG. 4 is a schematic plan view to show a second modification in which a plan arrangement construction is modified in the semiconductor device of this embodiment. The semiconductor device shown in FIG. 4 adopts a plan construction of taking a balance of thermal stress in the direction of plan of the device, that is, in the direction of plan of the heat sink 30 into consideration.

In FIG. 4, there is provided a construction in which the first wiring board 41 and the second wiring board 42 are equal in plan size to each other and in which lead parts such as signal terminals 51 and current terminals 52 are provided on the respective four sides of the rectangular heat sink 30. This construction improves the symmetry of construction in the semiconductor device and hence offers an excellent balance of thermal stress.

Further, it is preferable that the semiconductor device of this embodiment shown in FIG. 1A is so constructed as to be provided with a plurality of power elements 20 that include relay elements 20 formed of semiconductor. In this regard, in the case of adopting such a construction, at least four relay elements formed of semiconductor are mounted on the semiconductor device.

In a conventional device, relay elements of discrete elements are mounted on a printed board or the like, which results in considerably enlarging the size of the device. However, by making the relay elements of semiconductor as shown in this embodiment, the relay elements are not mounted on the printed boards or the like but can be mounted in one semiconductor device 100 along with the control element 10, which results in downsizing the device as a whole. Further, forming the relay elements of semiconductor presents a problem of increasing temperature by heat generation. However, adopting the structure described in this embodiment can realize suitable heat radiation characteristics. Therefore, it is possible to realize a structure in which the relay element 20 formed of semiconductor and the control element 10 are mounted in the semiconductor device 100.

Figure 10:
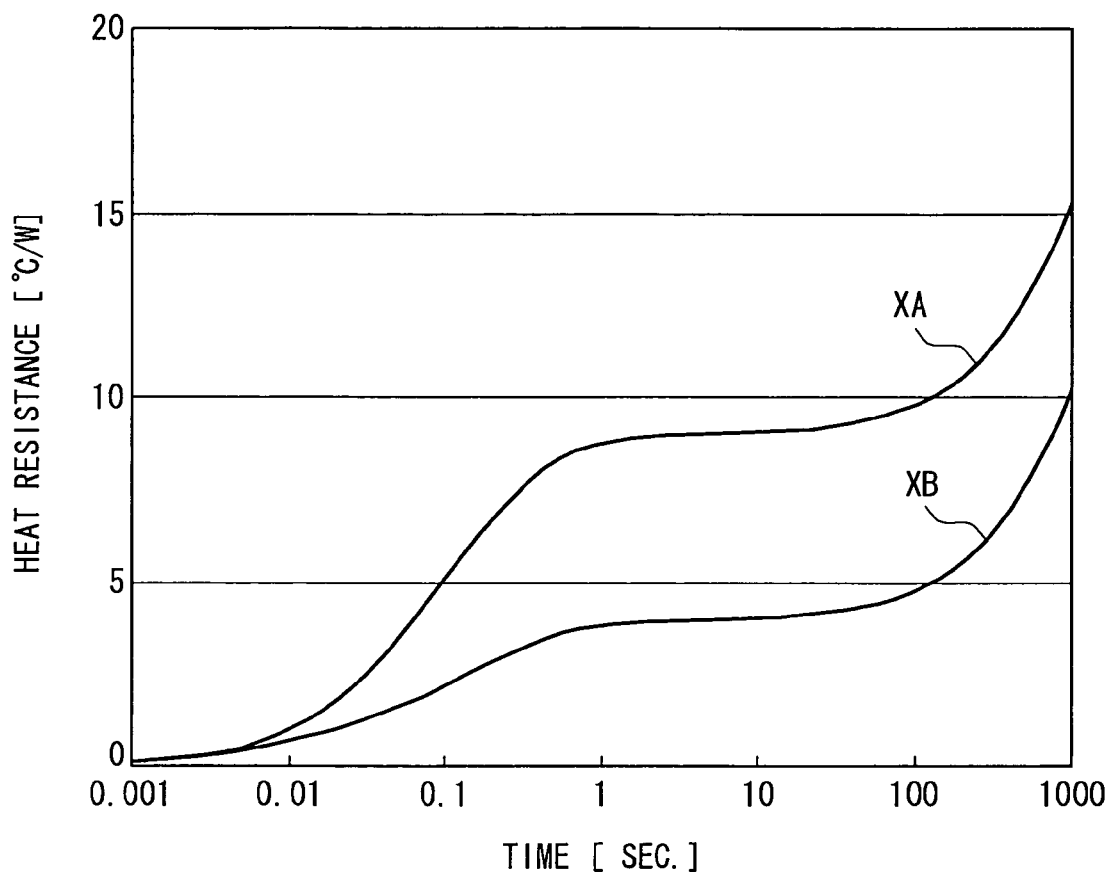
FIG. 10 is a graph showing a relationship between a time and a heat resistance in different adhesion thicknesses, according to the first embodiment.

Further, in the semiconductor device of this embodiment shown in FIG. 1A, the second electronic element 20 and the second wiring board 42 are bonded to each other by an adhesive (referred to as bonding member in the invention) and it is preferable that the thickness of this adhesive is 100 μm or less. With this structure, as shown in FIG. 10, heat generated by the relay element 20 formed of semiconductor can be suitably radiated. In FIG. 10, a curve XA represents the adhesive having a thickness of 100 μm, and a curve XB represents the adhesive having a thickness of 10 μm. FIG. 10 shows a relationship between a heat resistance and a time.

Figure 7A:
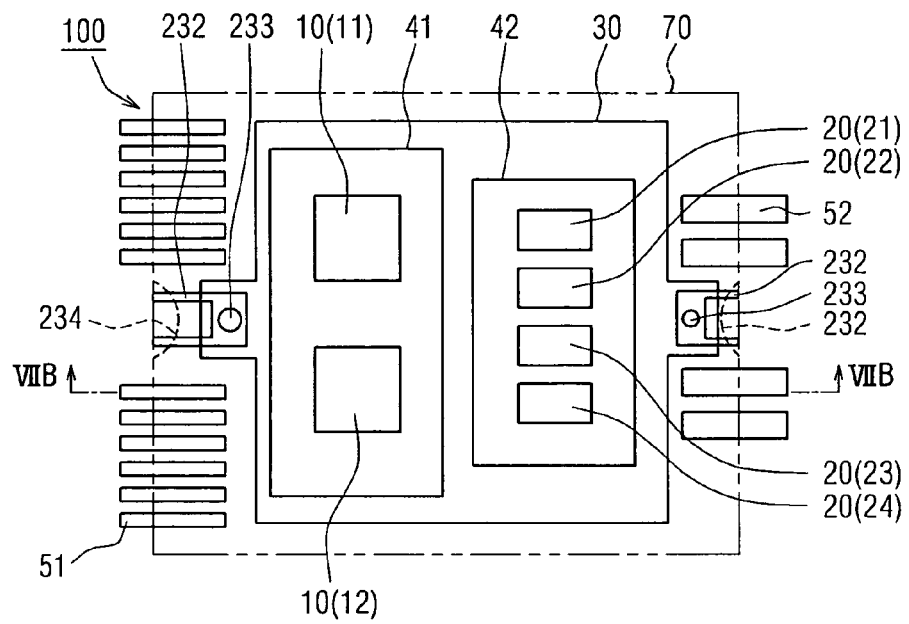
FIG. 7A is a plan view showing a semiconductor device according to a third modification of the first embodiment.
Figure 7B:
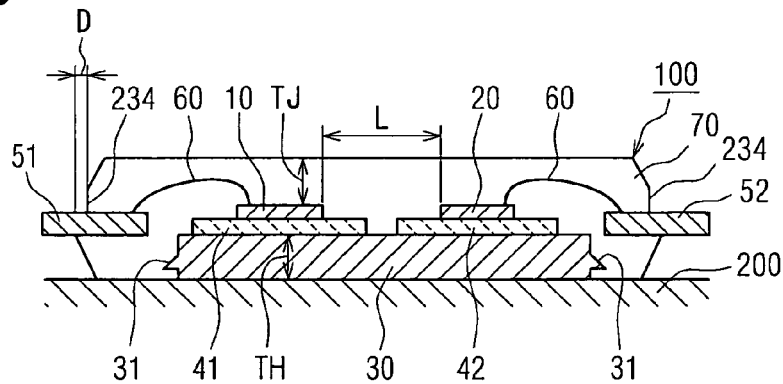
FIG. 7B is a cross sectional view showing the device taken along line VIIB-VIIB in FIG. 7B.
Figure 7C:
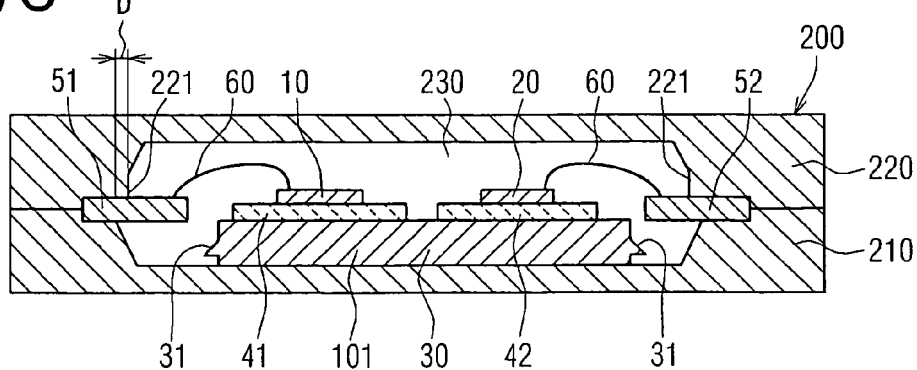
FIG. 7C is a cross sectional view explaining a molding process in a method for manufacturing the device according to the third modification.

Further, FIG. 7A and FIG. 7B are schematic illustrations to show a third modification of construction in the semiconductor device of this embodiment. FIG. 7C is an illustration to show a molding step of molding resin in a method of manufacturing a semiconductor device of this embodiment.

As shown in FIG. 7A, the heat sink 30 and a suspending lead 232 are bonded to each other at a bonding part 233. Here, the suspending lead 232 is caulked on the top surface of the heat sink 30 to form the bonding part 233. To be specific, the suspending lead 232 is fixedly caulked by a method of fitting the hole of the suspending lead 232 on a protrusion formed on the top surface of the heat sink 30 and then caulking the protrusion.

As shown in FIG. 7B, in an area around the suspending lead 232 of the end portion of the molding resin, a portion located directly above the suspending lead 232 is constructed as a retracting portion 234 retracted from a portion directly below the suspending portion 232. In this regard, a retracting size d of this retracting portion 234 can be made, for example, equal to or larger than the thickness (for example, approximately several tenths of a millimeter) of the suspending lead 232 and, preferably, within approximately 1 mm, although not limited to this value.

A method of manufacturing this semiconductor device 100 will be described by the use of FIG. 7C.

First, the first wiring board 41, the second wiring board 42, the control elements 10, and the power MOS elements 20 are mounted on the top surface of the heat sink 30 and the respective terminals 51, 52 are provided around the control elements 10 and the power MOS elements 20 and the suspending leads 232 are bonded to the heat sink 30 by caulking or the like. Further, the control elements 10 and the power MOS elements 20 are electrically connected to the terminals 51, 52 by boding wires 60 or the like, respectively.

In this manner, an integrated part 1301 into which the heat sink 30, the control elements 10, the power MOS elements 20 and the respective terminals 51, 52 are integrated is placed in a case, i.e., a mold case 201. Here, as for the mold case 201, when a bottom mold 210 is mated with a top mold 220, the mold case 201 has a cavity 230 corresponding to the shape of the molding resin 70 formed therein. To be specific, the integrated part 1301 is placed on the bottom mold 210 of the mold case 201 and then the top mold 220 is mated with the bottom mold 210. With this, the integrated part 101 is placed in the cavity 230 of the mold case 201.

Next, in the step of molding the molding resin 70, only the suspending lead 232 is pressed by the top mold 210 of the mold case 201 to press the heat sink 30 on the bottom mold 210 of the mold case 201.

Here, in this embodiment, a portion for pressing the suspending lead 232 by the top mold 220, that is, a pressing portion 221 is constructed as a protruding portion 221 in which a portion of the top mold 220 protrudes into the cavity 230 with respect to the bottom mold 210.

A protruding size D (see FIG. 7B) of this protruding portion 221 corresponds to the retracting size d of the retracting portion 234 shown in FIG. 7A and is equal to or larger than, for example, the thickness (for example, approximately several tenths of a millimeter) of the suspending lead 232 and, preferably, can be within approximately 1 mm.

While this protruding portion 221 presses the suspending lead 232 from above in a state where the integrated part 101 is placed in the mold case 201, at this time, the bottom of the suspending lead 232 is not supported, so that the suspending lead 232 is slightly bent and the suspending lead 232 and, by extension, the integrated part 101 is pressed down.

For this reason, the bottom surface of the heat sink 30 in the integrated part 101 is pressed on the bottom mold 210 of the mold case 201, thereby being put into close contact with the bottom mold 210. When the molding resin 70 in a melting state is poured and filled into the cavity 230 in this state, the integrated part 101 is molded by the molding resin 70 in such a way as to expose the bottom surface of the heat sink 30.

Thereafter, the molding resin 70 is cooled and solidified and then the integrated part 101 molded by the molding resin 70 is taken out of the mold case 201. In this manner, the semiconductor device 100 can be completed.

As described above, according to this manufacturing method, a work to be molded by resin is fixed in the mold case 201 and hence a specific unit such as suction unit is not required, which does not result in cost increase. Therefore, according to this embodiment, it is possible to suitably expose the bottom surface of the heat sink 30 from the molding resin 70 and, at the same time, to reduce dead space over the top surface of the heat sink 30 or the top surfaces of the first wiring board 41 and the second wiring board 42.

Figure 8:
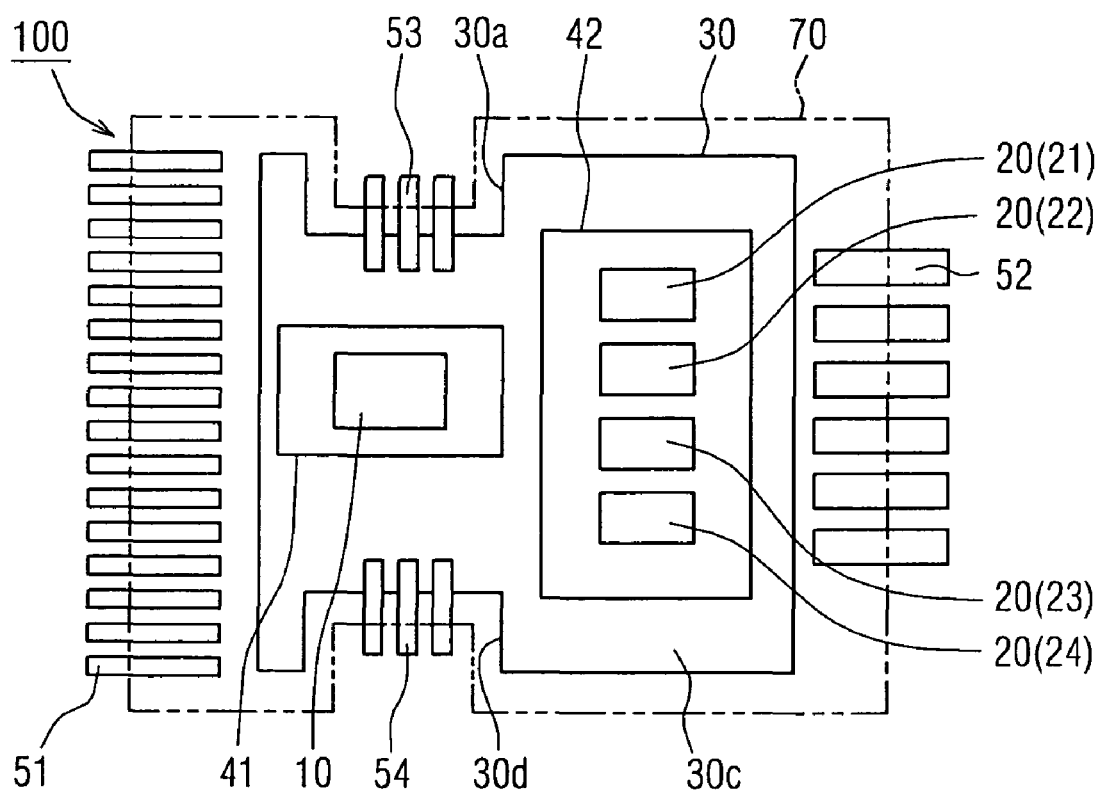
FIG. 8 is a plan view showing a semiconductor device according to a fourth modification of the first embodiment.

Further, FIG. 8 is a schematic plan view to show a fourth modification in which a plan arrangement construction is modified in the semiconductor device of this embodiment.

As shown in FIG. 8, a plurality of inspection terminals 53, 54 are mounted on the mounting surface 30a of the heat sink 30. These inspection terminals 53, 54 are terminals used for inspecting the initial defects of the control element 10 and the power MOS elements 20. When the product is used, the inspection terminals 53, 54 are not necessary. Hence, after the inspection is finished, the inspection terminals 53, 54 are cut off to an extent in which they do not interfere with mounting the product. Here, FIG. 8 shows a state where the inspection terminals 53, 54 are cut off.

Here, in this embodiment, the signal terminals 51, 52 are so arranged as to extend in a direction parallel to the mounting surface 30c of the heat sink 30 and the inspection terminals 53, 54 are so arranged as to extend in a direction perpendicular to the direction in which the signal terminals 51, 52 extend.

Usually, the signal terminals 51, 52 are terminals working with high voltage (12 V) and the inspection terminals 53, 54 are terminals working with low voltage (5 V) and susceptible to electric noises from the outside.

Hence, according to this embodiment, the inspection terminals 53, 54 are so arranged as to extend in a direction perpendicular to the direction in which the signal terminals 51, 52 extend, so that even when the device is not changed and enlarged in shape, the inspection terminals 53, 54 can be provided away from the signal terminals 51, 52. Therefore, it is possible to prevent the effect of electronic noises to the inspection terminals 53, 54.

Further, in this embodiment, a depressed portion 30d is formed in a portion of the resin 70 where the inspection terminals 53, 54 are arranged and the inspection terminals 53, 54 are arranged in the depth of this depressed portion 30d. With this arrangement, the peripheral portion of the inspection terminals 53, 54 can be covered with the resin 70, so that it is possible to protect the inspection terminals 53, 54, which become unnecessary when the produce is used, from electronic noises from the outside and the like.

Further, in this embodiment, it is possible to make the semiconductor device of the type in which the first signal terminals 51 are arranged at one of end portions opposite to each other of the resin 70 and in which the second signal terminals 52 are arranged at the other of the end portions and in which the first and second signal terminals 51, 52 protrude in the same one direction.

Further, in this embodiment, it is possible to make the semiconductor device of the type in which the first inspection terminal 53 is arranged at one of end portions opposite to each other of the resin 70 and in which the second inspection terminal 54 is arranged at the other of the end portions and in which the first and second inspection terminals 53, 54 protrude in the same direction.

Figure 11A:
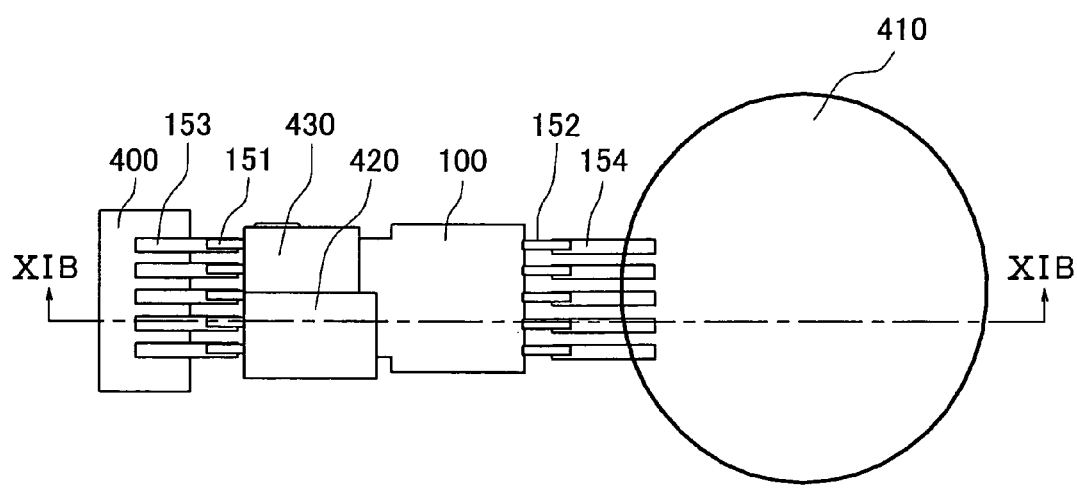
FIG. 11A is a plan view showing a mounting construction of the semiconductor device according to the first embodiment.
Figure 11B:
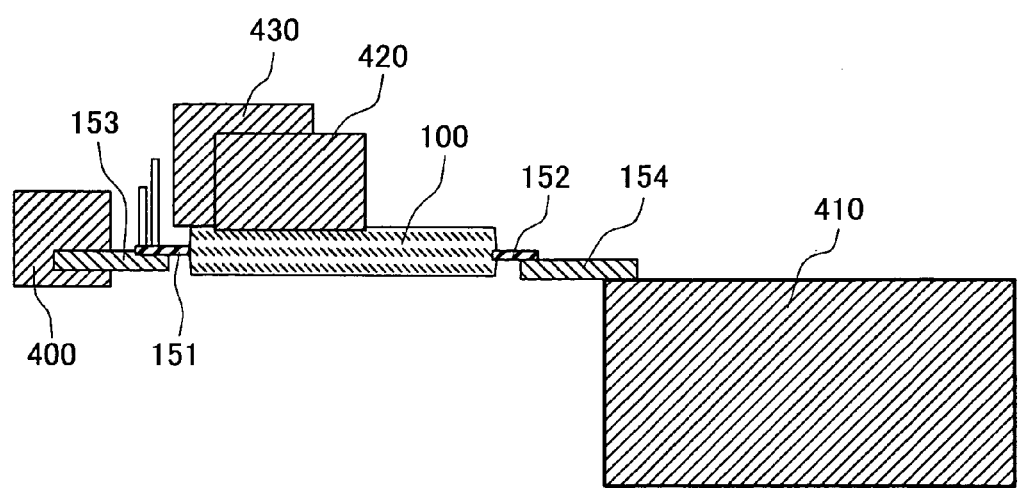
FIG. 11B is a cross sectional view showing the construction taken along line XIB-XIB in FIG. 11A.

Further, FIG. 11A and FIG. 11B are schematic illustrations to show the mounting structure of this embodiment. As shown in FIG. 11A and FIG. 11B, the above-described semiconductor device 100 is electrically connected by welding via the connector side terminals 151 of the semiconductor device 100 to terminals 153 provided in a connector 401 connected to the outside. Further, the semiconductor device 100 is electrically connected by welding via the motor side terminals 152 of the semiconductor device 100 to terminals 154 provided in a motor driving body 410 driven by the first electronic element 10 and the second electronic element 20.

In the mounting structure like this, it is preferable that a capacitor 420 that is connected between the connector 401 and the first electronic element 10 and the second electronic element 20 and removes noises from the outside is directly mounted on the surface of the resin 70 in the semiconductor device 100. Further, in addition to the capacitor 420, elements such as coil 430 may be directly mounted on the surface of the resin 70 in the semiconductor device 100.

Figure 9A:
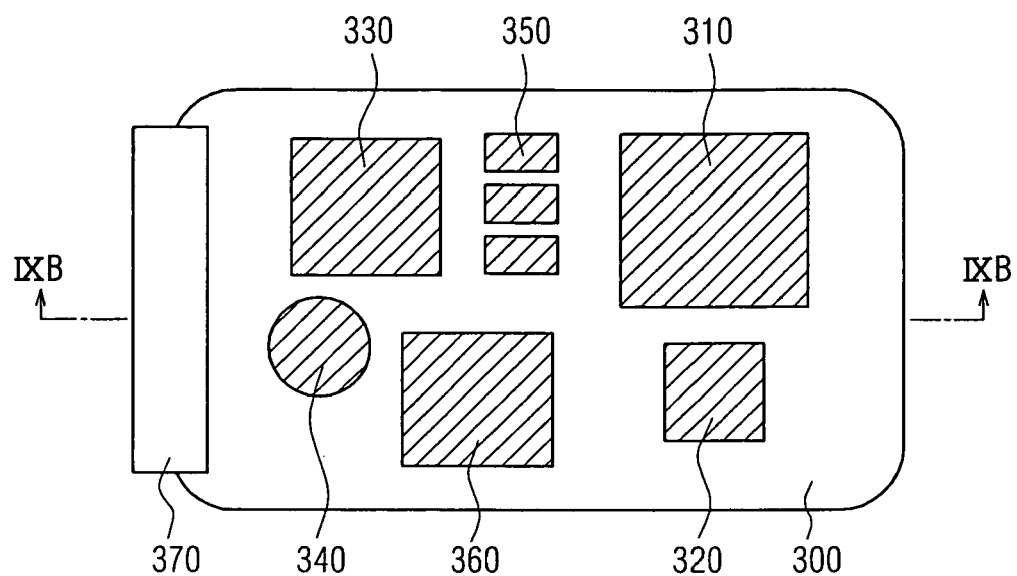
FIG. 9A is a plan view showing a mounting construction of a semiconductor device according to a comparison of the first embodiment.
Figure 9B:
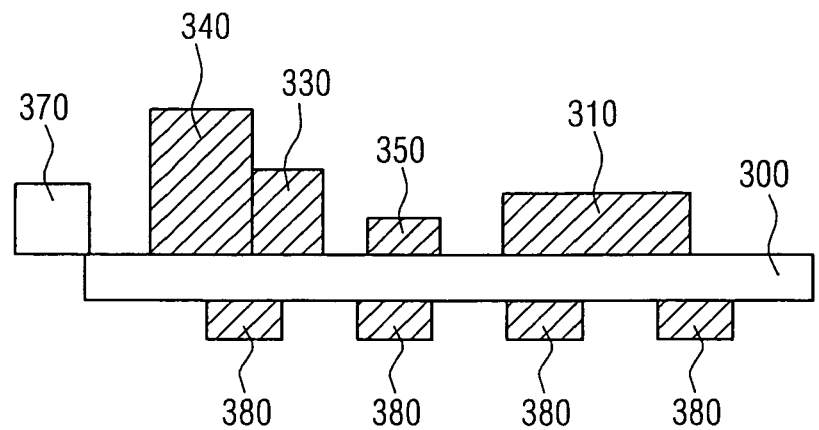
FIG. 9B is a cross sectional view showing the construction taken along line IXB-IXB in FIG. 9A.

As shown in FIGS. 9A and 9B which schematically show a mounting structure in the related art, a control element 310 and a power MOS element 320 in the related art are mounted on a printed board 301 along with a relay element 330, an electrolytic capacitor element 340, a capacitor element 350, a coil 360, and a chip resistance 380, which are discreet elements. Further, a connector 370 is arranged in a portion on this printed board 301 and is electrically connected to a driving body (not shown) such as motor by a wire harness or the like.

In contrast to this mounting structure in the related art, according to the mounting structure of this embodiment, the relay elements 20 are formed of semiconductor and hence are received in the semiconductor device 100 and the capacitor 420 and the coil 430 are directly mounted on the surface of the resin 70 in the semiconductor device 100. Therefore, the device can be reduced in size as a whole.

In this regard, in the above-described embodiment, the first electronic element is a control element and the second electronic element 20 is a power element but, in the respective electronic elements in the invention, it is essential only that the second electronic element has larger current passed therethrough as compared with the first electronic element to generate large heat and it is not intended to limit the respective electronic elements in the invention to the control element and the power element.

Further, the semiconductor device shown in the embodiment described above adopts a device construction in which the device is molded by the resin 70, but a construction can be adopted in which the device is not molded by the resin. For example, in the semiconductor device 100 shown in FIGS. 1A and 1B, a construction may be adopted in which the above-described resin 70 is omitted.

To sum up, the first embodiment of the present invention is a semiconductor device that is provided with the first electronic element and the second electronic element that has larger current passed therethrough, as compared with the first electronic element, to generate large heat, and is characterized by adopting a construction in which the first electronic element and the second electronic element are mounted on respective wiring boards separated from each other and in which the respective wiring boards are so mounted on the heat sink as to be separated from each other. The invention can be modified as appropriate in the other parts.

Second Embodiment

Figure 12A:
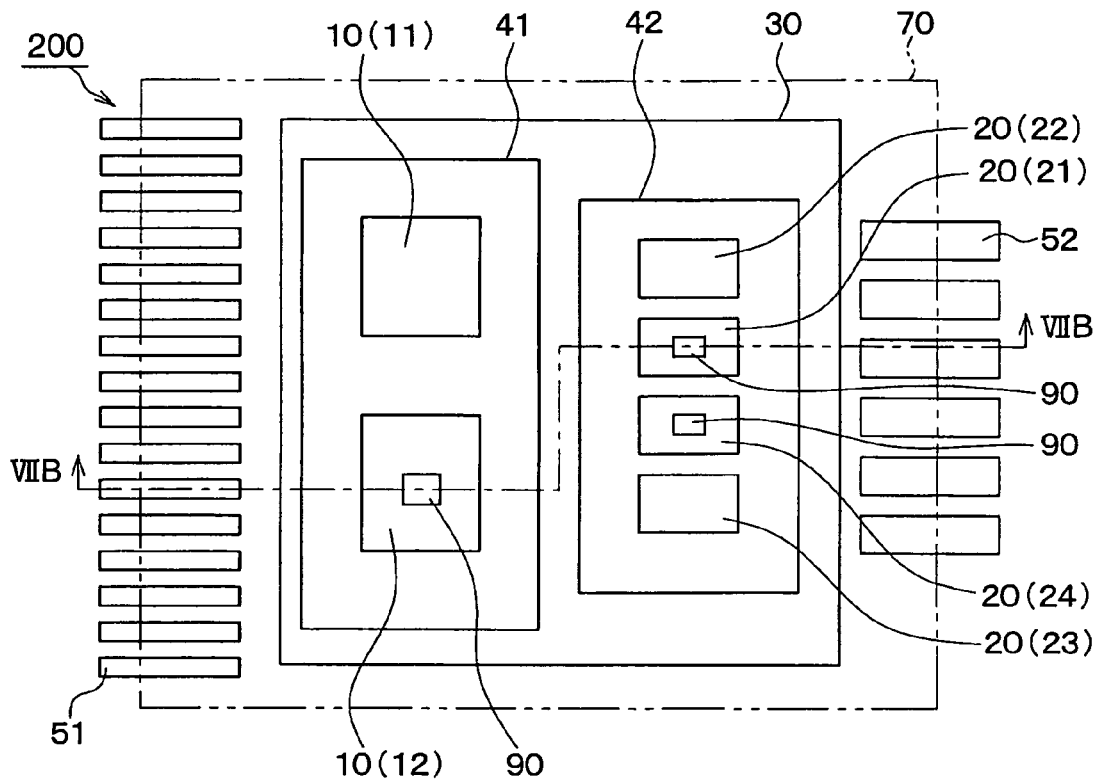
FIG. 12A is a plan view showing a semiconductor device according to a second embodiment of the present invention.
Figure 12B:
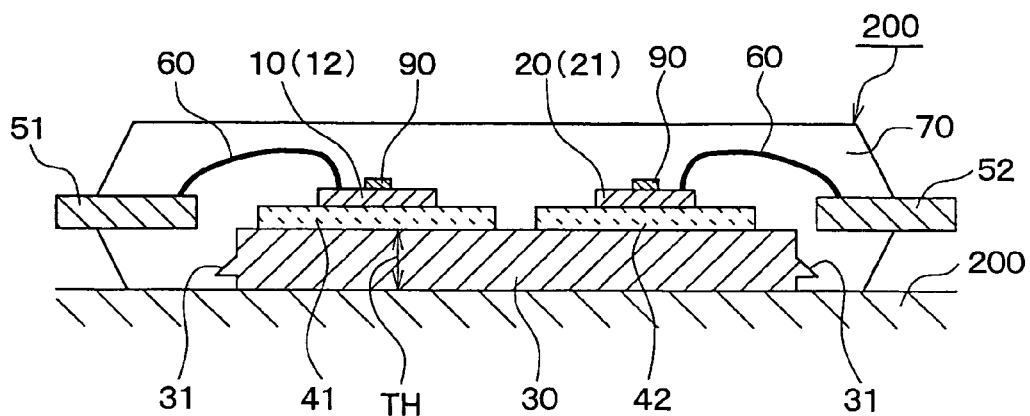
FIG. 12B is a cross sectional view showing the device taken along line XIIB-XIIB in FIG. 12A.

FIGS. 12A and 12B are illustrations to show the schematic construction of the semiconductor device 200 provided with the first electronic element 10 and the second electronic element 20 in accordance with a second embodiment of the present invention and FIG. 12A is a plan view and FIG. 12B is a sectional view along a line XIIB-XIIB in FIG. 12A.

Figure 13A:
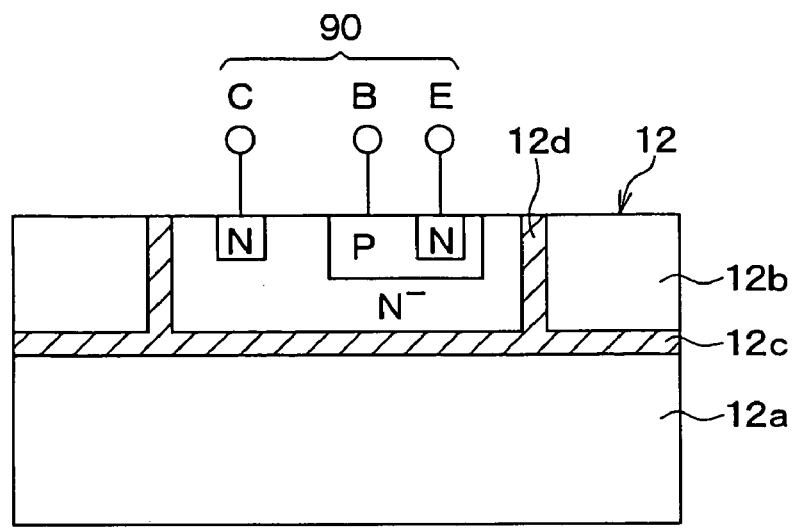
FIG. 13A is a cross sectional view showing a temperature sensing diode of a control element in the device.
Figure 13B:
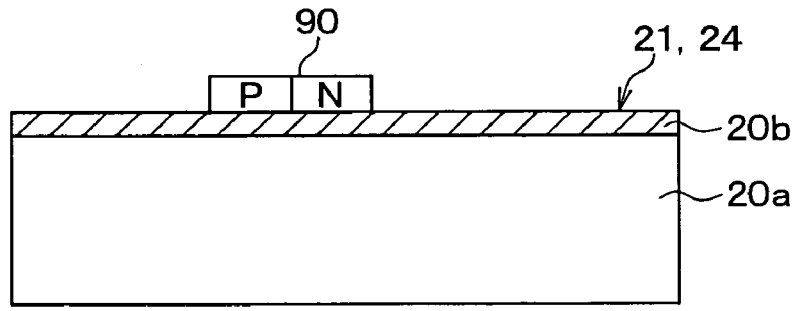
FIG. 13B is a cross sectional view showing a temperature sensing diode of a power MOS transistor in the device, according to the second embodiment.

Further, FIG. 13A is a schematic sectional views of a temperature sensing diode 90 formed in the control IC 12 in the semiconductor device 200 shown in FIGS. 12A and 12B, and FIG. 13B is a schematic sectional view of a temperature sensing diode 90 formed in the power MOS elements 21, 24 in the semiconductor device 200 shown in FIGS. 12A and 12B.

Also in this embodiment, there is provided a semiconductor device provided with the control element 10 and the power element 20 controlled by the control element 10 and characterized in that: the device is provided with the heat sink 30, the first wiring board 41 and the second wiring board 42 which are mounted on one surface of the heat sink 30 and are separated from each other; the control element 10 is mounted on the first wiring board 41; and the power element 20 is mounted on the second wiring board 42.

According to this construction, as is the case with the first embodiment described above, even when the distance between the control element 10 and the power element 20 is not so large, it is possible to prevent heat transfer from the power element 20 to the control element 10 and hence to realize suitable heat radiation while preventing the upsizing of the device as much as possible.

Further, also in this embodiment, the power element 20 is adopted as the second electronic element and the control element 10 for controlling the power element 20 is adopted as the first electronic element, so that it is possible to protect the control element 10 having a lower operation guarantee temperature on high temperature side as compared with the power element 20 from the transient large heat generated by the power element 20.

Further, also in this embodiment, it is preferable that the heat sink 30 is constructed of iron-based metal. With this, the heat sink 30 can have a structure to reduce thermal conduction and to increase heat capacity, which provides a construction in which the heat of the power element 20 is hard to transfer to the control element 10.

Further, also in this embodiment, as is the case with the first embodiment described above, of the heat sink 30, the bottom surface opposite to the top surface thereof, on which both of the electronic elements 10, 20 and both of the wiring boards 41, 42 are mounted, is exposed from the resin 70. Hence, heat transmitted to the heat sink 30 can be suitably radiated to the outside case 201.

Further, also in this embodiment, as countermeasures to prevent the separation of resin 70 caused by heat cycle, it is preferable that the coefficient of thermal expansion $\alpha(\times 10^{-6}/°C.)$ of the resin 70 is equal to or a little smaller than that of Fe.

Further, as is the case with the first embodiment described above, it is preferable that the first wiring board 41 and the second wiring board 42 are alumina boards made of alumina the coefficient of thermal expansion $\alpha$ of which is between those of Si and Fe.

Further, also in this embodiment, it is preferable that the glass transition temperature (Tg point) of the resin 70 is made higher than the Si junction temperature Tjmax described above and that the heat sink 30 is provided with the protruding portion 31 and that the thickness tj of the resin 70 is substantially equal to the thickness th of the heat sink 30 (see FIG. 1B).

Further, the construction can be applied to this embodiment in which four power MOS elements 21 to 24 are arranged in such a manner that the neighboring power elements are not brought into ON state at the same time. Still further, various examples of heat sink 30 shown in the first embodiment described above can be applied to this embodiment.

In this manner, also in this embodiment, there is provided the semiconductor device 200 characterized by the same various points as the first embodiment described above. Further, this embodiment is further characterized by the following points.

The semiconductor device 200 of this embodiment, as shown in FIGS. 12A and 12B and FIGS. 13A and 13B, is characterized in that a temperature sensing diode 90 is built in each of the control IC 12 and the power MOS elements 21, 24 which are made of semiconductor substrate. The temperature diode 90 is a publicly known diode which is used in a state where a predetermined current is passed and in which the voltage of diode decreases when temperature increases.

The control IC 12, as shown in FIG. 13A, has an SOI (silicon in insulator) construction of sandwiching an oxide film 15 between two Si layers 12a, 12b. Here, various devices (not shown) constructing the control IC 12 are formed in the top Si layer 12b.

In this manner, the control IC 12 adopts the SOI construction. In the construction of a control IC mounted in a vehicle and having a battery voltage applied thereto, a case where overvoltage is applied to the control IC or a case where a negative voltage of 0 V or less is applied to the control IC might be thought. For this reason, the SOI construction is effective for the control IC.

Here, as shown in FIG. 13A, in the control IC 12, a trench oxide film 12d of an oxide film formed in a trench is formed in the top Si layer 12b. The temperature sensing diode 90 provided in the control IC 12 is formed in such a region of the top Si layer 12b that is separated by the oxide film 15 and the trench oxide film 12d.

As for the temperature sensing diode 90 of the control IC 12, an example of an NPN transistor is shown in which terminals of collector C and base B connected to each other and forms a diode for use with the terminal of emitter E.

In the control IC 12 made of semiconductor like this, the temperature sensing diode 90 is electrically separated from the other devices in the control IC 12 via the oxide films 15, 12d.

This construction eliminates the parasitic operation of the temperature sensing diode 90 and prevents the malfunction of the temperature sensing diode 90 at high temperatures and hence can realize temperature sensing characteristics of high accuracy. In addition, this construction can preferably reduce the effect of the temperature sensing diode 90 to the other devices in the control IC 12.

On the other hand, as shown in FIG. 13B, in the power MOS elements 21, 24, a device (not shown) is formed on a silicon substrate 20a constructing these power MOS elements 21, 24 and an oxide film 20b is formed over this device.

The temperature sensing diode 90 provided in the power MOS elements 21, 24 is a polysilicon diode that is formed on the oxide film 20b of this device and is formed of P-type polysilicon and N-type polysilicon.

In this manner, in the power MOS elements 21, 24 made of semiconductor, the temperature sensing diode 90 is electrically separated from the other devices in the power MOS elements 21, 24 via the oxide film 20b.

This construction eliminates the parasitic operation of the temperature sensing diode 90 and prevents the malfunction of the temperature sensing diode 90 at high temperatures and hence can realize temperature sensing characteristics of high accuracy. In addition, this construction can preferably reduce the effect of the temperature sensing diode 90 to the other devices in the control IC 12.

For example, even when a voltage close to dielectric strength is applied to the temperature sensing diodes 90 of the power MOS elements 21, 24 at 150° C. when a large current of several tens ampere is passed, the temperature sensing diodes 90 do not cause malfunction. In other words, the temperature sensing diode 90 can be operated to a high temperature just before a temperature at which the temperature sensing diode 90 is broken by heat. Hence, when the current can be stopped at that time, controllability can be improved. When the operation can be guaranteed to 175° C., the current may be stopped at 175° C.

In this regard, also the temperature sensing diode 90 of the control IC 12 can be made in the form of polysilicon diode like the temperature sensing diodes 90 of the power MOS elements 21, 24. Further, the temperature sensing diode 90 of the power MOS element may be provided in the power MOS elements 22, 23.

In this manner, the semiconductor device 200 of this embodiment has a mounting construction in which the wiring boards 41, 42 are separated in position and in temperature from each other, so that the temperatures of the respective elements 12, 21, 24 can be detected with high accuracy. Further, since the temperature sensing diodes 90 are built in the elements 12, 21, 24, temperature can be detected without causing delay in time by thermal conduction and the like.

Figure 14:
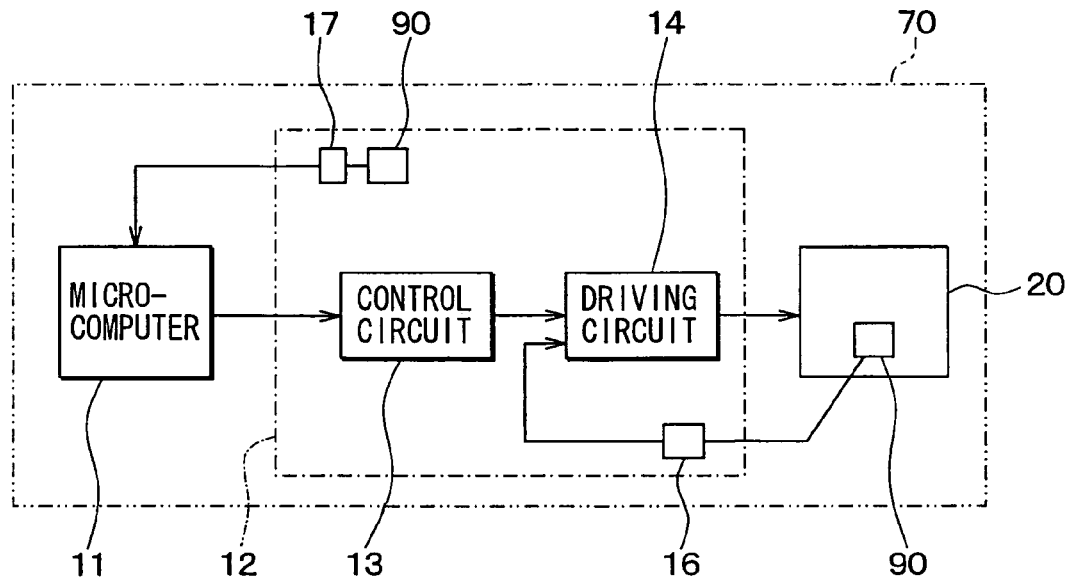
FIG. 14 is a circuit diagram explaining a temperature sensing signal of the device according to the second embodiment.

FIG. 14 is a block diagram to show the flow of control in which attention is focused on the signal of the temperature sensing diode 90, that is, a temperature sensing signal in the semiconductor device 200 of this embodiment.

A temperature sensing signal in the power MOS element 20 (21, 23) controls the gate of the power MOS element 20 via the driving circuit 14 in the control IC 12 and detects overheat and stops current immediately. In other words, the power MOS element 20 can be operated to a heating limit by the temperature sensing signal from the temperature sensing diode 90 of the power MOS element 20.

Further, a temperature sensing signal in the control IC 12 is such that is sent to the microcomputer 11 and controls the gate of the power MOS element 20 via the control circuit 13 and the driving circuit in the control IC 12.

Here, it is thought that the current of the power MOS element 20 is limited by the temperature sensing signal in the control IC 12 and is stopped (that is, turned off) in one instance but basically, an operation of reducing heat generation is performed. Further, the operation clock of the microcomputer 11 can be decreased to reduce heat generation and information can be sent to a master ECU via LIN communication to perform overheat protection control of the whole vehicle.

In other words, it is possible to prevent heat generation by limiting the current of the power MOS element 20 by the temperature sensing signal from the temperature sensing diode 90 of the control IC 12 and, as a result, to reduce the temperatures of the control IC 12 and the microcomputer 11.

The flow of this temperature sensing signal will be described more specifically with the reference to FIG. 15 and FIG. 16.

Figure 15:
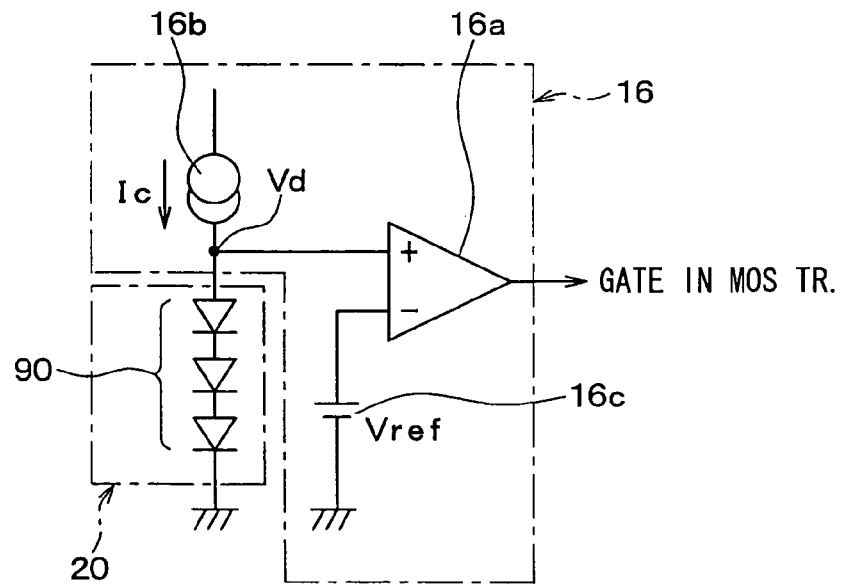
FIG. 15 is a circuit diagram showing a control circuit of a temperature sensing signal in a power MOS transistor, according to a first modification of the second embodiment.
Figure 16:
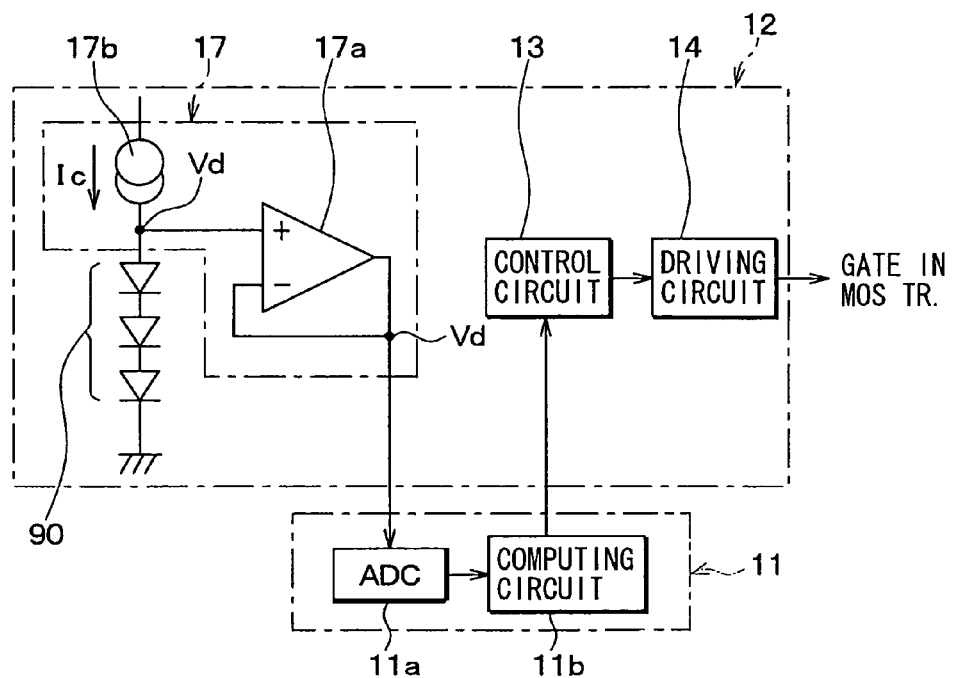
FIG. 16 is a circuit diagram showing a control circuit of a temperature sensing signal in a control IC, according to a second modification of the second embodiment.

FIG. 15 is an illustration to show one example of control circuit of the temperature sensing signal in the power MOS element 20 and FIG. 16 is an illustration to show an example of control circuit of the temperature sensing signal in the control IC 12.

In FIG. 15 is shown one example of a control circuit constructed of the temperature sensing diode 90 in the power MOS element 20 and a connection part 16 (see FIG. 14) in the control IC 12 connected to this temperature sensing diode 90.

As shown in FIG. 15, this connection part 16 is constructed of a comparator 16a, a constant-current circuit 16b, and a reference voltage 16c. The temperature sensing diode 90 of the power MOS element 20 is electrically connected to the input portions of the constant-current circuit 16b and the comparator 16a.

While the temperature sensing diode 90 is improved in sensitivity as the diodes connected in series increases in number, in this example, three diodes are connected in series and a constant current Ic is supplied to the diodes by the constant-current circuit 16b. With this, a diode voltage Vd linear with respect to temperature can be produced.

The voltage Vd as this temperature sensing signal is applied to the input portion (positive side) of the comparator 16a and when the voltage Vd is equal to or smaller than a predetermined reference voltage Vref, the gate of the power MOS element 20 is immediately turned off via the driving circuit 14. Here, the reference voltage Vref can be made voltage corresponding to, for example, 150° C.

Further, in FIG. 16 is shown one example of a control circuit constructed of the temperature sensing diode 90 in the control IC 12 and a connection part 17 (see FIG. 14) in the control IC 12 connected to this temperature sensing diode 90.

As shown in FIG. 16, this connection part 17 is constructed of an operational amplifier 17a and a constant-current circuit 17b. The temperature sensing diode 90 of the control IC 12 is electrically connected to the input portions of the constant-current circuit 17b and the operational amplifier 17a and the output portion of the operational amplifier 17a is connected to the AD conversion part 11a of the microcomputer 11.

This AD conversion part (ADC: analog-digital converter) 11a converts an analog signal to a digital signal. Further, in this example, three temperature sensing diodes 90 are connected in series and a constant current Ic is supplied to the temperature sensing diodes 90 from the constant-current circuit 17b. With this, a diode voltage Vd linear with respect to temperature can be produced.

The voltage of this temperature sensing diode 90 is impedance-converted to voltage Vd as a temperature sensing signal by the operational amplifier 17a and the voltage Vd is sent to the AD conversion part 11a. Then, this signal is converted to a digital signal by the AD conversion part 11a and is sent to a computation part 11b and the level of the signal is determined by the computation part 11b.

A signal made by the computation part 11b controls the gate of the power MOS element 20 via the control circuit 13 and the driving circuit 14 in the control IC 12. This control by the-temperature sensing signal of the control IC 12 not only turns off the power MOS element 20, as described above, but also sometimes brings the power MOS element 20 into a low power consumption mode.

For example, when the temperature sensing diode 90 of the control IC 12 becomes approximately 100° C., the gate voltage of the power MOS element 20 is decreased and a drain current is increased to decrease on-voltage, to limit current, and to decrease the duty of PWM. Further, as described above, clock frequency in the microcomputer 11 is decreased and writing to a memory is limited.

In this manner, a semiconductor device 110 characterized in that the control IC 12 of the first electronic element 10 and the power MOS element 20 of the second electronic element 20 are provided with the temperature sensing diodes 90, respectively, and in that the control IC 12 and the power MOS element 20 have their operations controlled in response to temperature by these temperature sensing diodes 90 is provided as a semiconductor device unique to this embodiment.

According to this semiconductor device 200, an abnormal state of high temperature can be detected by the temperature sensing diode 90 and the operation of the control IC 12 and the power MOS element 20 can be controlled on the basis of a signal from the temperature sensing diode 90. Accordingly, the semiconductor device 200 can be thermally protected in an instant from abnormal high temperature.

Here, in the semiconductor device 200 of this embodiment, as shown in FIGS. 13A and 13B, the control IC 12 and the power MOS element 20 (21, 24) are made of semiconductor and the temperature sensing diodes 90 are electrically separated from the other devices in the respective elements 12, 20 via the oxide films 15, 12d, 20b in the elements 12, 20.

This construction eliminates the parasitic operation of the temperature sensing diode 90 and prevents the malfunction of the temperature sensing diode 90 at high temperatures and hence can realize temperature sensing characteristics of high accuracy. In addition, this construction can preferably reduce the effect of the temperature sensing diode 90 to the other devices in the respective electronic elements 12, 20.

In this regard, in FIG. 16, the AD conversion part 11a and the computation part 11b for the temperature sensing signal are provided in the microcomputer 11, but the AD conversion part 11a and the computation part 11b for the temperature sensing signal may be provided in the control IC 12.

However, since elements are patterned more finely in the microcomputer 11 than in the control IC 12 in many cases and software processing can be easily performed in the microcomputer 11, the AD conversion part 11a and the computation part 11b for the temperature sensing signal are provided in the microcomputer 11.

(Modifications)

In the example shown in FIGS. 12A and 12B, the control IC 12 and the power MOS element 20 are provided with the temperature sensing diodes 90, respectively, and the control IC 12 and the power MOS element 20 have their operations controlled respectively in response to temperature by the temperature sensing diodes 90. However, in addition, the microcomputer 11 of the first electronic element 10 may be also provided with the temperature sensing diode 90.

Figure 17:
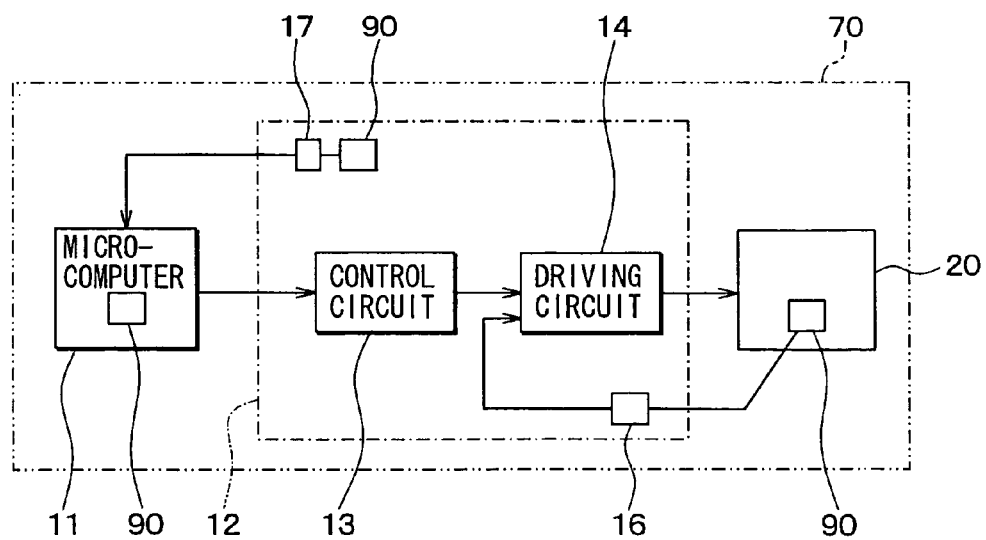
FIG. 17 is a circuit diagram explaining a temperature sensing signal of a semiconductor device according to a third modification of the second embodiment.

FIG. 17 is a block diagram to show the flow of control in which attention is focused on the signal of the temperature sensing diode 90, that is, a temperature sensing signal in the semiconductor device as a modification of this embodiment.

In this example, the flow of control by the temperature sensing signal in the power MOS element 20 (21, 23) and the flow of control by the temperature sensing signal in the control IC 12 are the same as shown in FIG. 14.

Here, the temperature sensing diode 90 provided in the microcomputer 11 is constructed as a part of circuit in the microcomputer 11. This temperature sensing diode 90 can be the above-described polysilicon diode.

With this, as is the case with the temperature sensing diode 90 of the control IC 12 and the temperature sensing diode 90 of the power MOS element 20, the temperature sensing diode 90 in the microcomputer 11 can be electrically separated from the other devices via an oxide film.

Further, this modification sets the temperature sensing diode 90 parasitically free from the other devices in the microcomputer 11 to eliminate the parasitic operation of the temperature sensing diode 90 to prevent the temperature sensing diode 90 from causing malfunction at high temperatures. Consequently, temperature sensing characteristics of high accuracy can be realized and the effect of the temperature sensing diode 90 to the other devices can be reduced.

This construction is preferable in view of the fact that even when the microcomputer 11 is supplied with electric power via the control IC 12, there is a possibility that malfunction might be caused even by weak parasitic operation.

According to the temperature sensing signal in this microcomputer 11, for example, when temperature becomes approximately 80° C., clock frequency in the microcomputer 11 is decreased and writing to a memory is limited to prevent writing error. With this, the malfunction of the microcomputer 11 can be prevented and controllability at increased temperatures can be improved.

Figure 18:
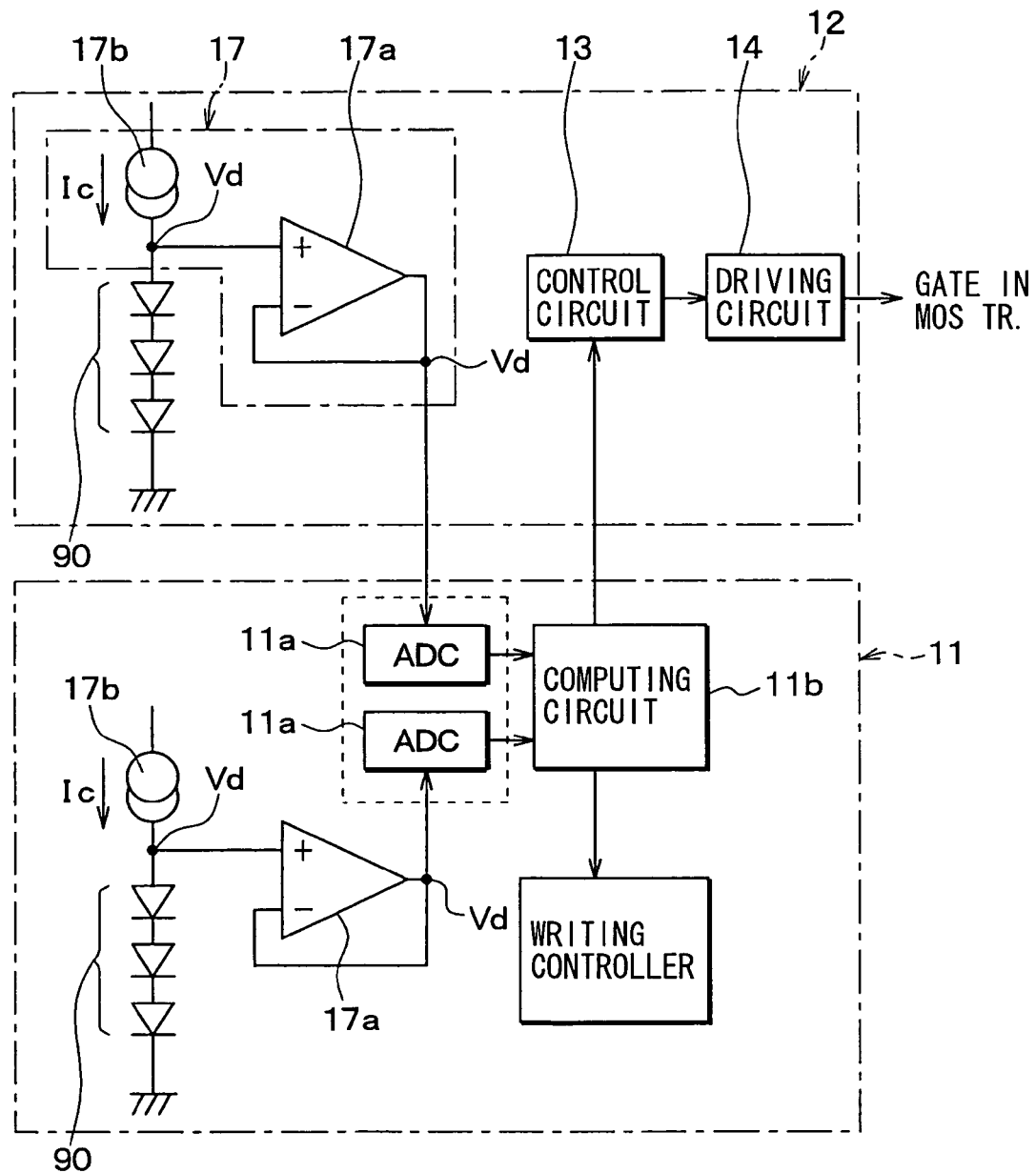
FIG. 18 is a circuit diagram explaining a control circuit of the temperature sensing signal of the control IC and a microcomputer according to a fourth modification of the second embodiment.

FIG. 18 is a block diagram to show on example of control circuit of the temperature sensing signal in the microcomputer 11 and the control IC 12 in this modification. Here, the control circuit of the temperature sensing signal in the control IC 12 is the same as shown in FIG. 16.

In the modification shown in FIG. 18, an operational amplifier 17a and a constant-current circuit 17b are provided also in the microcomputer 11. In the microcomputer 11, the temperature sensing diodes 90 are electrically connected to the input portion of the operational amplifier 17a and the constant-current circuit 17b and the output portion of the operational amplifier 17a is connected to another AD conversion part 11a.

In this modification, three temperature sensing diodes 90 are connected in series in the microcomputer 11 and are supplied with a constant current Ic from the constant-current circuit 17b. With this, a diode voltage Vd linear with respect to temperature can be obtained.

The voltage of this temperature sensing diode 90 is impedance-converted to a voltage Vd as a temperature signal by the operational amplifier 17a and the temperature signal is sent to the AD conversion part 11a. Then, this temperature signal is converted to a digital signal by the AD conversion part 11a and the digital signal is sent to the computation part 11b and the level of the signal is determined by the computation part 11b.

By the signal made by the computation part 11b, the clock frequency of the microcomputer 11 is decreased and writing to a memory is limited, whereby a control of preventing writing error and the like is performed.

Third Embodiment

A third embodiment of the present invention relates to an electronic device made by mounting a heating element and a temperature-limited element on a heat sink and then by molding them in such a manner as to wrap them by a molding resin.

Figure 19:
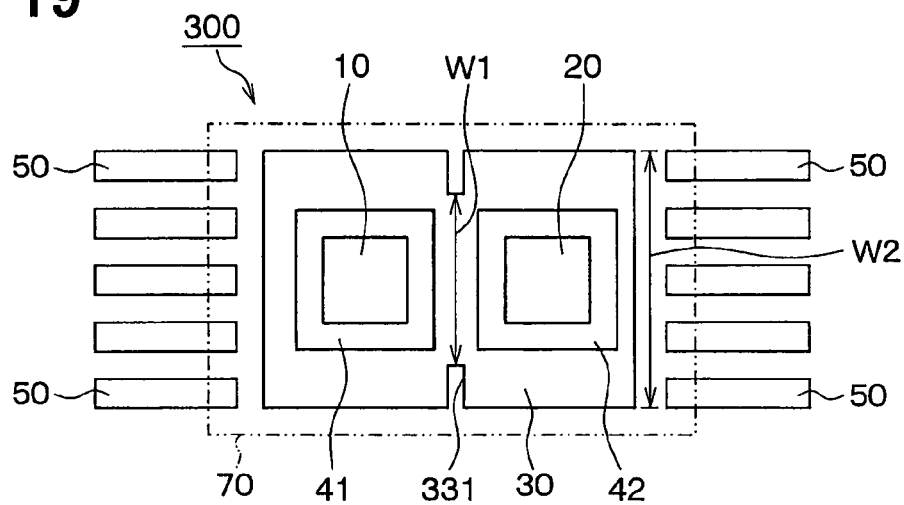
FIG. 19 is a plan view showing an electric device according to a third embodiment of the present invention.

FIG. 19 is an illustration to show a schematic plan construction of an electronic device 300 provided with a heating element 20 as the second electronic element and a temperature-limited element 10 as the first electronic element in accordance with a third embodiment of the present invention.

Figure 20:
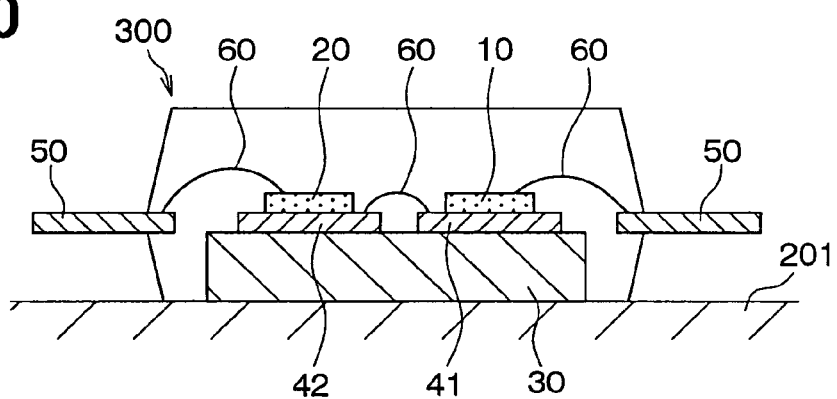
FIG. 20 is a cross sectional view showing the device in FIG. 19, according to the third embodiment.

Further, FIG. 20 is an illustration to show a schematic sectional construction of the electronic device 300 shown in FIG. 19. Here, in FIG. 19, bonding wires 60 are omitted and in FIG. 20, some of bonding wires are omitted.

In this embodiment, descriptions will be provided on the assumption that the electronic device 300 is applied to a HIC (hybrid IC, hybrid integrated circuit) for driving the driving motor of power window of an automobile, although it is not intended to limit the application of the electronic device 300 to this.

[Device Construction]

The heating element 20 is an electronic element that generates heat under a large operating current and has a larger current passed therethrough, as compared with the temperature-limited element 10, to generate large heat. To be specific, the heating element 20 is, for example, a power element such as power MOS element and IGBT element or a resistor.

Further, the temperature-limited element 10 is an electronic element limited in operating temperature. To be specific, the temperature-limited element 10 is, for example, a microcomputer or a control IC. The heating element 20 and the temperature-limited element 10 are elements such as transistor or resistor, which are formed in, for example, a semiconductor substrate (semiconductor chip) of silicon semiconductor by a semiconductor process.

As shown in FIG. 19 and FIG. 20, the heating element 20 and the temperature-limited element 10 are mounted on a heat sink 30, respectively. This heat sink 30 is made of, for example, Cu (copper) or iron-based metal having excellent heat radiation and is formed by pressing or cutting in the shape of a flat plate.

Here, in this embodiment, the second wiring board 42 and the first wiring board 41 are mounted on the top surface of the heat sink 30. These second wiring board 42 and first wiring board 41 are fixed to the top surface of the heat sink 30, for example, by an adhesive (not shown) made of resin having electric insulation and excellent thermal conductivity.

A single-layer ceramic board, a ceramic laminate board formed of a plurality of laminated layers, or a printed wiring board can be used as the second wiring board 42 and the first wiring board 41. The heating element 20 is mounted on the second wiring board 42 and the temperature-limited element 10 is mounted on the first wiring board 41. These respective elements 10, 20 are fixed to the respective wiring boards 41, 42, for example, via solder (not shown) or the like.

In other words, in this embodiment, the heating element 20 is mounted on the second wiring board 42 and the temperature-limited element 10 is mounted on the first wiring board 41, and the second wiring board 42 and the first wiring board 41 are mounted on the heat sink 30.

Here, the first and second wiring boards 41, 42 are fixed to the heat sink 30, for example, by the adhesive (not shown) made of resin having electric insulation and excellent thermal conductivity.

Further, as shown in FIG. 19, terminal parts 50 are provided around the heating element 20 and the temperature-limited element 10. These terminal parts 50 can be formed by the use of a lead frame made of, for example, Cu or 42 alloy.

For example, as shown in FIG. 20, the terminal parts 50 provided on the heating 20 side (right side in FIG. 19 and FIG. 20) are electrically connected to the second wiring board 42 or the heating element 20 by bonding wires 60 made of Au (gold) or Al (aluminum) in the molding resin 70. These terminal parts 50 are constructed as, for example, the current terminals of the heating element 20.

On the other hand, the terminal parts 50 provided on the temperature-limited element 10 side (left side in FIG. 19 and FIG. 20) are electrically connected to the first wiring board 41 or the temperature-limited element 10 by the bonding wires 60 in the molding resin 70. These terminal parts 50 are constructed as, for example, the signal terminals of the temperature-limited element 10.

Further, as shown in FIG. 20, the heating element 20 and the second wiring board 42, the temperature-limited element 10 and the first wiring board 41, and the second wiring board 42 and the first wiring board 41, or the heating element 20 and the temperature-limited element 10 are connected and electrically connected to each other as appropriate by the bonding wires 60 or the like, respectively.

The heating element 20, the temperature-limited element 10, the second wiring board 42, the first wiring board 41, the respective bonding wires 60, connection parts connected to the bonding wires 60 in the respective terminal parts 50, and the heat sink 30 are wrapped and molded by the molding resin 70.

Here, portions of the respective terminal parts 50 protrude from the molding resin 70 and are connected to external parts. Further, in this embodiment, a surface (bottom surface in FIG. 19) opposite to the surface (top surface in FIG. 19) on which the elements are mounted in the heat sink 30 is exposed from the molding resin 70.

Here, the molding resin 70 is a molding resin material such as epoxy resin usually used for a semiconductor package and is molded by a transfer molding method using a mold.

In the electronic device 300 like this, in this embodiment, the following unique construction is adopted for the heat sink 30.

A size of the heat sink 30 in a direction perpendicular to a direction of arrangement of the heating element 20 and the temperature-limited element 10 is defined as the width of the heat sink 30. In FIG. 19 and FIG. 20, the direction of arrangement of the heating element 20 and the temperature-limited element 10 is a left-and-right direction in which these elements 10, 20 are arranged, and the direction perpendicular to the direction of arrangement is an up-and-down direction in FIG. 19.

When the width of the heat sink 30 is defined in this manner, this embodiment is characterized in that, as shown in FIG. 19, in the heat sink 30, the width W1 of an area located between the heating element 20 and the temperature-limited element 10 is smaller than the width W2 of an area on which the heating element 20 is mounted.

To be specific, in this embodiment, as shown in FIG. 19, a contracted portion 331 contracted in the width direction of the heat sink 30 is formed in the area located between the heating element 20 and the temperature-limited element 10 of the heat sink 30, and the width W1 of this contracted portion 331 is smaller than the width W2 of the area where the heating element 20 is mounted.

Further, this electronic device 300 is mounted on a base board (i.e., a case) 201, as shown in FIG. 2. This base board 201 is a case, which is made of metal and in which a motor for driving the power window is received, a printed board, and the like.

For example, a semiconductor device 300 is in contact with the base board 201 with grease or the like having electric insulation and excellent thermal conductivity interposed between the bottom surface of the heat sink 30 and the base board 201. The heat of the semiconductor device 300 is dissipated to the base board 201 via the heat sink 30.

The electronic device 300 like this can be manufactured, for example, by: mounting the second wiring board 42 mounted with the heating element 20 and the first wiring board 41 mounted with the temperature-limited element 10 on the heat sink 30; arranging terminal parts 50 around the first and second wiring boards 41, 42; bonding the heating element 20 and the temperature-limited-element 10 to the terminal part 50 by wires; and molding these parts by molding resin.

[Effects]

By the way, according to this embodiment, there is provided an electronic device 300 that is provided with the heating element 20 generating heat during operation, the temperature-limited element 10 limited in operating temperature, the heat sink 30 mounted with the heating element 20 and the temperature-limited element 10, and the molding resin 70 for molding the heating element 20, the temperature-limited element 10, and the heat sink 30 in such a way as to wrap these parts, and is characterized by the following points.

That is, the electronic device 300 is characterized in that when a size of the heat sink 30 in a direction perpendicular to the direction of arrangement of the heating element 20 and the temperature-limited element 10 is defined as the width of the heat sink 30, in the heat sink 30, the width W1 of an area located between the heating element 20 and the temperature-limited element 10 is smaller than the width W2 of an area on which the heating element 20 is mounted.

According to the electronic device 300 of this embodiment characterized by this point, in the heat sink 30, the width W1 of the area located between the heating element 20 and the temperature-limited element 10 is smaller than the width W2 of the area on which the heating element 20 is mounted, so that it is possible to provide a construction in which the width of a passage for heat transfer between the heating element 20 and the temperature-limited element 10 in the heat sink 30 is narrowed.

For this reason, even when the distance between the heating element 20 and the temperature-limited element 10 is not so much elongated, it is possible to make it difficult for the heat generated by the heating element 20 to transfer to the temperature-limited element 10.

Therefore, according to this embodiment, in the electronic device made by mounting the heating element 20 and the temperature-limited element 10 on the heat sink 30 and then by molding them by the molding resin 70 in such a manner as to wrap them, it is possible to realize appropriate heat radiation characteristics.

Fourth Embodiment

Figure 21:
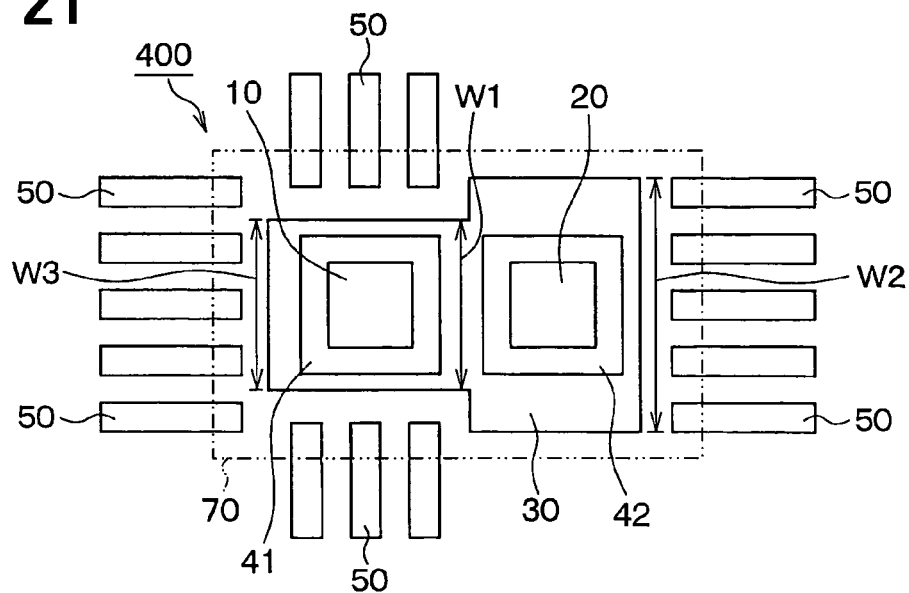
FIG. 21 is a plan view showing an electric device according to a fourth embodiment of the present invention.

FIG. 21 is an illustration to show a schematic plan construction of an electronic device 400 provided with the heating element 20 as the first electronic element and the temperature-limited element 10 as the second electronic element in accordance with a fourth embodiment of the present invention. Here, in FIG. 21, bonding wires 60 are omitted. Different points between this embodiment and the above-described embodiment will be mainly described.

In the electronic device 300 shown in FIG. 19 in the third embodiment, the contracted portion 331 contracted in the width direction of the heat sink 30 is formed in the area located between the heating element 20 and the temperature-limited element 10 of the heat sink 30.

In contrast to this, as shown in FIG. 21, in the electronic device 400 of this embodiment, the plan shape of the heat sink 30 is formed in the shape of a letter T. To be specific, in this shape of a letter T, the width W2 of the area where the heating element 20 is mounted is larger than the width W3 of the area where the temperature-limited element 10 is mounted.

Further, the heat sink 30 shaped like a letter T is formed in such a shape that the area where the temperature-limited element 10 is mounted protrudes in a direction perpendicular to the width direction of the heat sink 30 from a portion nearly at the center in the width direction of the heat sink 30 in the area where the heating element 20 mounted.

In the heat sink 30 shaped like a letter T, the width W3 of the area where the temperature-limited element 10 is mounted is nearly equal to the width W1 of the area located between the heating element 20 and the temperature-limited element 10.

By forming the plan shape of the heat sink 30 in the shape of a letter T in this manner, in the heat sink 30, the width W3 of the area where the temperature-limited element 10 is mounted is smaller than the width W2 of the area where the heating element 20 is mounted. This can provide space for arranging a lead frame around the temperature-limited element 10, which is suitable for making multiple pins.

Here, as shown in FIG. 21, around the temperature-limited element 10, in addition to the terminal parts 50 on the left side in the drawing, terminal parts 50 are further provided on the upper side and lower side in the drawing. These additional terminal parts 50 also are electrically connected to the temperature-limited element 10 by the bonding wires, although not shown.

According to the electronic device 400 of this embodiment like this, as is the case with the above-described embodiment, it is possible to provide a construction in which the width of a passage for heat transfer between the heating element 20 and the temperature-limited element 10 in the heat sink 30 is narrowed. Hence, even when the distance between the heating element 20 and the temperature-limited element 10 is not so much elongated, it is possible to make it difficult for the heat generated by the heating element 20 to transfer to the temperature-limited element 10.

Therefore, according to this embodiment, in the electronic device 400 made by mounting the heating element 20 and the temperature-limited element 10 on the heat sink 30 and then by molding them by the molding resin 70 in such a manner as to wrap them, it is possible to realize appropriate heat radiation characteristics.

Fifth Embodiment

Figure 22:
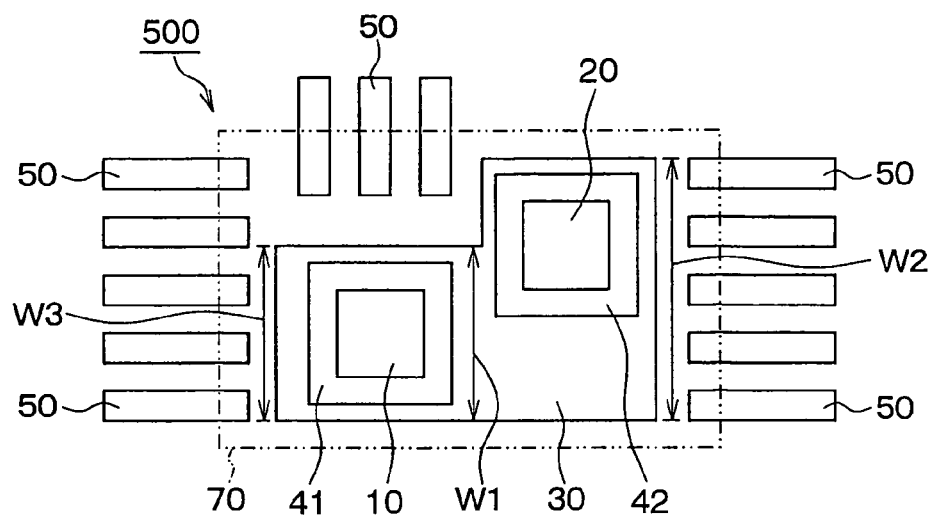
FIG. 22 is a plan view showing an electric device according to a fifth embodiment of the present invention.

FIG. 22 is an illustration to show a schematic plan construction of an electronic device 500 provided with the heating element 20 as the first electronic element and the temperature-limited element 10 as the second electronic element in accordance with a fifth embodiment of the present invention. Here, in FIG. 22, bonding wires are omitted. Different points between this embodiment and the above-described embodiments will be mainly described.

As shown in FIG. 22, in the electronic device 500 of this embodiment, the plan shape of the heat sink 30 is formed in the shape of a letter L. To be specific, the width W2 of the area where the heating element 20 is mounted is larger than the width W3 of the area where the temperature-limited element 10 is mounted.

Further, the heat sink 30 shaped like a letter L is formed in such a shape that the area where the temperature-limited element 10 is mounted protrudes in a direction perpendicular to the width direction of the heat sink 30 from one end in the width direction of the heat sink 30 in the area where the heating element 20 is mounted.

Here, in the heat sink 30 shaped like a letter L, the width W3 of the area where the temperature-limited element 10 is mounted is nearly equal to the width W1 of the area located between the heating element 20 and the temperature-limited element 10.

By forming the plan shape of the heat sink 30 in the shape of a letter L in this manner, in the heat sink 30, the width W3 of the area where the temperature-limited element 10 is mounted is smaller than the width W2 of the area where the heating element 20 is mounted. This can provide space for arranging a lead frame around the temperature-limited element 10, which is suitable for making multiple pins.

Here, as shown in FIG. 22, around the temperature-limited element 10, in addition to the terminal parts 50 located on the left side in the drawing, terminal parts 50 are further provided on the upper side in the drawing. These additional terminal parts 50 also are electrically connected to the temperature-limited element 10 by the bonding wires, although not shown.

According to the electronic device 500 of this embodiment like this, as is the case with the above-described embodiment, it is possible to provide a construction in which the width of a passage for heat transfer between the heating element 20 and the temperature-limited element 10 in the heat sink 30 is narrowed. Hence, even when the distance between the heating element 20 and the temperature-limited element 10 on the heat sink 30 is not so much elongated, it is possible to make it difficult for the heat generated by the heating element 20 to transfer to the temperature-limited element 10.

Therefore, according to this embodiment, in the electronic device 500 made by mounting the heating element 20 and the temperature-limited element 10 on the heat sink 30 and then by molding them by the molding resin 70 in such a manner as to wrap them, it is possible to realize appropriate heat radiation characteristics.

Sixth Embodiment

Figure 23:
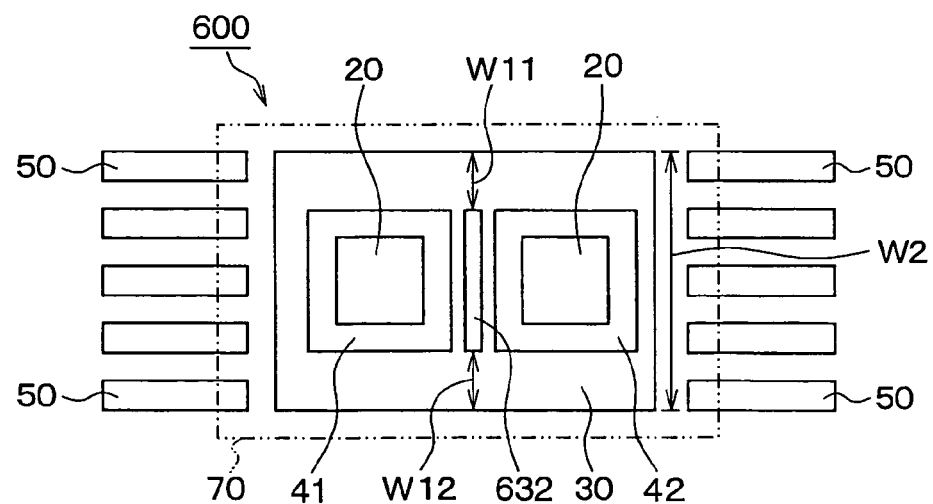
FIG. 23 is a plan view showing an electric device according to a sixth embodiment of the present invention.

FIG. 23 is an illustration to show a schematic plan construction of an electronic device 600 provided with the heating element 20 as the first electronic element and the temperature-limited element 10 as the second electronic element in accordance with a sixth embodiment of the present invention. Here, in FIG. 23, bonding wires are omitted. Different points between this embodiment and the above-described embodiments will be mainly described.

As shown in FIG. 23, the electronic device 600 of this embodiment shown in FIG. 23 is characterized in that a slit 632 is formed in a portion located between the heating element 20 and the temperature-limited element 10 in the heat sink 30. This slit 632 is formed as a through hole.

By forming the slit 632 in the area located between the heating element 20 and the temperature-limited element 10 in the heat sink 30, the width of a portion except for the slit 632 in the area can be made smaller the width W2 of the area where the heating element 20 is mounted.

Here, the width of the portion except for the slit 632 is the sum of a width W11 and a width W12 in FIG. 23 and corresponds to the width W1 of the area located between the heating element 20 and the temperature-limited element 10 in the heat sink 30. That is, W1=W11+W12.

For this reason, by forming this slit 632, it is possible to make, in an appropriate manner, the width W1 of the area located between the heating element 20 and the temperature-limited element 10 in the heat sink 30 smaller than the width W2 of the area where the heating element 20 is mounted. Further, by forming the slit 632, it is possible to produce an effect of breaking a portion of passage for heat transfer between the heating element 20 and the temperature-limited element 10.

In this regard, the construction of the heat sink 30, which is adopted in this embodiment and has the slit 632 formed, can be adopted in a combination of the first to third embodiments. In other words, in the heat sink 30 in the respective electronic devices shown in FIG. 19 to FIG. 22, a slit 632 may be formed in the area between the heating element 20 and the temperature-limited element 10.

According to the electronic device 600 of this embodiment like this, as is the case with the above-described embodiments, it is possible to provide a construction in which the width of a passage for heat transfer between the heating element 20 and the temperature-limited element 10 in the heat sink 30 is narrowed. Hence, even when the distance between the heating element 20 and the temperature-limited element 10 on the heat sink 30 is not so much elongated, it is possible to make it difficult for the heat generated by the heating element 20 to transfer to the temperature-limited element 10.

Therefore, according to this embodiment, in the electronic device made by mounting the heating element 20 and the temperature-limited element 10 on the heat sink 30 and then by molding them by the molding resin 70 in such a manner as to wrap them, it is possible to realize appropriate heat radiation characteristics.

Seventh Embodiment

The seventh embodiment of the invention is an electronic device applied to a HIC (hybrid integrated circuit) for driving and controlling a motor in the power window of an automobile and shows its specific construction.

Figure 24:
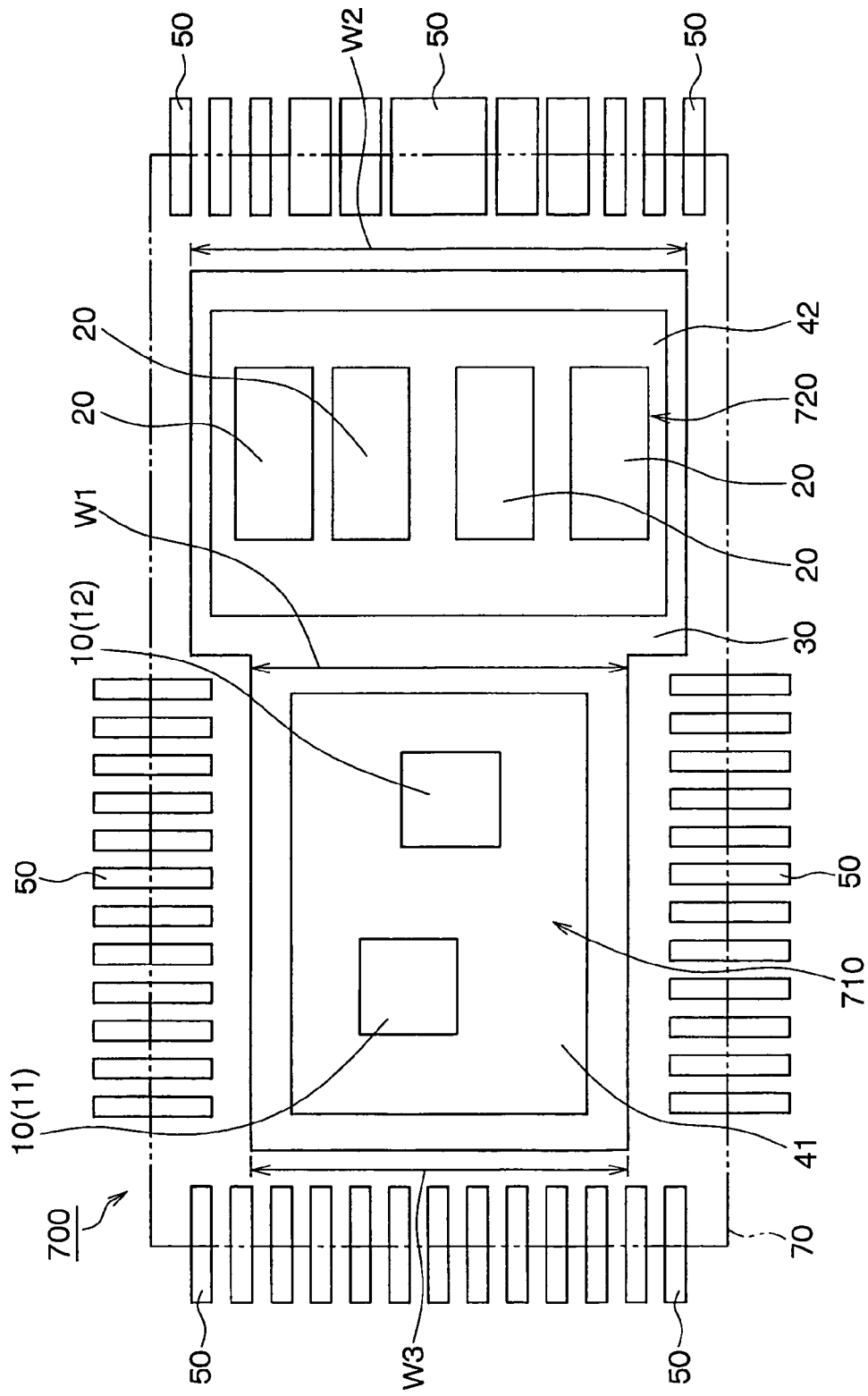
FIG. 24 is a plan view showing an electric device according to a seventh embodiment of the present invention.

FIG. 24 is an illustration to show a schematic plan construction of an electronic device 700 provided with the heating element 20 as the first electronic element and the temperature-limited element 10 as the second electronic element in accordance with a seventh embodiment of the present invention. Here, in FIG. 24, bonding wires are omitted.

[Device Construction]

An electronic device 700 of this embodiment is constructed of the second circuit part 720 provided with the heating elements 20 and the first circuit part 710 provided with the temperature-limited elements 10. Here, the second circuit part 720 is constructed as a driving part the driving of which is controlled by the first circuit part 710.

In this embodiment, the second circuit part 720 has the heating elements 20 of driving elements such as power MOS element and IGBT element and is constructed of these heating elements 20 and the second wiring board 42 on which these heating elements 20 are mounted.

The heating element 20 constructing the second circuit part 720 is an element that has a larger current passed therethrough, as compared with the temperature-limited element 10 constructing the first circuit part 720, to generate large heat. Hence, the second circuit part 720 has a larger current passed therethrough as compared with the first circuit part 710.

In this embodiment, the heating elements 20 constructing the second circuit part 720 are constructed of four power MOS elements 20 as power elements. These power MOS elements 20 are controlled by the control elements 11, 12 as the temperature-limited element 10 constructing the first circuit part 710.

On the other hand, the first circuit part 710 includes the temperature-limited elements 10 of control elements such as microcomputer 11 and control IC 12 and is constructed of these temperature-limited elements 10 and the first wiring board 41 on which these temperature-limited elements 10 are mounted.

Here, the respective elements 10, 20 constructing the respective circuit parts 710, 720 are mounted on the respective wiring boards 41, 42 by the bonding wires or the die bonding material (not shown).

As shown in FIG. 24, the second wiring board 42 and the first wiring board 41 are mounted on the heat sink 30.

Although it is not intended to limit the shape of the heat sink 30, here, the heat sink 30 is shaped like a letter T, as is the case with the second embodiment. Of course, in addition to this shape, the shapes shown in the respective embodiments can be adopted as the shape of the heat sink 30 of this embodiment.

Here, the respective wiring boards 41, 42 are fixed to the top surface of the heat sink 30, for example, via an adhesive (not shown) made of resin having electric insulation and excellent thermal conductivity. The second wiring board 42 and the first wiring board 41 are connected and electrically connected to each other by the bonding wires (not shown).

Here, as the respective wiring boards 41, 42, as is the case with the above embodiments, can be adopted a single-layer ceramic board, a ceramic laminate board formed of a plurality of laminated layers, or a printed wiring board.

In particular, as the second wiring board 42 can be adopted a thick-film wiring board formed of a single-layer ceramic layer or approximately two ceramic laminated layers. On the other hand, as the first wiring board 41 can be adopted a ceramic laminate board formed of three or more laminated layers or a printed wiring board.

Further, in the electronic device 700 of this embodiment, it is preferable that the second wiring board 42 is a single-layer board and that the first wiring board 41 is a multilayer board. Further, it is desirable to form both of the wiring boards 41, 42 of alumina board having excellent heat radiation.

In this electronic device 700, the first circuit part 710 as the control part is more complex in construction as compared with the second circuit part 720 as the driving part. Hence, to downsize the device, it is recommended that a multilayer board, in which wirings and the like can be three-dimensionally constructed, be used as the first wiring board 41 in the first circuit part 710.

However, when separate wiring boards 41, 42 are used for the second circuit part 720 and the first circuit part 710, the adoption of the multilayer boards for both of the wiring boards 41, 42 results in increasing cost.

In this respect, when the first wiring board 41 used for the first circuit part 710 as the control part is formed of the multilayer board and the second wiring board 42 used for the second circuit part 720 as the driving part is formed of a single-layer board which is cheaper than the multilayer board, an advantage is provided in cost.

Further, as shown in FIG. 24, also in the electronic device 700 of this embodiment, terminal parts 50 are provided around the heating elements 20 and the temperature-limited elements 10, and the electric connections between the heating elements 20, the temperature-limited elements 10, the wiring boards 41, 42, and the respective terminal parts 50 are made by bonding wires (not shown).

Also in this embodiment, as is the case with the above embodiments, for example, the terminal parts 50 provided on the heating element 20 side (right side in FIG. 24) are constructed as the current terminals of the heating element 20 whereas the terminal parts 50 provided on the temperature-limited element 10 side (left side in FIG. 24) are constructed as the signal terminals of the temperature-limited element 10.

As shown in FIG. 24, in the electronic device 700, the second circuit part 720, the first circuit part 710, the bonding wires, the heat sink 30 and portions of the terminal parts 50 are molded by the molding resin 70.

The electronic device 700 is mounted in the driving unit of the power window. For example, in the electronic device 700, portions of the respective terminal parts 50 protruding from the molding resin 70 are electrically connected to the connector and the motor of the driving unit.

The connections between these terminal parts 50 and the connector and the motor are made by welding or soldering. The electronic device 700 mounted in the driving unit drives and controls the motor.

[Effects]

By the way, also in the electronic device 700 of this embodiment, there is provided the electronic device 700 that is provided with: the heating element 20; the temperature-limited element 10; the heat sink 30 on which the heating element 20 and the temperature-limited element 10 are mounted; and the molding resin 70 that molds the heating element 20, the temperature-limited element 10, and the heat sink 70 in such a way as to wrap these parts, and is characterized in that, in the heat sink 30, the width W1 of an area located between the heating element 20 and the temperature-limited element 10 is smaller than the width W2 of an area where the heating element 20 is mounted.

According to the electronic device 700, as is the case with the embodiments described above, it is possible to provide a construction in which the width of a passage for heat transfer between the heating element 20 and the temperature-limited element 10 in the heat sink 30 is narrowed. Hence, even when the distance between the heating element 20 and the temperature-limited element 10 on the heat sink 30 is not so much elongated, it is possible to make it difficult for the heat generated by the heating element 20 to transfer to the temperature-limited element 10.

Therefore, according to this embodiment, in the electronic device 700 made by mounting the heating element 20 and the temperature-limited element 10 on the heat sink 30 and then by molding them by the molding resin 70 in such a manner as to wrap them, it is possible to realize appropriate heat radiation characteristics.

Further, also in this embodiment, as is the case with the second embodiment, the effect produced by forming the plane shape of the heat sink 30 in the shape of a letter T can be produced similarly. Here, as shown in FIG. 24, the terminal parts 50 are arranged also on the upper and lower sides in the drawing around the temperature-limited element 10.

(Modifications)

In this regard, it is not intended to limit the shape of the heat sink to the shape shown in the respective drawings.

In other words, when the size of the heat sink 30 in a direction perpendicular to the direction of arrangement of the heating element 20 and the temperature-limited element 10 is defined as the width of the heat sink 30, and when in the heat sink 30, the width W1 of an area located between the heating element 20 and the temperature-limited element 10 is smaller than the width W2 of an area on which the heating element 20 is mounted, the heat sink 30 can be formed in an arbitrary shape.

Further, in the above-described embodiments, the heating element 20 and the temperature-limited element 10 are mounted on the heat sink 30 via the wiring boards 41, 42, respectively. However, it is also recommended that the heating element 20 and the temperature-limited element 10 be directly mounted on the heat sink 30 with no wiring board interposed between these elements 10, 20 and the heat sink 30.

Still further, it is also recommendable to construct the electronic device in such a way that both of the heating element 20 and the temperature-limited element 10 are not mounted on the heat sink 30 via the wiring boards 41, 42 but that either the heating element 20 or the temperature-limited element 10 is mounted on the heat sink 30 via either the wiring board 42 or the wiring board 41.

Describing this construction specifically, it is also recommendable to construct the electronic device in such a way that in the respective drawings, for example, the heating elements 20 is directly mounted on the heat sink 30 without using the second wiring board 42 and that the temperature-limited element 10 is mounted on the heat sink 30 via the first wiring board 41.

Alternatively, it is also recommendable to construct the electronic device in such a way that on the contrary to this, the heating elements 20 is mounted on the heat sink 30 via the second wiring board 42 and that the temperature-limited element 10 is directly mounted on the heat sink 30 without using the first wiring board 41.

In the above embodiments, descriptions haven been provided on the assumption that the electronic device of the invention is applied to the HIC for driving the driving motor of the power window. However, needless to say, the application of the electronic device of the invention is not limited to this application.

As described above, the essential point of the invention is that in the electronic device provided with the heating element, the temperature-limited element, the heat sink on which the heating element and the temperature-limited element are mounted, and the molding resin that molds the heating element, the temperature-limited element, and the heat sink in such a way as to wrap these parts, of the heat sink, the width W1 of an area located between the heating element and the temperature-limited element is smaller than the width W2 of an area where the heating element 20 is mounted. The invention can be modified as appropriate in the other points.

Eighth Embodiment

An eighth embodiment of the present invention relates to an electronic device provided with a control part and a driving part, the driving of which is controlled by the control part, and to be specific, to an electronic device for driving and controlling an actuator.

Although it is not intended to limit the invention to this application, an electronic device 800 of this embodiment will be described on the assumption that the electronic device 800 is applied to a motor 810 (see FIG. 27A and 27B and FIG. 28, which will be described later) as an actuator in the power window of an automobile and a HIC (hybrid IC, hybrid integrated circuit) for driving and controlling the motor.

Figure 25:
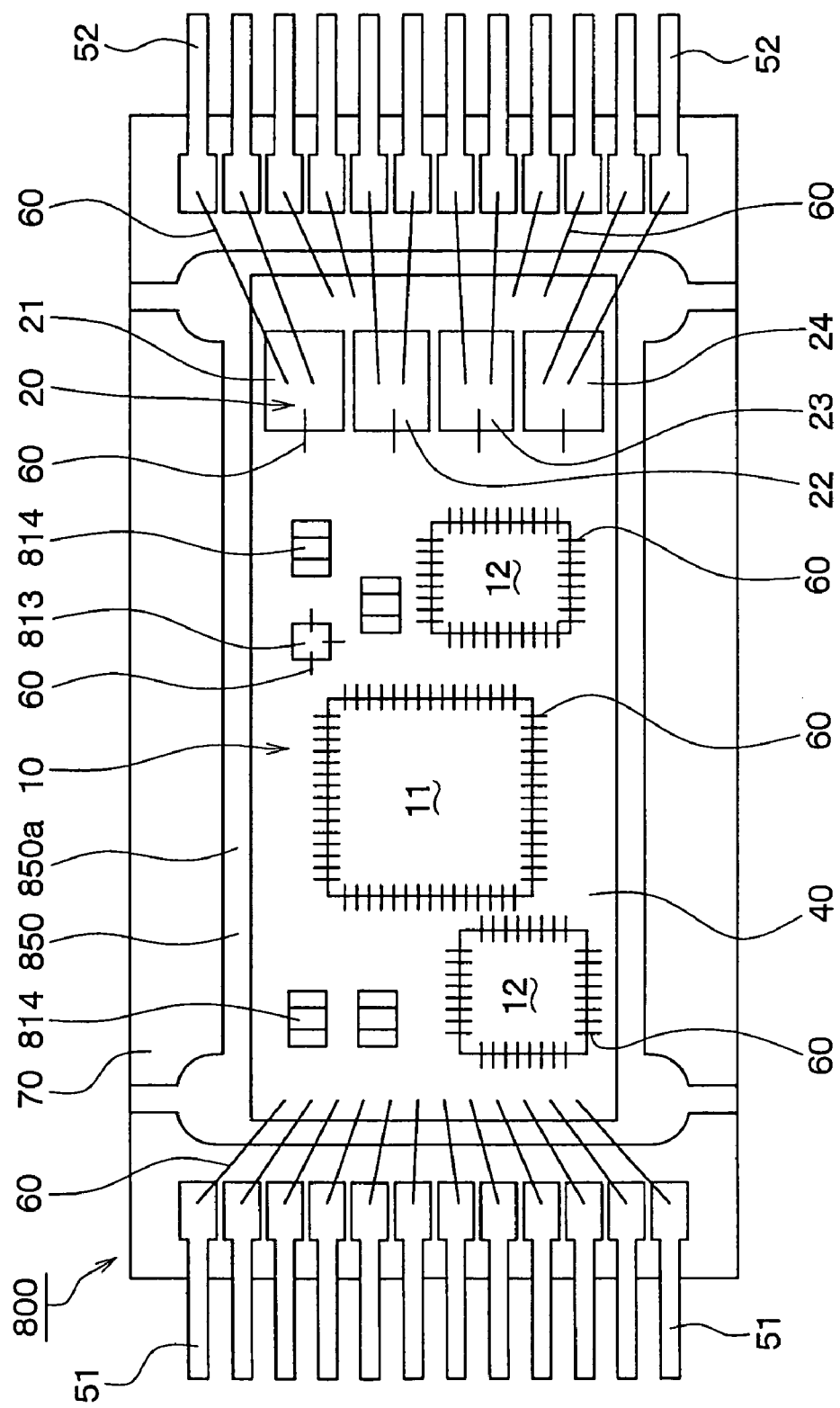
FIG. 25 is a plan view showing an electric device having a control element and a driving element, according to an eighth embodiment of the present invention.
Figure 26:
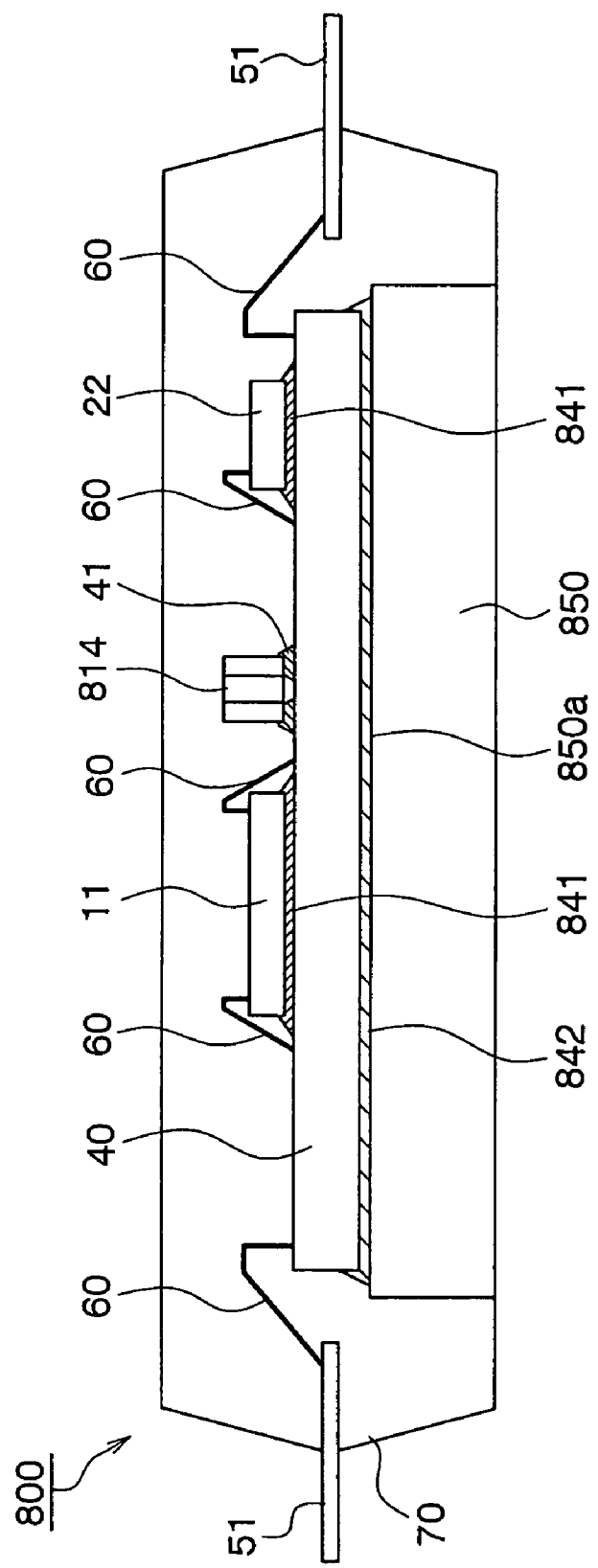
FIG. 26 is a cross sectional view showing the device according to the eighth embodiment.

FIG. 25 is an illustration to show a schematic plan construction of the electronic device 800 provided with a control part as the first electric element 10 and a driving part as a second electric element 20 in accordance with the eighth embodiment of the present invention. FIG. 26 is an illustration to show a schematic sectional construction of the electronic device 800 shown in FIG. 25.

Further, FIGS. 27A and 27B are external views to show a state where the electronic device 800 is mounted in the driving unit 801 of power window of an automobile. FIG. 27A is a view when viewed from a direction shown by arrow XXVIIA in FIG. 27B. Here, in FIGS. 27A and 27B, the electronic device 800 is received in the coupling part 840 of the driving unit 801 and hence can not be seen from the outside. Therefore, the electronic device 800 is shown not by solid line but by broken line.

[Device Construction]

The control part 10 includes control elements such as microcomputer 11, control IC 12, and a transistor 813 and capacitors 814. The control part 10 is constructed of these electronic elements 11, 12, 813, and 814 and a wiring board 40 having these electronic elements 11, 12, 813 and 814 mounted thereon.

Here, the control elements 11, and 813 described above are formed on a semiconductor substrate (semiconductor chip) such as silicon semiconductor by a semiconductor process.

The driving part 20 is a part the driving of which is controlled by the control part 10. The driving part 20 includes driving elements such as power MOS element and IGBT and is constructed of elements of these driving elements and the wiring board 40 having these elements mounted thereon.

Usually, the electronic element constructing the driving part 20 is a power element which has a larger current passed therethrough, as compared with the electronic element constructing the control part 10, to generate large heat. In this embodiment, the electronic elements constructing the driving part 20 are constructed of four power MOS elements 21, 22, 23, 24 as power elements.

In this manner, in this embodiment, the control part 10 and the driving part 20 include the common wiring board 40 as a constituent part.

The respective electronic elements 11, 12, 813 and 814 and 21 to 24 that construct the control part 10 and the driving part 20, as shown in FIG. 25 and FIG. 26, are mounted on the wiring board 40 by bonding wires 60 made of Au (gold) and Al (aluminum) and die bonding material 841 such as solder.

Here, the construction of the respective electronic elements 11, 12, 813 and 814 and 21 to 24 in the control part 10 and in the driving part 20 as shown in FIG. 25 is only one example and the construction of the control part 10 and the driving part 20 is not limited to this.

Further, the wiring board 40 is mounted on the mounting surface 850a of the island part 850 of a lead frame. Here, the wiring board 40 is fixed to the mounting surface 850a of the island part 850 via an adhesive 842 made of resin having electric insulation and excellent thermal conductivity.

A single-layer ceramic board or a ceramic laminate board made of a plurality of laminated layers or a printed wiring board can be used as this wiring board 40.

Further, a plurality of lead parts as the signal terminal and the current terminal 51, 52 are arranged around the island part 850 of the lead frame.

Here, it is assumed that the lead parts 51 connected and electrically connected to the control part 10 via bonding wires 60 are the first lead parts 51 (left side in FIG. 25) and that the lead parts 52 connected and electrically connected to the driving part 20 via bonding wires 60 are the second lead parts 52.

For example, the first lead parts 51 connected to the control part 10 function as signal terminals of the control elements as the microcomputers 11, 12 and 813 and the second lead parts 52 connected to the driving part 20 function as current terminals of the driving elements and terminals connected to the motor 810 (see FIGS. 27A and 27B, FIG. 28) for driving the motor 810.

Here, the island part 850, the first lead parts 51, and the second lead parts 52 can be formed of a usual lead frame made of Cu (copper), Fe (iron), or 42 alloy.

As shown in FIG. 25 and FIG. 26, in this electronic device 800, the control part 10, the driving part 20, the respective bonding wires 60, the island part 850, and connection parts connected to the bonding wires 60 in the first and second lead parts 51, 52 are molded by molding resin 70.

Here, as shown in FIG. 26, of the island part 850, a bottom surface opposite to a top surface having the wiring board 40 mounted thereon, that is, the mounting surface 850a is exposed from the molding resin. 70. With this, heat generated in the electronic device 800 is radiated to the outside from the exposed portion of this island part 850, whereby the heat radiation of the device is enhanced.

Therefore, the island part 850 in the electronic device 800 has a function as a heat sink. This island part 850 may be formed integrally with the lead frame, as shown in FIG. 25, and may be a heat sink that is prepared separately from the lead frame and is fixed to the lead frame by caulking or the like.

In the electronic device 800 like this, as a construction unique to this embodiment, the first lead parts 51 and the second lead parts 52 are so arranged as to extend in parallel to the mounting surface 850a of the island part 850. In this arrangement, tips of the respective lead parts 51, 52 protrude from the molding resin 70.

This means that the respective lead parts 51, 52 are arranged in a plane parallel to the surface of sheet in FIG. 25. With this, there is provided a construction in which the respective lead parts 51, 52 do not protrude in the direction of thickness of the electronic device 800, that is, in a direction vertical to the surface of sheet in FIG. 25.

This is clear also from FIG. 26. In other words, the respective lead parts 51, 52 are arranged within a range of thickness of the electronic device 800, that is, within a range between the top surface (top surface of the molding resin 70 in FIG. 26) and the bottom surface (bottom surface of the island part 850 in FIG. 26) of the electronic device 800.

In the example shown in FIG. 25 and FIG. 26, the first lead parts 51 are arranged in one of end portions opposite to each other of the molding resin 70, that is, one end portion of the molding resin 70 in the left-and-right direction in the drawing and the second lead parts 52 are arranged in the other end portion. With this arrangement, the first and second lead parts 51, 52 protrude in the same one direction.

While an example is shown here in which the first and second lead parts 51, 52 protrude in the same one direction, it is also recommendable to use, for example, a construction in which the second lead parts 52 extend downward from the bottom side of the island part 850. Also in this case, needless to say, the respective first and second lead parts 51, 52 are arranged in a plane parallel to the surface of sheet in FIG. 25.

Further, this electronic device 800, as shown in FIGS. 27A and 27B, is mounted in the driving unit 801 of the power window described above.

This driving unit 801 is constructed of the driving motor 810, a speed reducer 820 that is driven by this motor 810 to move window glass, a connector 830 connected to an electric power source 860 (see FIG. 28, which will be described) and a switch, and a coupling part 840 for coupling these parts 810 to 830.

Here, the coupling part 840 also functions as a case for receiving a connection part for connecting the respective parts 810 to 830. The electronic device 800 is received in this coupling part 840 and the first lead parts 51 are electrically connected to the connector 830 and the second lead parts 52 are electrically connected to the motor 810 of an actuator.

The connection between the first lead parts 51 and the connector 830 and the connection between the second lead parts 52 and the motor 810 can be made by welding or soldering. The electronic device 800 mounted in the driving unit 801 drives and controls the motor 810.

The electronic device 800 like this can be manufactured, for example, by mounting the wiring board 40 mounted with the respective electronic elements 11, 12, 813 and 814 and 21 to 24 on the mounting surface 850a of the island part 850 and by bonding the respective electronic elements 11, 12, 813 and 814 and 21 to 24 to the respective lead parts 51, 52 arranged around the island part 850 by wires and then by molding this assembly.

[Circuit Construction and Operation]

Figures 28, 29A, 29B, 29C, 29D:
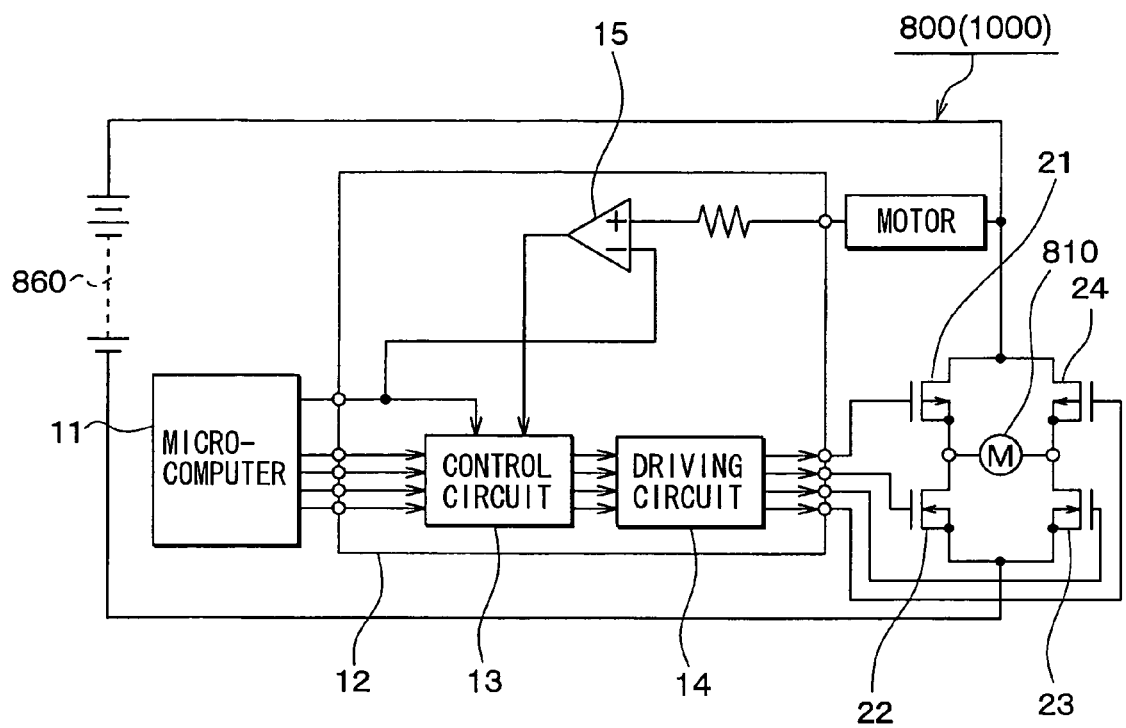
FIG. 28 is a circuit diagram showing the device according to the eighth embodiment.
FIGS. 29A to 29D are diagrams explaining a on-off state of each power MOS transistor in different operating conditions, according to the eighth embodiment.

The circuit construction and the like of the electronic device 800 of this embodiment will be described with reference to FIG. 28 and FIGS. 29A to 29D. FIG. 28 is a schematic circuit construction of the electronic device 800. FIGS. 29A to 29D show ON/OFF states of gate inputs of the respective power MOS elements 21 to 24 in the operating state of the motor in FIG. 28.

In the circuit construction shown in this FIG. 28, the control part 10 is mainly constructed of the microcomputer 11 and the control IC 12 including a control circuit 13, a driving circuit 14, and a comparator 15. The driving part 20 is constructed of four power MOS elements 21, 22, 23, and 24.

Here, four power MOS elements 21 to 24 construct an H bridge circuit. Further, in the electronic device 800, there are provided the above-described motor 810 for driving the window glass and the electric power source 860 of the device.

In the electronic device 800 like this, an instruction is transmitted to the microcomputer 11 from a microcomputer (not shown) by communications (for example, LIN) and the microcomputer 11 controls the respective power MOS elements 21 to 24 via the control circuit 13 and the driving circuit 14 according to the instruction. The output of the driving circuit 14 is inputted to the gates of the respective power MOS elements 21 to 24.

Here, it is the motor 810 that moves up and down the window glass of the vehicle and the states of gate inputs at the times when the motor is stopped, when the window glass is moved up, and when the window glass is moved down, are shown in FIGS. 29A to 29D.

That is, as shown in FIGS. 29A to 29D, when the motor is stopped, all of the four power MOS elements 21 to 24 are brought into OFF state and when the window glass is moved up, two power MOS elements 21, 23 located on one diagonal in the H bridge circuit are brought into ON state whereas two power MOS elements 22, 24 located on the other diagonal are brought into OFF state.

Further, when the window glass is moved down, two power MOS elements 21, 23 located on one diagonal in the H bridge circuit are brought into OFF state whereas two power MOS elements 22, 24 located on the other diagonal are brought into ON state. In other words, when the window is moved up and when the window is moved down, current passing through the motor 810 is reversed by the H bridge circuit and hence the motor 810 is also reversely rotated.

Still further, the comparator 15 compares motor rotation information detected by, for example, a Hall sensor (not shown) with the command of the microcomputer 11 and feeds back a signal to the control circuit 13 according to conditions. With this, more suitable control can be performed.

[Effects]

By the way, according to this embodiment, there is provided the electronic device 800 that is provided with the first circuit part 10 and the second circuit part 20, the driving of which is controlled by the control part 10, and is characterized by the following points.

The control part 10 and the driving part 20 are mounted on the mounting surface 850a of the island part 850 of the lead frame.

The control part 10 is electrically connected to the first lead parts 51 of the lead frame via the bonding wires 60 and the driving part 20 is electrically connected to the second lead parts 52 of the lead frame via the bonding wires 60.

The control part 10, the driving part 20, the respective bonding wires 60, the island part 850, the first lead parts 51, and the second lead parts 52 are molded by the molding resin 70, thereby being integrated into one piece.

The first lead parts 51 and the second lead parts 52 are so arranged as to extend in a direction parallel to the mounting surface 850a of the island part 850 and the tips of the respective leads parts 51, 52 protrude from the molding resin 70.

According to the electronic device 800 of this embodiment characterized by these points, the control part 10 and the driving part 20 are mounted on the mounting surface 850a of the island part 850 of the lead frame, and the control part 10 and the driving part 20 are electrically connected to the respective lead parts 51, 52 via the bonding wires 60, and these parts are molded by the molding resin 70, thereby being integrated into one piece. Therefore, the electronic device 800 can be reduced in size.

Further, as described above, the connection between the electronic device 800 and the external part, that is, the driving unit 801 is made by connecting the first lead parts 51 connected to the control part 10 to the electric power source 860 and the switch via the connector 830 and by connecting the second lead parts 52 connected to the driving part 20 to the motor 810 as an actuator.

Here, in the electronic device 800 of this embodiment, the first lead parts 51 and the second lead parts 52 are so arranged as to extend in a direction parallel to the mounting surface 850a of the island part 850 and the tips of the respective leads parts 51, 52 protrude from the molding resin 70.

For this reason, the electronic device 800 can be constructed in such a way that the respective lead parts 51, 52 do not protrude in the direction of thickness of the island part 850, that is, in the direction of thickness of the device. Therefore, the device can be reduced in size.

In addition, when the electronic device 800 is mounted in the actuator, the electronic device 800 can be suitably connected to the external part via the tips of the respective lead parts 51, 52 protruding from the molding resin 70.

In this manner, according to this embodiment, in the electronic device 800 provided with the control part 10 and the driving part 20, it is possible to downsize the device and to facilitate securing space where the device is mounted in the actuator.

Further, as described above, in the semiconductor device 800 of this embodiment, when the motor is stopped, all of four power MOS elements 21 to 24 which construct H bridge are brought into OFF state and when the window glass is moved up (or down), two power MOS elements 21, 23 are brought into ON state (OFF state, when the window glass is moved down) and two power MOS elements 22, 24 are brought into OFF state (ON state, when the window glass is moved down).

In view of operating conditions like this, in the semiconductor device 800, as shown in FIG. 25, four power MOS elements 21 to 24 are arranged in such a way that the neighboring power elements are not brought into ON state at the same time.

In other words, as shown in FIG. 25, the power MOS elements that are brought into ON state (OFF state) when the window is moved up (when the window is moved down) and the power MOS elements that are brought into OFF state (ON state) when the window is moved up (when the window is moved down) are alternately arranged.

Further referring to this arrangement of the power MOS elements, in this embodiment, four power MOS elements 21 to 24 are arranged in such a way that: when at least one of four power MOS elements 21 to 24 is brought into ON state, at the same time, one of the neighboring power MOS elements is brought into ON state and the other is brought into OFF state.

According to this arrangement, the neighboring power MOS elements in four power MOS elements 21 to 24 are not brought into ON state at the same time. Hence, it is possible to prevent the local accumulation of heat to the extent possible. Further, preferably, it is possible to realize a construction in which the heat of the power MOS elements 21 to 24 can be widely dispersed to the wiring board 40 and can be then dissipated to the island part 50.

Ninth Embodiment

Figure 30:
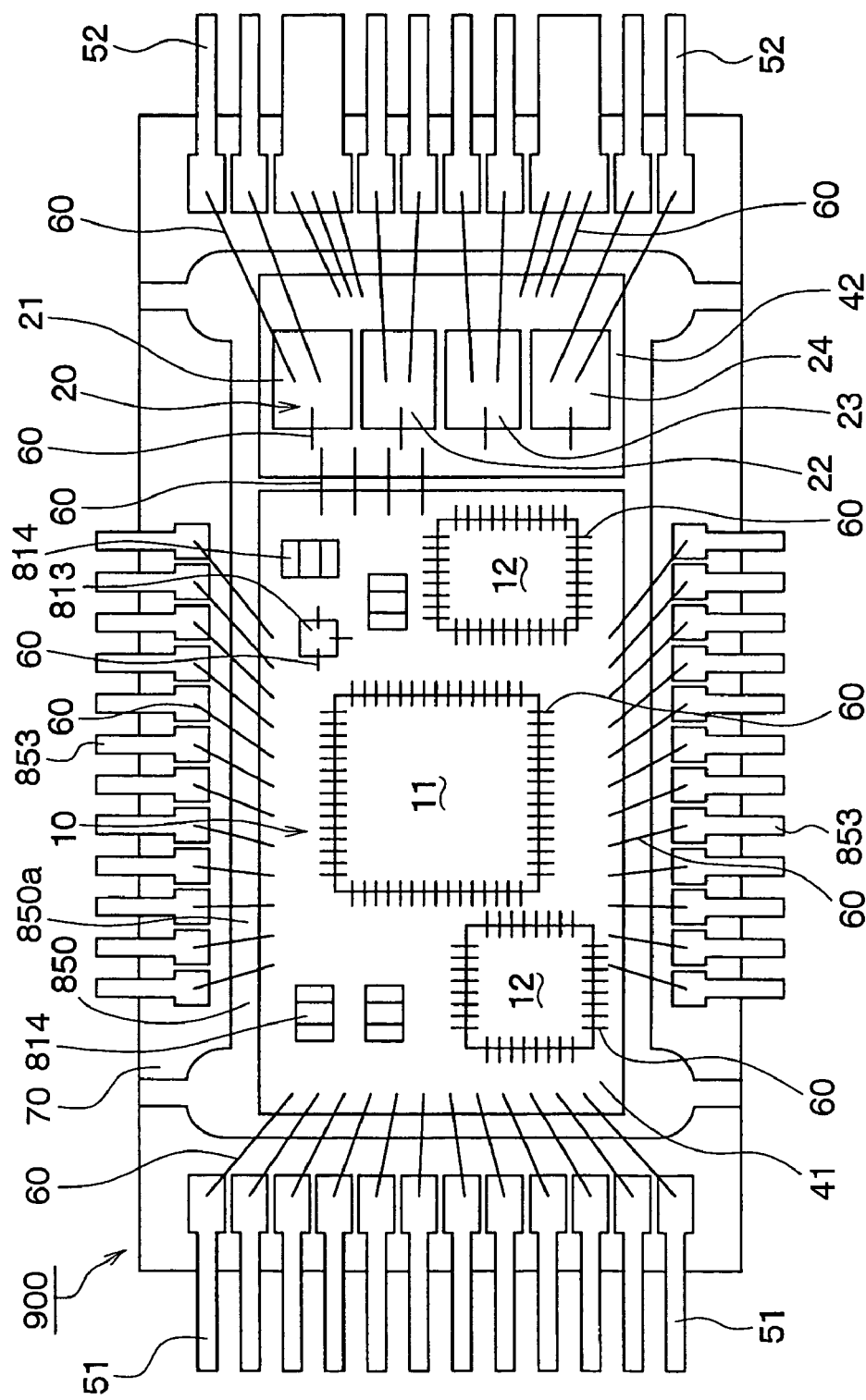
FIG. 30 is a plan view showing an electric device having a control element and a driving element, according to a ninth embodiment of the present invention.

FIG. 30 shows a schematic plan construction of an electronic device 900 provided with the control part 10 and the driving part 20 in accordance with a ninth embodiment of the present invention. Hereafter, different points between this embodiment and the eighth embodiment described above will be mainly described.

In the electronic device of the eighth embodiment, as shown in FIG. 25 and FIG. 26, the control part 10 and the driving part 20 have the common wiring board 40 and the wiring board 40 is mounted on the mounting surface 850a of the island part 850.

In contrast to this, in the electronic device 900 of this embodiment, as shown in FIG. 30, the control part 10 and the driving part 20 have separate different wiring boards 41, 42, respectively.

That is, in this embodiment, the first wiring board 41 and the second wiring board 42 that are separated from each other are mounted on the mounting surface 850a of the island part 850. The control part 10 is constructed of the first wiring board 41 and the driving part 20 is constructed of the second wiring board 42.

In other words, in this embodiment, the control part 10 includes control elements such as microcomputer 11, control IC 12, and transistor 813 and capacitors 814 and is constructed of these electronic elements 11, 12, 813 and 814 and the first wiring board 41 having these electronic elements 11, 12, 813 and 814 mounted thereon.

Further, the driving part 20 includes driving elements such as power MOS element and IGBT and is constructed of these driving elements and the second wiring board 42 having these driving elements mounted thereon.

As shown in FIG. 30, the first wiring board 41 constructing the control part 10 and the second wiring board 42 constructing the driving part 20 are connected and electrically connected to each other by bonding wires 60.

Here, a ceramic laminate board made by laminating three or more layers or a printed wiring board can be adopted as the first wiring board 41. On the other hand, a thick-film wiring board made by a single ceramic layer or by approximately two laminated ceramic layers can be preferably adopted as the second wiring board 42.

Further describing, in the electronic device 900 of this embodiment, it is preferable that the first wiring board 41 is a multilayer board and that the second wiring board 42 is a single-layer board. Further, these first and second wiring boards 41, 42 are alumina boards having excellent heat radiation.

In the electronic device 900, the control part 10 is more complex in construction as compared with the H bridge of the driving part 20. To downsize the device, it is preferable to use a multilayer board, in which wirings and the like can be three-dimensionally constructed, as the first wiring board 41 in the control part 10.

However, when separate wiring boards 41, 42 are used for the control part 10 and the driving part 20, the adoption of multilayer boards for both of the wiring boards 41, 42 results in increasing cost.

In this point, when a multilayer board is used for the first wiring board 41 used for the control part 10 and a single-layer board, which is cheaper than the multilayer board, is used for the second wiring board 42 used for the driving part 20, an advantage is provided in cost.

Further, in this embodiment, the separate wiring boards are used as compared with the first embodiment, but the electric connection between both of the wiring boards 41, 42 is made by the bonding wires 60 to minimize a size increase resulting from using the separate wiring boards.

Still further, in the electronic device 900 of this embodiment, as shown in FIG. 30, the second lead parts 52 are a plurality of parts of different thickness.

In the electronic device 900 of this embodiment, the driving part 20 drives the motor 810 of an actuator and hence has a larger current passed therethrough as compared with the control part 10. For this reason, when parts of the same thickness are used for the second lead parts 52, of the second lead parts 52, lead parts connected to portions, through which large current is passed, need to use many parts.

Here, as shown in FIG. 30, when parts of different thickness are used for the second lead parts, comparatively thick lead parts can be used as lead parts for larger current. For this reason, the lead parts for large current can be reduced in number, which provides an advantage in downsizing the device.

Here, in FIG. 30, lead parts 853 provided along the upper side and the lower side of the island part 850 are lead parts for inspection which have nothing connected thereto when the device is mounted in the actuator.

Further, it is clear that when a plurality of parts of different thickness are used for the second lead parts 52 in the electronic device 800 of the eighth embodiment, there is provided the same advantage.

(Modifications)

By the way, in the above embodiments, descriptions have been provided on the assumption that the electronic device of the invention is applied to the HIC for driving the driving motor of the power window, but it is not intended to limit the usage of the electronic device of the invention to this application.

The invention is such an electronic device provided with the control part and the driving part that is characterized in that: both of these parts are mounted on the mounting surface of the island part; the control part and the driving part are electrically connected to the first lead parts and the second lead parts of the lead frame via the bonding wires; the control part, the driving part, the respective bonding wires, the island part, and the first and second lead parts are molded by the molding resin; and the first and second lead parts are so arranged as to extend in a direction parallel to the mounting surface of the island part 850 and their tips are protruded from the molding resin. Needless to say, the invention can be modified as appropriate in the other points.

Tenth Embodiment

A tenth embodiment of the present invention relates to an electronic device provided with a plurality of connection terminals connected to boding wires and in particular, to an electronic device through which a large current is passed and in which connection terminals are connected to external parts by welding.

Although it is not intended to limit the invention to this application, an electronic device 1000 of this embodiment will be described on the assumption that the electronic device 1000 is applied to a HIC (hybrid integrated circuit) for driving and controlling a motor (see FIG. 28, which will be described later) in the power window of an automobile.

Figure 31:
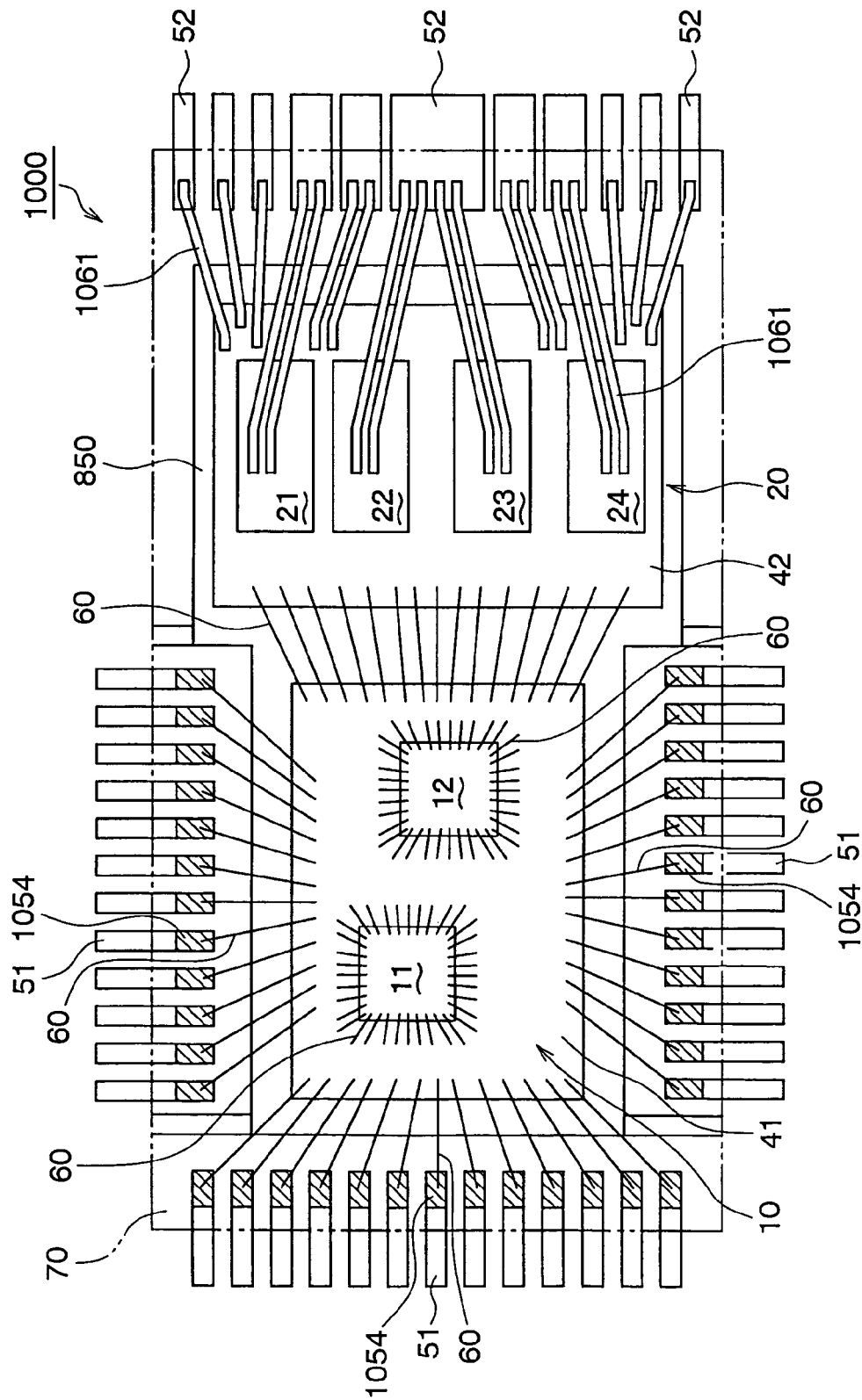
FIG. 31 is a plan view showing an electric device according to a tenth embodiment of the present invention.
Figure 32:
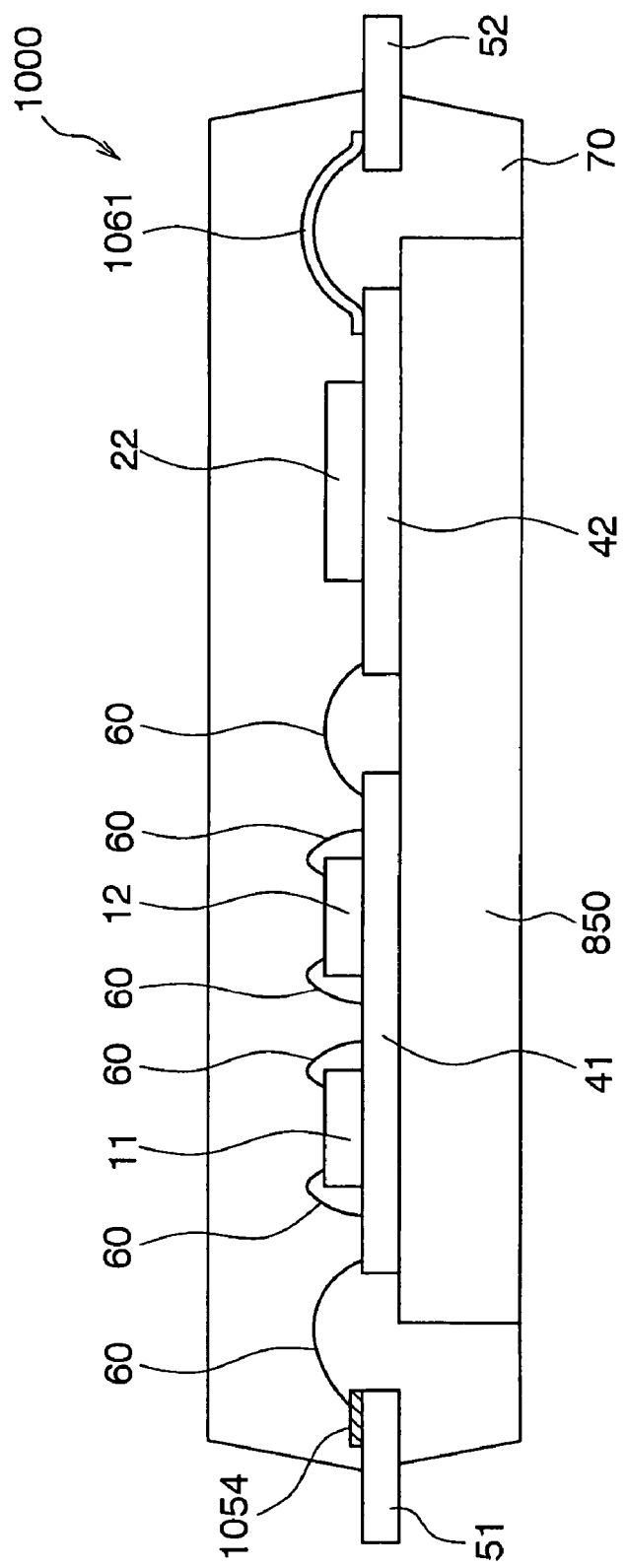
FIG. 32 is a cross sectional view showing the device according to the tenth embodiment.

FIG. 31 is an illustration to show a schematic plan view of the electronic device 1000 in accordance with the first embodiment of the invention. FIG. 32 is an illustration to show a schematic sectional view of the electronic device 1000 shown in FIG. 31. Further, FIGS. 33A and 33B are enlarged sectional views to show the details of connection terminals as the signal terminal and the current terminal 51, 52 in this electronic device 1000.

[Device Construction]

As shown in FIG. 31, the electronic device 1000 of this embodiment is broadly constructed of the first circuit part 10, the second circuit part 20, and a plurality of connection terminals 51, 52 that are connected to the first circuit part as the first electric element 10 and the second circuit part as the second electric element 20 via bonding wires 60, 1061, respectively.

In this embodiment, the first circuit part 10 is constructed as a control part. This first circuit part 10 is provided with the first electronic element including control elements such as a microcomputer 11 and a control IC 12. The first circuit part 10 is constructed of these first electronic elements 11, 12 and the first wiring board 41 on which these electronic elements 11, 12 are mounted.

In this regard, the control elements 11, 12 are formed by using a semiconductor process to a semiconductor board (semiconductor chip) such as silicon semiconductor board.

In this embodiment, the second circuit part 20 is constructed as a driving part controlled by the first circuit part 10 as the control part. The second circuit part 20 is provided with the second electronic elements of driving elements such as power MOS elements 21, 22, 23, 24 and IBGT. The second circuit part 20 is constructed of these second electronic elements 21 to 24 and the second wiring board 42 on which these elements are mounted.

The second electronic elements 21 to 24 constructing the second circuit part 20 are power elements each of which has larger current passed therethrough as compared with the first electronic elements 11, 12 to generate large heat. For this reason, the second circuit part 20 has a larger current passed therethrough as compared with first circuit part 10.

In this embodiment, the second electronic elements constructing the second circuit part 20 are constructed of four power MOS elements 21, 22, 23, 24 as power elements. These power MOS elements 21, to 24 as power elements and driving elements are controlled by the control elements 11, 12 constructing the first circuit part 10.

The respective electronic elements 11, 12, 21 to 24 constructing the respective circuit parts 10, 20, as shown in FIG. 31 and FIG. 32, are mounted on the respective wiring boards 41, 42 by bonding wires 60 and bonding members (not shown).

Here, the construction of the respective elements 11, 12, and 21 to 24 in the first circuit part 10 and the second circuit part 20 as shown in FIG. 31 and FIG. 32 is shown only as one example and the constructions of the first circuit part 10 and the second circuit part 20 is not limited to the example shown in these drawings.

In this manner, in the electronic device 1000 of this embodiment, the first circuit part 10 and the second circuit part 20 have separate different wiring boards 41, 42, respectively. As shown in FIG. 31 and FIG. 32, the first wiring board 41 and the second wiring board 42, which are separated from each other, are mounted on the island part 850 of a lead frame.

Here, the respective wiring boards 41, 42 are fixed to the island part 850 via an adhesive made of resin (not shown) having electric insulation and excellent thermal conductivity. The first wiring board 41 and the second wiring board 42 are connected and electrically connected to each other by bonding wirings 31.

Here, a ceramic laminate board formed of three or more laminated layers or a printed wiring board can be adopted as the first wiring board 41. On the other hand, a thick-film wiring board formed of a single-layer or approximately two ceramic laminated layers can be preferably adopted as the second wiring board 42.

Further, it is preferable in the electronic device 1000 of this embodiment that a multilayer board is adopted as the first wiring board 41 constructing the first circuit part 10 and that a single-layer board is adopted as the second wiring board 42 constructing the second circuit part 20.

Still further, an alumina board excellent in heat radiation is preferably used as the materials of these first and second wiring boards 41, 42. To be more specific, an alumna laminate board that can have high packing density can be used as the first wiring board 41 and a thick single-layer alumina board that can be manufactured at comparatively low cost can be used as the second wiring board 42.

FIGS. 34A and 34B are schematic sectional views to show the detailed constructions of the respective wiring boards 41, 42. FIG. 34A shows the first wiring board 41 as a multilayer board and FIG. 34B shows the second wiring board 42 as a single-layer board.

In this electronic device 1000, the first circuit part 10 as the control part has a more complex construction as compared with the second circuit part 20 as the driving part. Hence-, to downsize the device, it is preferable to use a multilayer board, in which wirings can be three-dimensionally constructed, as the first wiring board 41 in the first circuit part 10.

However, when separate different wiring boards 41, 42 are used for the first circuit part 10 and the second circuit part 20, the adoption of multilayer boards for both of the wiring boards 41, 42 leads to cost increase.

In this point, when the first wiring board 41 used for the first circuit part 10 as the control part is made of a multilayer board and the second wiring board 42 used for the second circuit part 20 as the driving part is made of a single-layer board, which is inexpensive as compared with the multilayer board, there is provided an advantage in cost.

Further, while the separate wiring boards are used in this embodiment, both of the wiring boards 41, 42 are electrically connected by bonding wirings 31 to minimize upsizing of the device resulting from using the separate wiring boards.

In particular, in this embodiment, the electric connection between both of the wiring boards 41, 42 are made by comparatively thin binding wires 60 made of Au. Hence, this can more effectively minimize upsizing of the device.

Further, as shown in FIG. 31 and FIG. 32, a plurality of connection terminals 51, 52 are arranged around the island part 850 of the lead frame. Here, the connection terminals 51, 52 can be formed together with the island part 850 by the use of a usual lead frame made of Cu (copper), Fe (iron), or 42 alloy.

Here, it is assumed that, of the plurality of connection terminals 51, 52, the connection terminals 51 connected and electrically connected to the first circuit part 10 by the binding wires 60 are the first connection terminals 51 and that the connection terminals 52 connected and electrically connected to the second circuit part 20 by the binding wires 1061 are the second connection terminals 52.

For the first connection terminals 51, Au wires 60 made of Au (gold) are used as the bonding wires 60, and for the second connection terminals 52, Al wires 1061, which are made of Al (aluminum) and thicker than the Au wires 60, are used as the bonding wires 1061.

Here, the diameter of the Al wire 1061 is, for example, from 250 μm to 500 μm and the diameter of the Au wire 60 is, for example, from 20 μm to 30 μm. The Al wires 1061 are formed by, for example, a wedge bonding method and the Au wires 60 are formed by, for example, a ball bonding method.

Here, in the electronic device 1000 of this embodiment, as shown in FIG. 33A, the first connection terminal 51 connected to the Au wire 60 has a nonelectrolytic Ni plated film 1053 on the whole surface and has a Ag plated film 1054 as the uppermost layer on the nonelectrolytic Ni plated film 1053 at a connection part connected to the Au wire 60.

Further, as shown in FIG. 33B, the second connection terminal 52 connected to the Al wire 1061 has a nonelectrolytic Ni plated film 1053 on the whole surface.

As described above, these connection terminals 51, 52 can be formed of a lead frame. Cu, Fe, or 42 alloy is used as a base material and various plated films 1053, 1054 described above are formed on the surface of the base material.

In this regard, in FIG. 31 and FIG. 32, the nonelectrolytic plated film 1053 is not shown but Ag plated films 1054 in the first connection terminal 51 are shown. In FIG. 31, the Ag plated films 1054 are shown in hatch areas so as to facilitate identification but, needless to say, these areas do not show sections.

Further, for example, the first connection terminals 51 connected to the first circuit part 10 function as signal terminals of the control elements 11, 12 and the second connection terminals 52 connected to the second circuit part 20 function as current terminals of the driving elements 21 to 24 or connection terminals connected to the motor (see FIG. 28) so as to drive the motor.

Still further, as shown in FIG. 34A, in the first wiring board 41 as the multilayer board such as alumina laminate board, a pad 1043 connected to the Au wire 60 is formed on a wiring 1044 which is formed on the first wiring board 41 and is made of Cu. This pad 1043 is made of an Au plated film formed on the wiring 1044. This structure of bonding the pad 1043 made of the Au plated film to the Au wire 60 provides high bonding reliability.

Still further, as shown in FIG. 34B, in the second wiring board 42 as the single-layer board such as thick single-layer alumina board, a pad 1045 connected to the Au wire 60 is formed of a Ag—Pt (alloy of silver and platinum) film formed on the second wiring board 42.

On the other hand, as shown in FIG. 34B, in the second wiring board 42, a pad 1047 connected to the Al wire 1061 is formed of a Ag—Pt conductive film or a Ag—Pd (alloy of silver and palladium) conductive film. Here, this pad 1047 is formed of a film made by laminating a Ag—Pt film 1048 and a Ag—Pd film 1046 in sequence on the second wiring board 42.

The connection between the Ag—Pt conductive film or the Ag—Pd conductive film and the nonelectrolytic Ni plated film is a structure suitable for Al thick wire bonding and can secure a large current passage.

In this manner, in the respective wiring boards 41, 42, the adoption of the above-described construction of the pads can secure the suitable bonding of the pads 1043, 1045, 1047 to the Au wires 60 and the Al wires 1061.

As shown in FIG. 31 and FIG. 32, in the electronic device 1000, the connection parts to the boding wires 60, 1061 in the first circuit part 10, the second circuit part 20, the respective bonding wires 60, 1061, the island part 850, and the first and second connection terminals 51, 52 are molded by molding resin 70.

Here, as shown in FIG. 32, of the island part 850, a bottom surface opposite to a top surface having both circuit parts 10, 20 mounted thereon, that is, a mounting surface, is exposed from the molding resin 70. With this construction, heat generated in the electronic device 1000 is radiated from this exposed portion of the island part 850 to the outside, whereby heat radiation of the device can be improved.

Hence, the island part 850 in the electronic device 1000 has also a function as a heat sink.

Here, this island part 850 may be formed integrally with the lead frame, as shown in FIG. 31, but may be formed by preparing a heat sink separate from the lead frame and by fixing the heat sink to the lead frame by caulking or welding.

That is, the island part 850 in this embodiment includes also a heat sink or a heat radiating plate made of Cu, Fe, or Al and commonly used for a semiconductor device.

These island part, heat sink, and heat radiating plate of the lead frame function not only as a part mounting member in the device but also as a heat radiating member.

Further, this electronic device 1000 is mounted in the driving unit of the power window. For example, in the electronic device 1000, the first wiring board 41 and the second wiring board 42 protruding from the molding resin 70 are electrically connected to the connector and the motor (see FIG. 28) of the driving device, respectively.

The connection between the first connection terminal 51 and the connector and the connection between the second connection terminal 52 and the motor are made by welding. In this manner, the electronic device 1000 mounted in the driving unit drives and controls the motor.

The electronic device 1000 like this can be manufactured by: preparing a lead frame plated with materials described above; mounting the respective wiring boards 41, 42 mounted with the respective electronic elements 11, 12, and 21 to 24 on the mounting surface of the island pat 40; bonding the respective electronic elements 11, 12, and 21 to 24 to the connection terminals 51, 52 arranged around the island part 850 by the Au wires 60 and the Al wires 1061; and molding this assembly with resin.

[Circuit Construction and Operation]

The circuit construction and the like of the electronic device 1000 of this embodiment will be described with reference to FIG. 28 and FIGS. 29A to 29D. FIG. 28 is a schematic circuit construction of this electronic device 1000. FIGS. 29A to 29D shows ON/OFF states of gate input of the respective power MOS elements 21 to 24 in the operating state of the motor in FIG. 28.

In the circuit construction shown in this FIG. 28, the first circuit part 10 as the control part is mainly constructed of the microcomputer 11 and the control IC 12 including a control circuit 13, a driving circuit 14, and a comparator 15. The second circuit part 20 as the driving part is constructed of four power MOS elements 21 to 24.

Here, four power MOS elements 21 to 24 construct an H bridge circuit. Further, in the electronic device 1000, there are provided the above-described motor 810 for driving the window glass and the electric power source 860 of the device.

In the electronic device 1000 like this, an instruction is transmitted to the microcomputer 1 from a microcomputer (not shown) by communications (for example, LIN) and the microcomputer 11 controls the respective power MOS elements 21 to 24 via the control circuit 13 and the driving circuit 14 according to the instruction. The output of the driving circuit 14 is inputted to the gates of the respective power MOS elements 21 to 24.

Here, it is the motor 810 that moves up and down the window glass of the vehicle and the states of gate inputs at the times when the motor is stopped, when the window glass is moved up, and when the window glass is moved down, are shown in FIGS. 29A to 29D.

That is, as shown in FIGS. 29A to 29D, when the motor is stopped, all of the four power MOS elements 21 to 24 are brought into OFF state and when the window glass is moved up, two power MOS elements 21, 23 located on one diagonal in the H bridge circuit are brought into ON state whereas two power MOS elements 22, 24 located on the other diagonal are brought into OFF state.

Further, when the window glass is moved down, two power MOS elements 21, 23 located on one diagonal in the H bridge circuit are brought into OFF state whereas two power MOS elements 22, 24 located on the other diagonal are brought into ON state. In other words, when the window is moved up and when the window is moved down, current passing through the motor 810 is reversed by the H bridge circuit and hence the motor 810 is also reversely rotated.

Still further, the comparator 15 compares motor rotation information detected by, for example, a Hall sensor (not shown) with the command of the microcomputer 11 and feeds back a signal to the control circuit 13 according to conditions. With this, more suitable control can be performed.

[Effects]

By the way, according to this embodiment, there is provided the electronic device 1000 that is provided with the first circuit part 10, the second circuit part 20, and the plurality of connection terminals 51, 52 connected to the first circuit part 10 and the second circuit part 20 via the bonding wires 60, 1061, and is characterized by the following points.

Of the plurality of connection terminals 51, 52, for the first connection terminals 51 connected to the first circuit part 10, the. Au wires 60 made of Au are used as the bonding wires, and for the second connection terminals 52 connected to the second circuit part 20, the Al wires 1061 which are thicker than the Au wires 60 and are made of Al are used as the bonding wires.

Each of the first connection terminals 51 has the nonelectrolytic Ni plated film on the surface and has the Ag plated film as the uppermost layer on the nonelectrolytic Ni plated film on the connection part connected to the Au wire 60. Each of the second connection terminals 52 has the nonelectrolytic Ni plated film on the surface.

According to the electronic device 1000 of this embodiment characterized by these points, both of the first connection terminals 51 and the second connection terminals 52 have the nonelectrolytic Ni plated films on the surfaces and hence can be suitably connected to external parts by welding.

Further, in each of the first connection terminals 51, the surface of connection part connected to the Au wire 60 is plated with Ag and hence the Au wire 60 can be suitably bonded to the surface. In each of the second connection terminals 52, its surface is nonelectrolytically plated with Ni and hence the Al wire 1061 can be suitably bonded to the surface.

The comparatively thin Au wires 60 can be used for connecting the first connection terminals 51, which are readily required to be made multiple pins because of comparatively small current, to the first circuit part 10. The comparatively thick Al wires 1061 can be used for connecting the second connection terminals 52, each of which has a large current passed therethrough, to the second circuit part 20. In other words, it is possible to realize the construction of connection terminals corresponding to the usage of the wires.

Therefore, according to this embodiment, in the electronic device provided with the plurality of connection terminals 51, 52 which are connected to the bonding wires 60, 1061 and are connected to external parts by welding, it is possible to increase current and to increase the connection terminals in number, that is, to make multiple pins in an appropriate manner when required.

Further, according to this embodiment, the Au wire 60 of thin Au wire and the Al wire 1061 of thick Al wire are properly used according to usage, so that it is possible to use a mounting space efficiently.

Still further, since materials with which the lead frame is plated can be properly used at the time of forming the connection terminals 51, 52, it is possible to prevent an increase in the number of parts.

Still further, referring to the bonding of the Al wires 1061 and the Au wires 60 to the connection terminals, the thick Al wires 1061 are bonded to the nonelectrolytic Ni plated films, so that the level of bonding of the Al wires 1061 to the connection terminals is the same as ever and is not lower than ever.

Still further, since the Au thin wires are bonded to the Ag plated films, the level of bonding of the Al wires 1061 to the connection terminals is the same as that in conventional monolithic IC and is not lower-than that.

Still further, as described above, in the electronic device 1000 of this embodiment, the second circuit part 20 is provided with the second electronic elements 21, 22, 23, 24 each of which has larger current passed therethrough, as compared with each of the first electronic elements 11, 12 constructing the first circuit part 10, to generate large heat.

To be more specific, the first electronic elements are control elements 11, 12 and the second electronic elements are driving elements 21 to 24 controlled by the control elements 11, 12. With this, the second circuit part 20 has larger current passed therethrough as compared with the first circuit part 10.

Further, as described above, this embodiment is also characterized in that: the first circuit part 10 and the second circuit part 20 are respectively provided with the first wiring board 41 and the second wiring board 42, which are separate and different from each other; the first electronic elements 11, 12 are mounted on the first wiring board 41; and the second electronic elements 21 to 24 are mounted on the second wiring board 42.

In this embodiment, the first wiring board 41 and the second wiring board 42 are mounted on the island part 850, respectively. Further, as described above, the first wiring board 41 is made of a multilayer board and the second wiring board 42 is made of a single-layer board, which provides an advantage in the cost of board.

Further, as described above, in the electronic device 1000 of this embodiment, the diameter of Al wire 1061 can be from 250 μm to 500 μm and the diameter of Au wire 60 can be from 20 μm to 30 μm. Wires of these sizes are used as the Al thick wire and the Au thin wire.

Still further, as described above, in the semiconductor device 1000 of this embodiment, when the motor is stopped, all of four power MOS elements 21 to 24 which construct an H bridge circuit are brought into OFF state and when the window glass is moved up (or down), two power MOS elements 21, 23 are brought into ON state (OFF state, when the window glass is moved down) and two power MOS elements 22, 24 are brought into OFF state (ON state, when the window glass is moved down).

In view of operating conditions like this, in this semiconductor device 1000, as shown in FIG. 31, four power MOS elements 21 to 24 are arranged in such a way that neighboring power elements are not brought into ON state at the same time.

In other words, as shown in FIG. 31, the power MOS elements that are brought into ON state (OFF state) when the window is moved up (when the window is moved down) and the power MOS elements that are brought into OFF state (ON state) when the window is moved up (when the window is moved down) are alternately arranged.

Further referring to this arrangement of the power MOS elements, in this embodiment, four power MOS elements 21 to 24 are arranged in such a way that: when at least one of four power MOS elements 21 to 24 is brought into ON state, at the same time, one of the neighboring power MOS elements is brought into ON state and the other is brought into OFF state.

According to this arrangement, the neighboring power MOS elements in four power MOS elements 21 to 24 are not brought into ON state at the same time. Therefore, it is possible to prevent the local accumulation of heat to the extent possible. Further, preferably, it is possible to realize a construction in which the heat of the power MOS elements 21 to 24 can be widely dispersed to the second wiring board 42 and can be then dissipated to the island part 850.

Eleventh Embodiment

Figure 35:
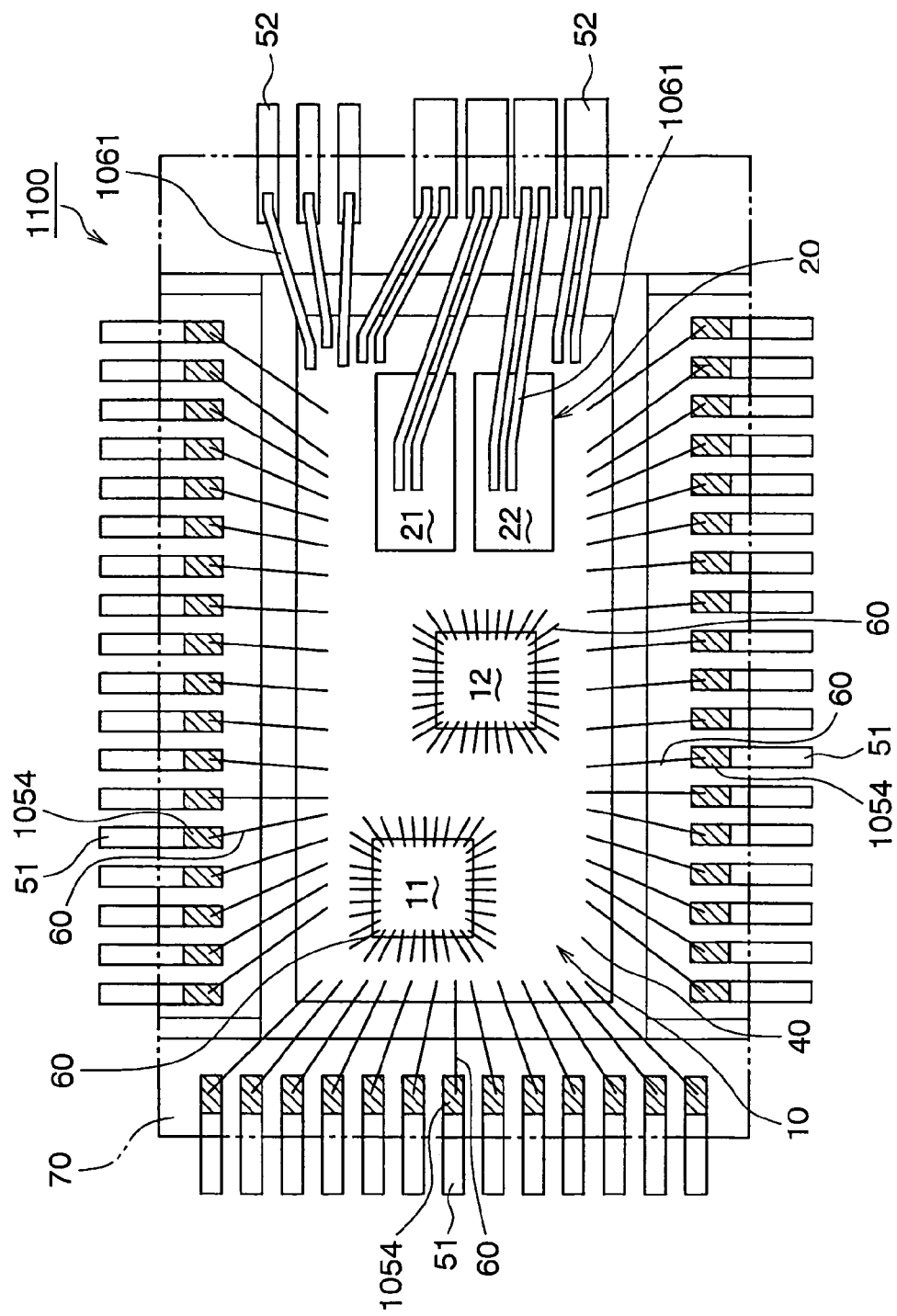
FIG. 35 is a plan view showing an electric device according to an eleventh embodiment of the present invention.

FIG. 35 shows a schematic plan construction of an electronic device 1100 in accordance with an eleventh embodiment of the present invention. Hereafter, different points between this embodiment and the tenth embodiment described above will be mainly described.

In the electronic device 1000 of the tenth embodiment, as shown in FIG. 31 and FIG. 32, the first circuit part 10 and the second circuit part 20 have separate different wiring boards 41, 42, respectively, and these wiring boards 41, 42 are mounted on the mounting surface of the island part 850.

In contrast to this, in the electronic device 1100 of this embodiment, the first circuit part 10 and the second circuit part 20 have a common wiring board 40 and this wiring board 40 is mounted on the mounting surface of the island part 850. The first electronic elements 11, 12 and the second electronic elements 21 to 24 are mounted on the wiring board 40.

This wiring board 40 is also fixed to the mounting surface of the island part 850 via an adhesive made of resin having electric insulation and excellent thermal conductivity. As this wiring board 40, a ceramic laminate board formed of a single layer or a plurality of laminated layers, or a printed wiring board can be used.

In this embodiment, the first circuit part 10 is constructed of the first electronic elements 11, 12 and the wiring board 40 having these electronic elements 11, 12 mounted thereon. The second circuit part 20 is constructed of the second electronic elements 21, 22 and the wiring board 40 having these electronic elements 21, 22 mounted thereon.

Here, also in this embodiment, as is the case with the electronic device (see FIG. 31) shown in the first embodiment, four power MOS elements are provided and form an H bridge circuit. However, in FIG. 35, two power MOS elements 21, 22 of four elements are shown and remaining two elements are not shown.

Further, in this embodiment, as for the construction of connection parts connected to wires 60, 1061 in this common wiring board 40, the construction of pads shown in FIGS. 34A and 34B can be adopted when this wiring board 40 is a multilayer board or when this wiring board 40 is a single-layer board.

According to the electronic device 1100 of this embodiment, as is the case with the electronic device 1000 of the tenth embodiment, in the electronic device provided with the plurality of connection terminals 51, 52 which are connected to the bonding wires 60, 1061 and are connected to external parts by welding, it is possible to increase current and to increase the connection terminals in number, that is, to make multiple pins in an appropriate manner when required.

Twelfth Embodiment

In the respective above embodiments, as shown in FIG. 31 and FIG. 35, applications of the invention to the electronic device provided with the plurality of elements 11, 12, and 21 to 24 have been described.

Here, the invention can be applied also to an electronic device provided with one element, that is, the so-called one-chip electronic device.

Figure 36:
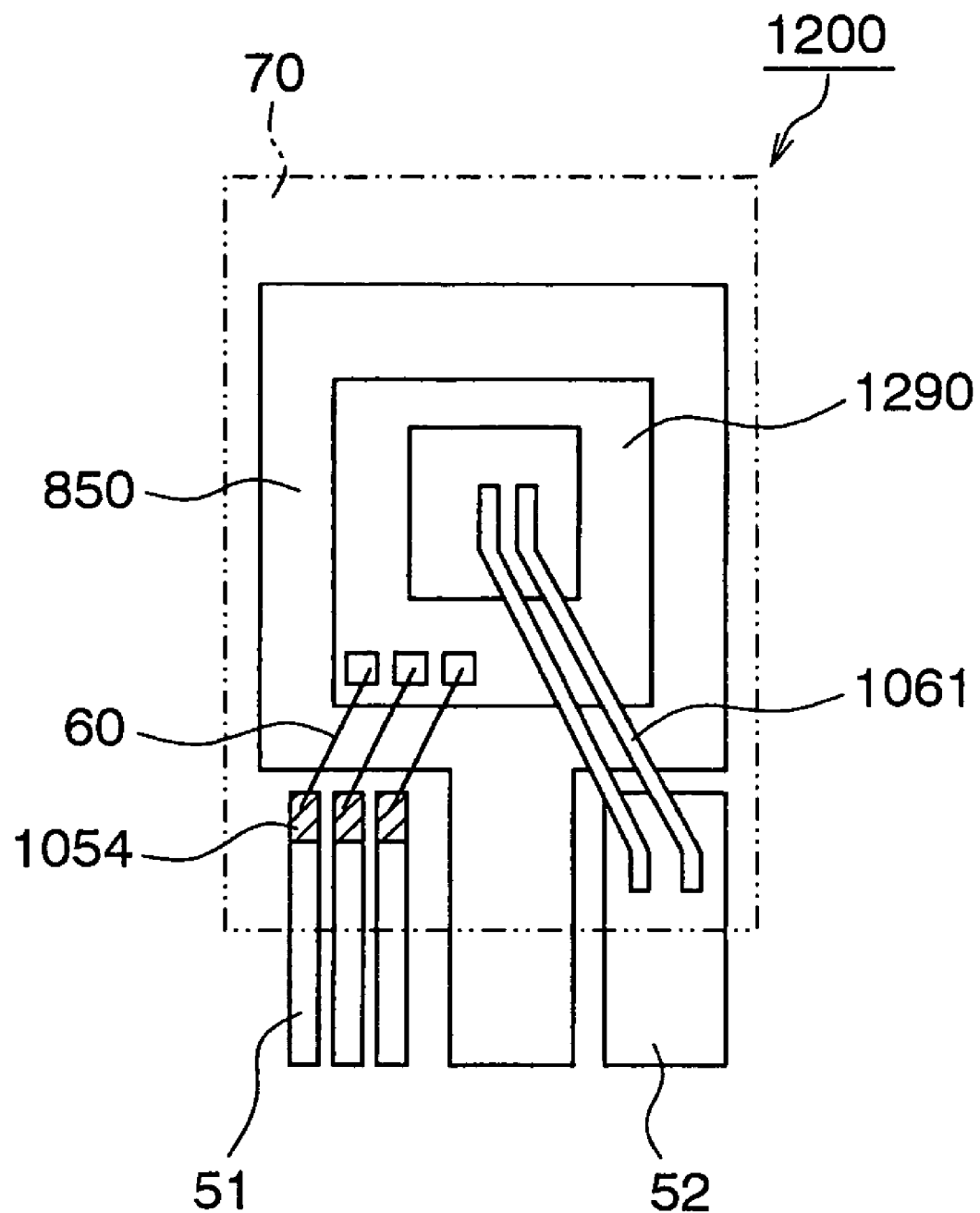
FIG. 36 is a plan view showing an electric device according to a twelfth embodiment of the present invention.

FIG. 36 shows a schematic plan construction of an electronic device 1200 in accordance with a twelfth embodiment of the present invention. Hereafter, different points between this embodiment and the respective above embodiments will be mainly described.

In this electronic device 1200, only one electronic element 1290 is mounted on the mounting surface of the island part 850. As this electronic element 1290 can be adopted, for example, an intelligent power MOSFET element in which a circuit part is highly integrated in one semiconductor chip.

The first connection terminal 51 and the second connection terminal 52 are provided around this electronic element 1290 and Au wires 60 are bonded to the first connection terminals 51 and Al wires 1061 are bonded to the second connection terminals 52.

By the way, what is commonly said for this embodiment and the respective above embodiments is that in the electronic devices 1000, 1100, 1200 each of which is provided with the plurality of connection terminals 51, 52 connected to the bonding wires 60, 1061, there are provided the electronic devices 1000, 1100, 1200 characterized by the following points.

The bonding wires 60, 1061 are constructed of Au wires 60 made of Au and Al wires 1061 which are thicker than the Au wires 60 and made of Al. The plurality of connection terminals 51, 52 are constructed-of the first connection terminals 51 connected to the Au wires 60 and the second connection terminals 52 connected to the Al wires 1061, respectively.

Each of the first connection terminals 51 has the nonelectrolytic Ni plated film on the surface and has the Ag plated film as the uppermost layer on the nonelectrolytic Ni plated film at the connection part connected to the Au wire 60. Each of the second connection terminals 52 has the nonelectrolytic Ni plated film on the surface (see FIGS. 33A and 33B).

According to the electronic devices 1000, 1100, 1200 characterized by these points, the first connection terminals 51 and the second connection terminals 52 have the nonelectrolytic Ni plated films on the surfaces, respectively, and hence can be suitably connected to external parts by welding.

Further, in each of the first connection terminals 51, the surface of connection part connected to the Au wire 60 is plated with Ag and hence the Au wire 60 can be suitably bonded to the surface. Each of the second connection terminals 52 has the nonelectrolytic Ni plated Ni film on the substantially whole surface and hence the Al wire 1061 can be suitably bonded to the surface.

At any rate, also in this embodiment, as is the case with the above embodiments, there are provided the first connection terminals 51 for the Au wires 60, which are comparatively thin and are suitable for multiple pins, and the second connection terminals 52 for the Al wires 1061 which are comparatively thick and suitable for passing a large current. Therefore, it is possible to realize the construction of connection terminals corresponding to the usage of the wires.

Therefore, according to this embodiment, in the electronic device provided with the plurality of connection terminals 51, 52 which are connected to the bonding wires 60, 1061 and are connected to external parts by welding, it is possible to increase current and to increase the connection terminals in number, that is, to make multiple pins in an appropriate manner when required.

(Modifications)

In the above embodiments, the first circuit part is the control part and the second circuit part is the driving part controlled by the first circuit part, but it is essential only that the second circuit part has a larger current passed therethrough as compared with the first circuit part.

Further, as shown in the twelfth embodiment, even when an electronic device is constructed of one chip, to sum up, and when the electronic device is constructed of bonding wires, which are constructed of the comparatively thin Au wires and the comparative thick Al wires, and connection terminals, which are constructed of the first connection terminals for the Au wires and the second connection terminals for the Al wires, the invention can be applied to the electronic device.

Further, while the electronic device of the invention has been described in the respective embodiments on the assumption that the device is applied to the HIC for driving the driving motor of the power window, needless to say, the application of the electronic device of the invention is not limited to the HIC.

The invention is such an electronic device provided with a plurality of connection terminals connected to bonding wires that is characterized in that: bonding wires are constructed of Au wires and Al wires thicker than the Au wires; the plurality of connection terminals are constructed of the first connection terminals connected to the Au wires and the second connection terminals connected to the Al wires; each of the first connection terminals has a nonelectrolytic Ni plated film on the surface and has a Ag plated film as an uppermost layer on the nonelectrolytic Ni plated film at a connection part connected to the Au wire; and each of the second connection terminals has a nonelectrolytic Ni plated film on the surface. Needless to say, the invention can be modified as appropriate in the other points.

Thirteenth Embodiment

A thirteenth embodiment of the present invention relates to an electronic device including a heat sink, electronic elements mounted on the top surface of the heat sink, a lead frame provided around the electronic elements, and molding resin that molds almost the whole device in such a way as to expose the bottom surface of the heat sink, and a method for manufacturing the electronic device.

Figure 39A:
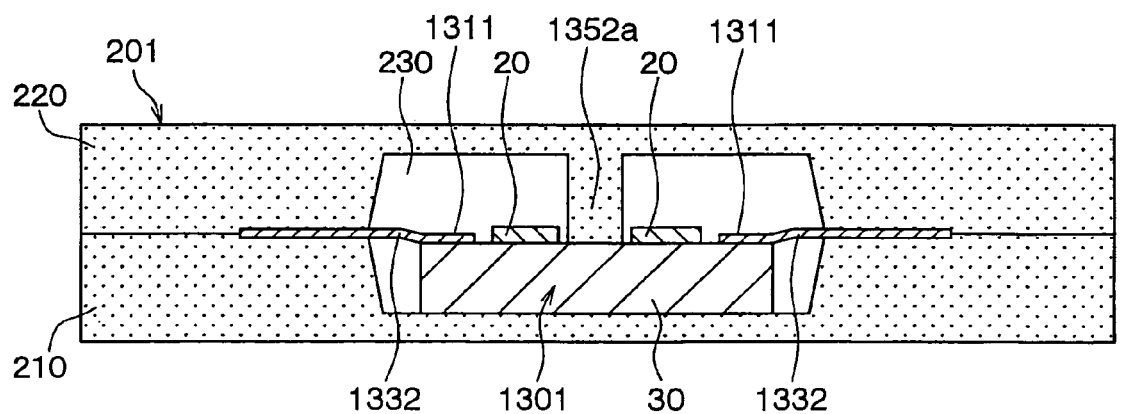
FIG. 39A is a cross sectional view explaining a molding process in a method for manufacturing an electric device.
Figure 39B:
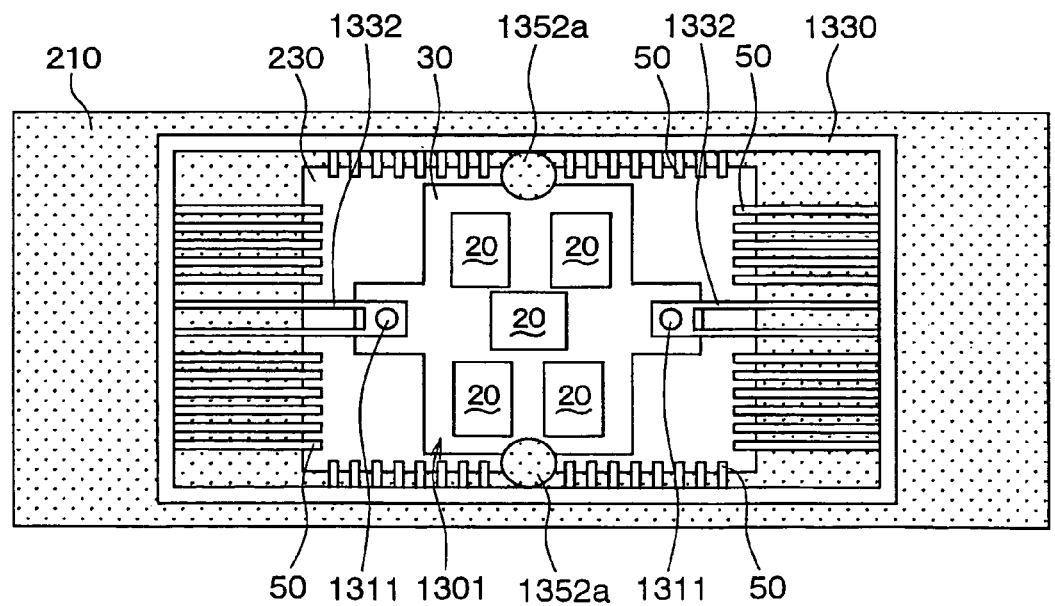
FIG. 39B is a plan view explaining the molding process, according to a comparison of the thirteenth embodiment.

FIGS. 39A and 39B are illustrations to specifically show a molding process using a mold as a case 200 in a manufacturing method as a comparison. FIG. 39A is a schematic sectional view and FIG. 39B is a top view in FIG. 39A. Here, in FIG. 39B, as for a top mold 220, only a portion of the top mold, that is, a pressing portion 1352a is shown.

As shown in FIGS. 39A and 39B, in the mold 201, a top mold 220 is mated with a bottom mold to form a cavity 230 corresponding to the shape of molding resin.

In this cavity 230 is placed an integrated part 101 made by mounting electronic elements 20 on the top surface of a heat sink 30 and by arranging a lead frame 1330 around the electronic elements 20 and by bonding the heat sink 30 to the suspending leads 1332 of the lead frame 1330.

The bonding portion 1311 of bonding the heat sink 30 to the suspending leads 1332 is formed by caulking or welding, but it is also recommended that the heat sink 30 and the lead frame 1330 be integrally formed to form the bonding portions 1311.

Further, the bottom surface of the heat sink 30 is exposed from the molding resin after molding the resin so as to enhance heat radiation of the electronic device.

To expose the bottom surface of the heat sink 30, in the cavity 230, the top mold 220 of the mold 201 has the pressing portion 1352a and the pressing portion 1352a presses a portion of the top surface of the heat sink 30 to press the bottom surface of the heat sink 30 to the bottom mold 210 of the mold 201.

Molding resin is poured into the cavity 230 in this state to prevent the resin from going around to the bottom surface of the heat sink 30 to expose the bottom surface of the heat sink 30 from the molding resin after molding.

By the way, according to the comparison manufacturing method like this, a portion of top surface of the heat sink 30, that is, a portion of mounting surface where the electronic elements 20 are mounted in the heat sink 30 is pressed by the pressing portion 1352a of the mold 201.

For this reason, a portion pressed by the pressing portion 1352a of the mounting surface of the heat sink 30 becomes dead space to limit space for mounting the electronic element 20. This prevents high package density and increases the size and cost of the device.

In this regard, it is also thought to press such a bonding portion 1311 of the heat sink 30 and the suspending lead 1332 that is not related to space for mounting the electronic element 20 in the heat sink 30. However, in this case, there is a possibility that the bonding portion 1311 is displaced by the pressing force to displace the lead frame 1330 with respect to the heat sink 30. Hence, in the conventional method, a portion of top surface of the heat sink 30 is pressed by the pressing portion 1352a.

In view of the above problem, an electronic device 1300 according to a thirteenth embodiment of the present invention is provided.

Figure 37A:
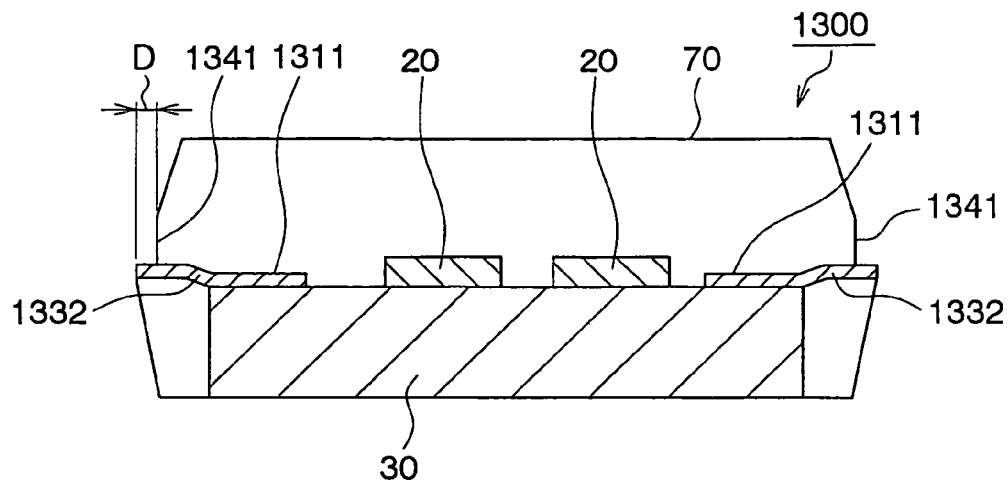
FIG. 37A is a cross sectional view showing an electric device.
Figure 37B:
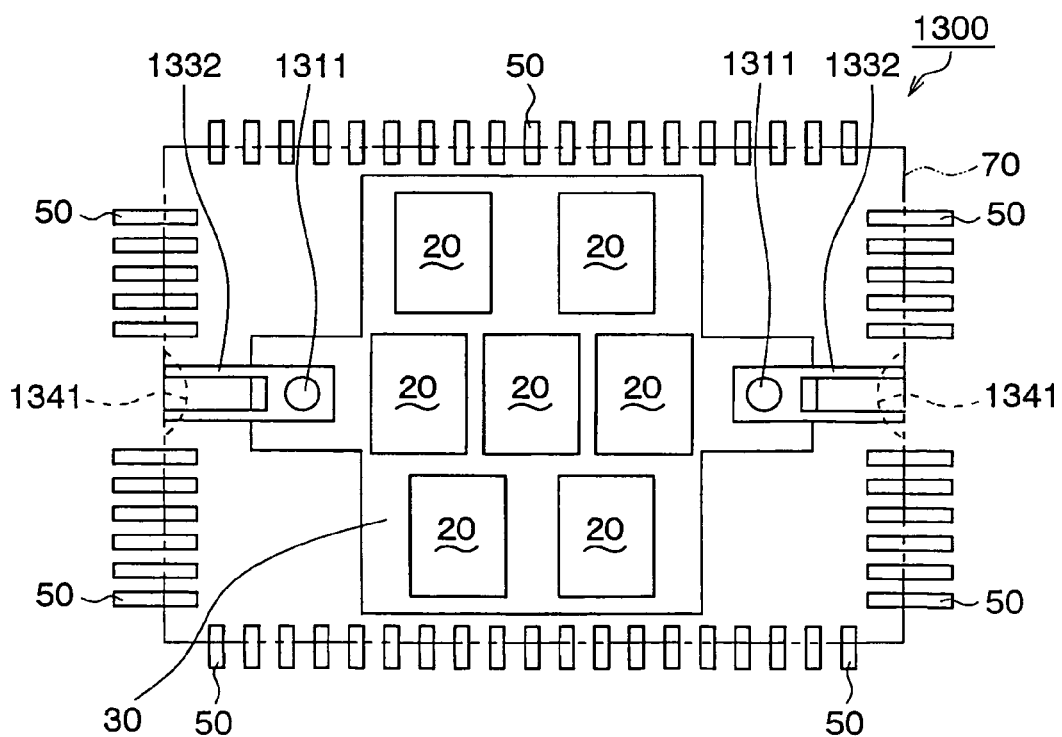
FIG. 37B is a plan view showing the device according to a thirteenth embodiment of the present invention.

FIGS. 37A and 37B are illustrations to show a schematic construction of the electronic device 1300 in accordance with the thirteenth embodiment. FIG. 37A is a schematic sectional view and FIG. 37B is a top view in FIG. 37A. Here, in FIG. 37A and FIG. 37B, bonding wires are omitted. In FIG. 37B, the outside shape of molding resin 70 is shown by broken line.

Although it is not intended to limit the invention to this application, an electronic device 1300 of this embodiment can be applied to a HIC (hybrid IC, hybrid integrated circuit) for driving the driving motor of power window of an automobile.

[Device Construction]

In this electronic device 1300, a heat sink 30 is made of, for example, Cu (copper) or iron-based metal having excellent heat radiation and is formed by pressing or cutting in the shape of a flat plate.

Electronic elements 20 are mounted on the top surface of the heat sink 30. In FIG. 37B, seven electronic elements 20 are mounted. These electronic elements 20 are semiconductor chips such as heating element and temperature-limited element or other surface-mount components, although it is not intended to limit the electronic elements to these.

Here, the heating element is an electronic element that generates heat under a large operating current and has a larger current passed therethrough, as compared with the temperature-limited element, to generate heat. To be specific, the heating element includes a power element such as power MOS element and IGBT (insulation gate type bipolar transistor) element or resistor.

Further, the temperature-limited element is an electronic element limited in operating temperature. To be specific, the temperature-limited element includes a microcomputer or a control IC. These heating element and temperature-limited element are formed on a semiconductor substrate (semiconductor chip) such as silicon semiconductor by a semiconductor process in the form of elements and wiring such as transistor and resistor.

These electronic elements 20 are fixed to the top surface of the heat sink 30 by an adhesive made of resin having electric insulation and excellent thermal conductivity or by a die bonding material such as-silver paste.

In this regard, these electronic elements 20 may not be directly mounted on the top surface of the heat sink 30 but a mode may be adopted in which the electronic elements 20 are mounted on a wiring board and in which the wiring board is mounted on the top surface of the heat sink 30.

In this case, for example, a ceramic wiring board of a single layer or a plurality of laminated layers or a printed wiring board can be adopted as the wiring board, although it is not intended to limit the wiring board to these boards.

Further, as shown in FIG. 37B, a plurality of lead parts 50 of a lead frame 1330 (see FIGS. 38A and 38B, which will be described later) are provided around the electronic elements 20. This lead frame 1330 is formed of, for example, Cu or 42 alloy.

Although not shown, the lead parts 50 of the lead frame 1330 and the electronic elements 20, in some cases, the respective electronic elements are electrically connected to each other by bonding wires made of Au (gold) or Al (aluminum) in the molding resin 70.

Further, the heat sink 30 is bonded to the suspending leads 1332 of the lead frame 1330 at the bonding portions 1311.

Here, the suspending leads 1332 are caulked on the top surface of the heat sink 30 to form the bonding portions 1311. To be specific, the suspending leads 1332 are fixedly caulked by a method of fitting the hole of the suspending lead 1332 on a protrusion formed on the top surface of the heat sink 30 and then caulking the protrusion.

Then, as shown in FIGS. 37A and 37B, the electronic elements 20, the bonding wires (not shown), the connection parts (that is, inner leads) connected to the bonding wires on the respective lead parts 50, the suspending leads 1332, and heat sink 30 are molded and wrapped by the molding resin 70.

Here, a portion of each lead part 50, that is, an outer lead protrudes from the molding resin 70 and this protruding portion is connected to an external wiring part or the like. Further, a bottom surface opposite to the top surface, that is, the element-mounting surface of the heat sink 30 is exposed from the molding resin 70.

Here, the molding resin 70 is made of molding material such as epoxy-based resin usually used for semiconductor package and is molded by a transfer molding method using the mold 201 as a molding die, which will be described later.

In the electronic device 1300 like this, in this embodiment, the following unique construction is adopted for the molding resin 70.

That is, as shown in FIGS. 37A and 37B, in an area located around the suspending lead 1332 of the end portion of the molding resin 70, a portion located directly above the suspending lead 1332 is constructed as a retracting portion 1341 retracted from a portion located directly below the suspending lead 1332.

A retracting size d of this retracting portion 1341 (see FIG. 37A) can be made, for example, equal to or larger than the thickness (for example, approximately several tenths of a millimeter) of the suspending lead 1332 and, preferably, within approximately 1 mm, although not limited to this value.

Further, this electronic device 1300 is mounted on a base board (not shown). This base board is made of, for-example, a case which is made of metal and in which a motor for driving the power window is received or a printed board.

To be specific, the semiconductor device 1300 is mounted on the base board with grease having electric insulation and excellent thermal conductivity interposed between the bottom surface of the heat sink 30 and the base board. The heat of the semiconductor device 1300 is dissipated to the base board via the heat sink 30.

[Manufacturing Method]

Next, a method for manufacturing this electronic device 1300 will be described.

Figure 38A:
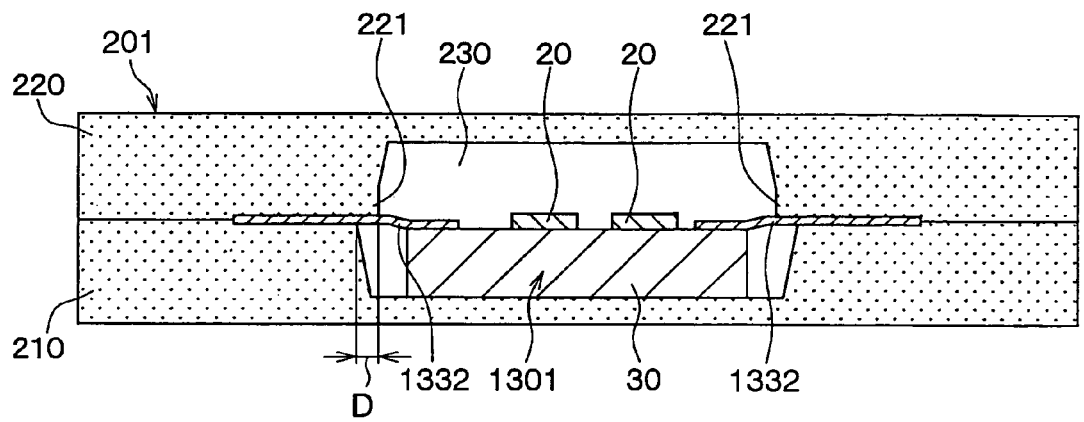
FIG. 38A is a cross sectional view explaining a molding process in a method for manufacturing the device.
Figure 38B:
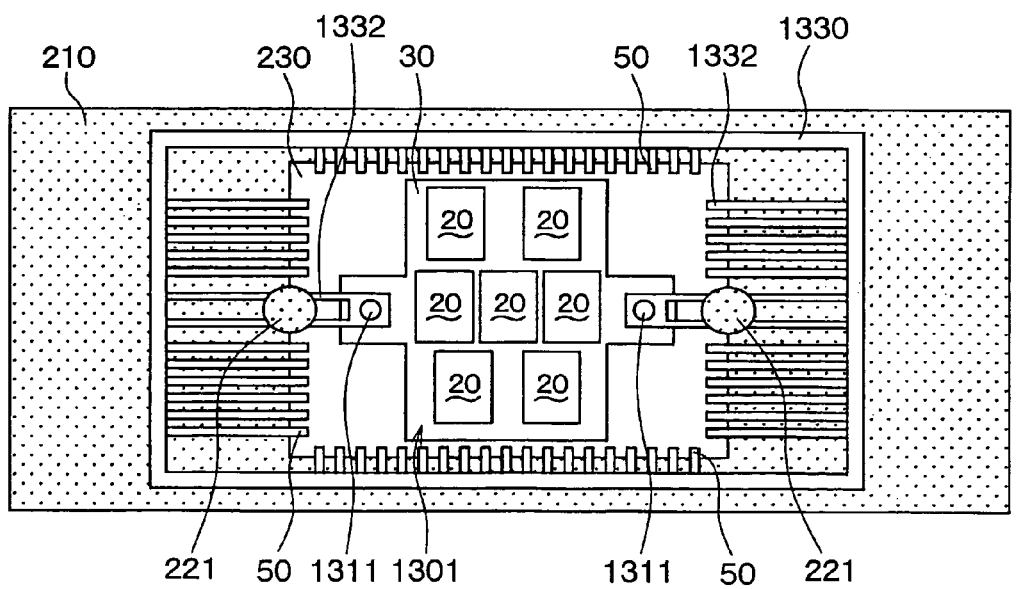
FIG. 38B is a plan view explaining the molding process, according to the thirteenth embodiment.

FIGS. 38A and 38B are illustrations to describe a step of molding resin in this manufacturing method. FIG. 38A is a schematic sectional view to show a state where an integrated part 101 as a work is placed in the mold 201. FIG. 38B is a top view in FIG. 38A.

Here, in these FIG. 38A and FIG. 38B, the bonding wires are omitted. In FIG. 38B, of the mold 201, the whole bottom mold 210 and a portion of the top mold 220, that is, a protruding portion 221 as a pressing portion are shown.

First, the electronic elements 20 are mounted on the top surface of the heat sink 30 and the lead frame 1330 is provided around the electronic elements 20 and the heat sink 30 is bonded to the suspending leads 1332 of the lead frame 1330 by caulking or the like. Further, the electronic elements 20 are electrically connected to the lead parts 50 of the lead frame by boding wires or the like (not shown).

In this manner, an integrated part 101 into which the heat sink 30, the electronic elements 20, and the lead frame 1330 are integrated is placed in the mold 201. As shown in FIGS. 38A and 38B, as for the mold 201, when the bottom mold 210 is mated with the top mold 220, the mold 201 has a cavity 230 corresponding to the shape of the molding resin 70 formed therein.

To be specific, the integrated part 101 is placed on the bottom mold 210 of the mold 201 and then the top mold 220 is mated with the bottom mold 210. With this, the integrated part 101 is placed in the cavity 230 of the mold 201. This state is shown in FIGS. 38A and 38B.

Next, in the step of molding the molding resin 70, only the suspending lead 1332 is pressed by the top mold 220 of the mold 201 to press the heat sink 30 to the bottom mold 210 of the mold 201.

Here, in this embodiment, as shown in FIGS. 38A and 38B, a portion for pressing the suspending lead 1332 by the top mold 220, that is, a pressing portion 221 is constructed as a protruding portion 221 in which a portion of the top mold 220 protrudes into the cavity 230 with respect to the bottom mold 210.

A protruding size d (see FIG. 38A) of this protruding portion 221 corresponds to the retracting size d of the retracting portion 1341 shown in FIG. 37A and is equal to or larger than, for example, the thickness (for example, approximately several tenths of a millimeter) of the suspending lead 1332 and, preferably, can be within approximately 1 mm.

While this protruding portion 221 presses the suspending lead 1332 from above in a state where the integrated part 101 is placed in the mold 201, at this time, the bottom of the suspending lead 1332 is not supported, so that the suspending lead 1332 is slightly bent and the suspending 1332 and by extension the integrated part 101 is pressed down.

For this reason, the bottom surface of the heat sink 30 in the integrated part 101 is pressed on the bottom mold 210 of the mold 201, thereby being put into close contact with the bottom mold 210. When the molding resin 70 in a melting state is poured and filled into the cavity 230 in this state, the integrated part 101 is molded by the molding resin 70 in such a way as to expose the bottom surface of the heat sink 30.

Thereafter, the molding resin 70 is cooled and solidified and then the integrated part 101 molded by the molding resin 70 is taken out of the mold 201. In this manner, the electronic device 1300 is completed.

[Effects]

By the way, according to this embodiment, in such a method of manufacturing an electronic device 1300 that includes the steps of: mounting the electronic elements 20 on the top surface of the heat sink 30; providing the lead frame 1330 around the electronic elements 20; bonding the heat sink 30 to the suspending leads 1332 of the lead frame 1330; and molding the heat sink 30, the electronic elements 20, and the lead frame 1330 by the molding resin 70 by the use of the mold 201, there is provided a manufacturing method characterized by the following points.

That is, in the manufacturing method of this embodiment, the molding step of the molding resin 70 is characterized in that the molding resin 70 is poured into the cavity 230 of the mold 201 in a state where the bottom surface of the heat sink 30 is pressed on the bottom mold 210 of the mold 201 by pressing only the suspending leads 1332 by the top mold 220 of the mold 201.

According to the manufacturing method of this embodiment characterized by this point, in the molding step of the molding resin 70, the bottom surface of the heat sink 30 is pressed on the bottom mold 210 of the mold 201 by pressing only the suspending leads 1332 by the top mold 220 of the mold 201. Hence, the top surface, that is, the surface on which the electronic elements 20 are mounted, of the heat sink 30 does not provide dead space described above.

Further, according to the manufacturing method of this embodiment, the work to be molded by resin is fixed in the mold 201. For this reason, this eliminates the need for providing a specific unit such as suction unit, as described above, and hence hardly increases cost.

Therefore, according to the manufacturing method of this embodiment, it is possible to expose the bottom surface of the heat sink 30 from the molding resin 70 suitably and at the same time to reduce dead space in the top surface of the heat sink 30.

As a result, according to the manufacturing method of this embodiment, it is possible to enlarge the area of the element-mounting surface of the heat sink 30 and hence to mount more electronic elements 20 than ever. That is, according to the manufacturing method of this embodiment, the electronic elements can be mounted at high density without enlarging the electronic device, which contributes to cost reduction and the like.

For example, as shown in FIG. 39B, four electronic elements 20 are mounted on the heat sink 30. However, in this embodiment, as shown in FIG. 38B, the dead space is not provided, so that even if the size of the heat sink 30 is not changed, the element-mounting surface is increased, whereby seven electronic elements 20 can be mounted on the heat sink 30.

Further, according to the manufacturing method of this embodiment, only the suspending leads 1332 are pressed, so that there is provided also an advantage of eliminating a possibility that the heat sink 30 is displaced with respect to the lead frame 1330.

Here, as described above, according to the manufacturing method of this embodiment, the portion of the suspending lead 1332 where the top mold 220 is pressed is constructed as the protruding portion 221 protruding into the cavity 230 from the bottom mold 210.

When the protruding size d (see FIG. 38A) of this protruding portion 221 is made equal to or larger than the thickness (for example, approximately several tenths of a millimeter) of the suspending lead 1332 and, preferably, within approximately 1 mm, the retracting size d of the retracting portion 1341 shown in FIG. 37A is also made as small as the protruding size d.

For this reason, the completed electronic device 1300 has also an advantage of being not greatly changed in the outside shape of the molding resin 70, as compared with the conventional device, and of being not degraded in water resistor by the molding resin 70 and in positioning function by the molding resin 70.

Further, as described above, according to the manufacturing method of this embodiment, the bonding of the heat sink 30 to the suspending leads 1332 is performed by caulking but may be performed by the other means such as welding or soldering. Further, the heat sink 30 may be formed integrally with the lead frame 1330.

Further, according to this embodiment, there is provided an electronic device 1300 that includes: the heat sink 30; the electronic elements 20 mounted on the top surface of the heat sink 30; the lead frame 1330 provided around the electronic elements 20; the suspending leads 1332 of the lead frame 1330 bonded to the heat sink 30; and molding resin 70 that molds the heat sink 30, the electronic elements 20, and the lead frame 1330 so as to expose the bottom surface of the heat sink 30, and is characterized in that in an area located around the suspending lead 1332 of the end portion of the molding resin 70, a portion located directly above the suspending lead 1332 is retracted from a portion located directly below the suspending lead 1332.

The electronic device 1300 of this embodiment can be suitably manufactured by the manufacturing method of this embodiment as described above and the effects described above are produced.

In other words, also by this electronic device 1300, it is possible to expose the bottom surface of the heat sink 30 from the molding resin 70 and at the same time to reduce dead space on the top surface of the heat sink 30.

(Modifications)

In this regard, it is not intended to limit the shape of the heat sink 30 to the shape shown in the respective drawings. For example, the heat sink 30 is formed in a cross shape in plan view shown in FIGS. 37A and 37B but may be formed in a rectangular shape.

Further, the positions and the number of the bonding portions 1311 where the heat sink 30 is bonded to the suspending leads 1332 can be changed as appropriate. For example, in FIGS. 37A and 37B, one bonding portion 1311 is provided on each of both opposite ends of the heat sink 30, that is, total two bonding portions 1311 are provided, and two pressing portions 221 are formed. However, it is also recommended that two bonding portions 1311 be provided on each end, that is, total four bonding portions 1311 be provided and that four pressing portions be provided.

Still further, the bonding portion 1311 may be provided in each side of the heat sink 30. With this, an arbitrary number of (for example, 6, 8 . . . ) bonding portions and pressing portions can be provided. In addition, the number of bonding portions is not necessarily equal to the number of pressing portions: for example, the number of bonding portions is 4 whereas the number of pressing portions may be 2.

Still further, in the embodiments, the descriptions have been mainly provided on the assumption that the electronic device of the invention is applied to the HIC for driving the driving motor of the power window. However, needless to say, the application of the electronic device of the invention is not limited to this.

As described above, the essential points of the invention are a manufacturing method that includes the steps of: mounting the electronic elements on the top surface of the heat sink; providing the lead frame around the electronic elements; bonding the heat sink to the suspending leads of the lead frame; and then molding these parts by the molding resin by the use of the mold, and is characterized in that in the step of molding the parts by resin, only the suspending leads are pressed by the top mold of the mold to press the bottom surface of the heat sink on the bottom mold of the mold, and an electronic device manufactured by the manufacturing method. The invention can be modified as appropriate in the other points in the manufacturing method and the electronic device.

Such changes and modifications are to be understood as being within the scope of the present invention as defined by the appended claims.

What is claimed is:

1. An electric device comprising:
a first electric element;
a second electric element capable of flowing large current therethrough so that heat is generated in the second electric element;
a heat sink; and
a first wiring board and a second wiring board, which are disposed on one side of the heat sink, wherein
the large current in the second electric element is larger than that in the first electric element,
the first wiring board and the second wiring board are separated from each other,
the first electric element is disposed on the first wiring board,
the second electric element is disposed on the second wiring board,
the first wiring board and the second wiring board are made of ceramics, and
the heat sink is made of iron,
the heat sink stores temporary heat from the second element thereby preventing heat transfer to the first electric element,
the first electric element, the second electric element, the first wiring board, the second wiring board, and the heat sink are molded with a resin mold,
the heat sink includes another side, which is opposite to the one side of the heat sink,
the other side of the heat sink is exposed from the resin mold,
the heat sink further includes a side having a protrusion, and
the protrusion is embedded into the resin mold.

2. The device according to claim 1, wherein
the heat sink includes a part disposed between the first wiring board and the second wiring board, and
the part of the heat sink is made of material including iron.

3. The device according to claim 1, wherein
the resin mold includes a thickness between surfaces of the first and the second electric elements and a surface of the resin mold in a laminating direction,
the laminating direction is provided by lamination of the first and the second electric elements, the first and the second wiring boards, and the heat sink i this order, and
the heat sink has a thickness in the laminating direction, the thickness of the heat sink being equal to the thickness of the resin mold.

4. The device according to claim 1, wherein
the second electric element is a power device, and
the first electric element is a control device for controlling the power device.

5. The device according to claim 1, wherein the resin mold has a glass transition temperature, which is higher than a maximum temperature of the power device.

6. The device according to claim 1, wherein
the second electric element includes a plurality of electric parts, which includes a semiconductor relay.

7. The device according to claim 1, wherein
the first and second wiring boards contact the heat sink.

8. The device according to claim 7, wherein
the power device includes a plurality of power parts, and
one of the power parts and neighboring one of the power device, which is next to the one of the power parts, have a relationship in such a manner that the one of the power parts turns on when the neighboring one of the power parts turns off.

9. The device according to claim 6, wherein
the second electric element is disposed on the second wiring board with a connection portion therebetween,
the connection portion has a thickness in a laminating direction provided by lamination of the first and the second electric elements, the first and the second wiring boards, and the heat sink in this order, and the thickness of the connection portion is equal to or smaller than 100 µm.

10. The device according to claim 6, further comprising:

a signal terminal disposed on a side of the resin mold, wherein the first electric element, the second electric element, the first wiring board, the second wiring board, and the heat sink are molded with the resin mold, the heat sink includes another side, which is opposite to the one side of the heat sink, the other side of the heat sink is exposed from the resin mold, the heat sink is connected to the signal terminal with a suspending lead of the signal terminal, the resin mold includes an upper part and a lower part, the upper part of the resin mold is disposed on the one side of the heat sink so that the upper part is disposed above the suspending lead, and the lower part of the resin mold is disposed on the other side of the heat sink so that the lower part is disposed below the suspending lead, and the lower part of the resin mold is protruded from the upper part of the resin mold.

11. The device according to claim 6, further comprising:

a signal terminal disposed on a side of the resin mold; and an inspection terminal disposed on another side of the resin mold, wherein the signal terminal extends in an extending direction parallel to the one side of the heat sink, and the inspection terminal extends in a direction perpendicular to the extending direction of the signal terminal.

12. The device according to claim 6, wherein the first electric element connects to an outside connector through a capacitor, the second electric element connects to another outside connector through the capacitor, both of the first and the second electric elements operate a motor driving body, and the capacitor for removing a noise penetrating from an outside of the device is directly disposed on a surface of the resin mold.

13. The device according to claim 11, wherein the resin mold includes a concavity, and the inspection terminal is disposed in the concavity of the resin mold so that the inspection terminal is caved in the concavity of the resin mold.

14. The device according to claim 11, wherein the inspection terminal includes a first inspection terminal and a second inspection terminal, the first inspection terminal is disposed on a first side of the resin mold, the second inspection terminal is disposed on a second side of the resin mold, the first side of the resin mold is opposite to the second side of the resin mold, the first inspection terminal protrudes from the resin mold in a protruding direction, and the second inspection terminal protrudes from the resin mold in a direction parallel to the protruding direction of the first inspection terminal.

15. The device according to claim 13, wherein the signal terminal includes a first signal terminal and a second signal terminal, the first signal terminal is disposed on a first side of the resin mold, the second signal terminal is disposed on a second side of the resin mold, the first side of the resin mold is opposite to the second side of the resin mold, the first signal terminal protrudes from the resin mold in a protruding direction, and the second signal terminal protrudes from the resin mold in a direction parallel to the protruding direction of the first signal terminal.

16. An electric device comprising:

a first electric element;

a second electric element capable of flowing large current therethrough so that heat is generated in the second electric element;

a heat sink; and a first wiring board and a second wiring board, which are disposed on one side of the heat sink, wherein the large current in the second electric element is larger than that in the first electric element, the first wiring board and the second wiring board are separated from each other, the first electric element is disposed on the first wiring board, the second electric element is disposed on the second wiring board, and the heat sink is made of iron, the heat sink stores temporary heat from the second electric element to prevent heat transfer to the first electric element, the first electric element, the second electric element, the first wiring board, the second wiring board, and the heat sink are molded with a resin mold, the heat sink includes another side, which is opposite to the one side of the heat sink, the other side of the heat sink is exposed from the resin mold, the heat sink further includes a side having a protrusion, and the protrusion is embedded into the resin mold.

* * * * *